United States Patent
Lim et al.

(10) Patent No.: US 9,070,701 B2
(45) Date of Patent: Jun. 30, 2015

(54) SEMICONDUCTOR DEVICE

(71) Applicant: Samsung Electronics Co., Ltd., Gyeonggi-do (KR)

(72) Inventors: Jun-Hee Lim, Seoul (KR); Chan-Seung Hwang, Gyeonggi-do (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 31 days.

(21) Appl. No.: 13/780,146

(22) Filed: Feb. 28, 2013

(65) Prior Publication Data
US 2013/0270672 A1  Oct. 17, 2013

(30) Foreign Application Priority Data
Mar. 28, 2012 (KR) .................. 10-2012-0031771

(51) Int. Cl.
*H01L 49/02* (2006.01)
*H01L 27/108* (2006.01)

(52) U.S. Cl.
CPC .......... *H01L 28/60* (2013.01); *H01L 27/10852* (2013.01); *H01L 28/91* (2013.01)

(58) Field of Classification Search
CPC .... H01L 28/60; H01L 28/91; H01L 27/10852
See application file for complete search history.

(56) References Cited

U.S. PATENT DOCUMENTS

| | | | |
|---|---|---|---|
| 6,300,652 B1 | 10/2001 | Risch et al. | |
| 2009/0309187 A1* | 12/2009 | Choi et al. | 257/532 |
| 2010/0012989 A1 | 1/2010 | Lee et al. | |
| 2010/0237466 A1 | 9/2010 | Kim et al. | |

FOREIGN PATENT DOCUMENTS

| | | |
|---|---|---|
| KR | 10-2010-0009171 A | 1/2010 |
| KR | 10-2010-0104287 A | 9/2010 |

* cited by examiner

*Primary Examiner* — Whitney T Moore
(74) *Attorney, Agent, or Firm* — F. Chau & Associates, LLC

(57) ABSTRACT

A semiconductor device is provided. The semiconductor device includes first and second storage electrodes formed to be spaced apart from each other on a substrate, an insulating continuous support pattern connected to top surfaces of the first and second storage electrodes, a storage dielectric layer formed to cover the first and second storage electrodes and the continuous support pattern, and a plate electrode formed on the storage dielectric layer. The continuous support pattern includes a first contact part connected to the top surface of the first storage electrode, a second contact part connected to the top surface of the second storage electrode, and a connection part connecting the first and second contact parts with each other.

12 Claims, 85 Drawing Sheets

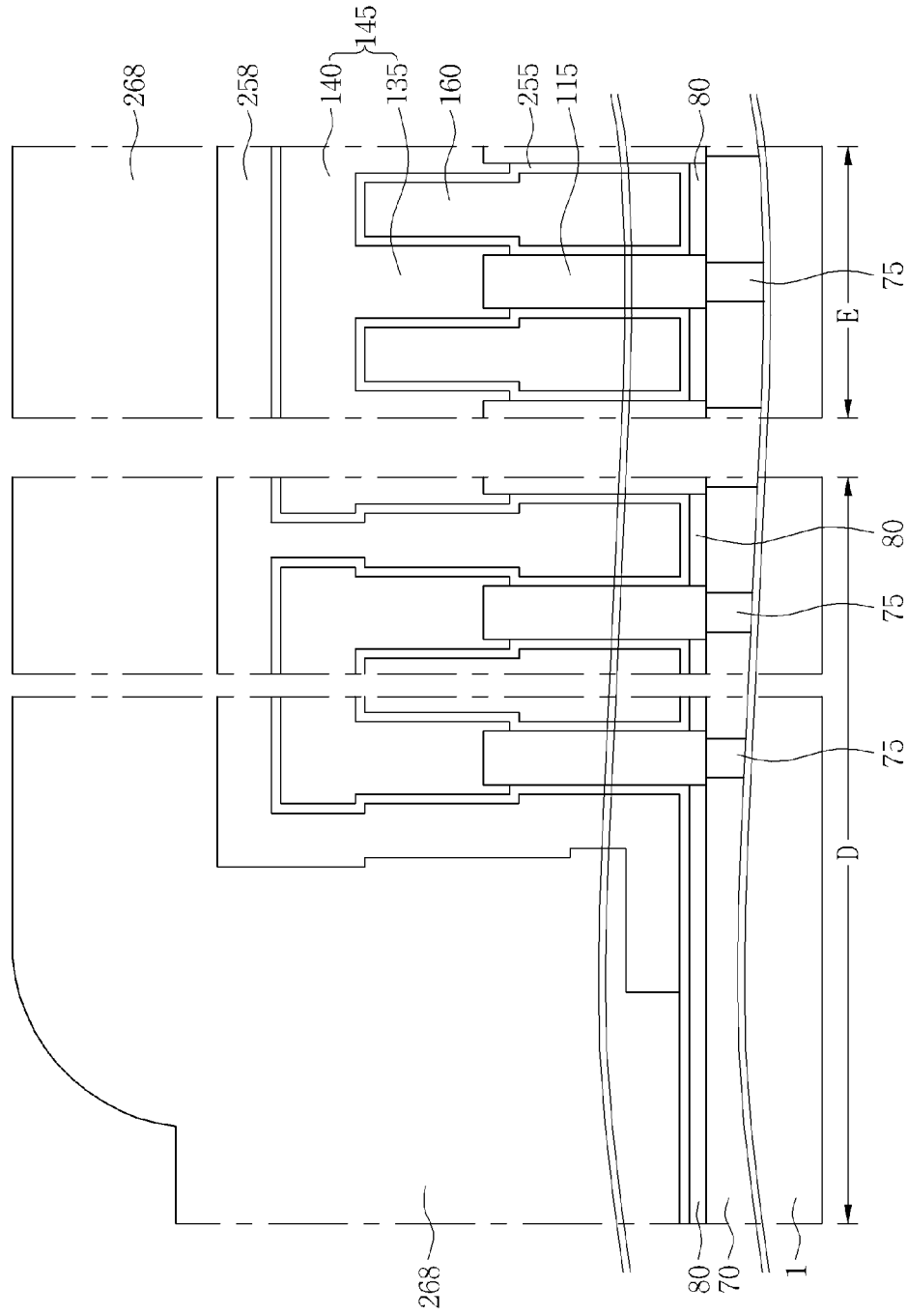

SEMICONDUCTOR DEVICE

CROSS-REFERENCE TO RELATED APPLICATION

This application claims priority under 35 U.S.C. §119 to Korean Patent Application No. 10-2012-0031771 filed on Mar. 28, 2012, the disclosure of which is hereby incorporated by reference in its entirety.

TECHNICAL FIELD

Embodiments of the inventive concept relate to a semiconductor device, a method of fabricating the same, and an electronic apparatus and electronic system employing the same.

DISCUSSION OF RELATED ART

There is ongoing research directed to semiconductor devices with reduced size and enhanced performance. The size of a semiconductor device may be reduced by decreasing the size of cell capacitors in the semiconductor device. However, the cell capacitors of reduced size may be easily deformed. To prevent such deformation, supporters may be used.

SUMMARY

Embodiments of the inventive concept provide a semiconductor device having a capacitor structure which can be reliably and stably formed and a method of fabricating the semiconductor.

Embodiments of the inventive concept provide a semiconductor device which prevents a storage electrode from collapsing during a semiconductor fabrication process and a method of fabricating the semiconductor device.

Embodiments of the inventive concept provide a semiconductor device having a support pattern which prevents a storage electrode from collapsing and a method of fabricating the semiconductor device.

Embodiments of the inventive concept provide a semiconductor device which improves resistivity characteristics of a plate electrode and a method of fabricating the semiconductor device.

Embodiments of the inventive concept provide a semiconductor device which prevents a storage electrode from collapsing and improves resistivity characteristics of a plate electrode and a method of fabricating the semiconductor device.

Embodiments of the inventive concept provide an electronic apparatus and electronic system having the semiconductor devices.

In accordance with an embodiment of the inventive concept, a semiconductor device may include first and second storage electrodes formed to be spaced apart from each other on a substrate, an insulating continuous support pattern connected to top surfaces of the first and second storage electrodes, a storage dielectric layer to cover the first and second storage electrodes and the continuous support pattern, and a plate electrode formed on the storage dielectric layer. The continuous support pattern may include a first contact part connected to the top surface of the first storage electrode, a second contact part connected to the top surface of the second storage electrode, and a connection part connecting the first and second contact parts with each other.

In an embodiment, at least one of the first contact part or the second contact part of the continuous support pattern may have a vertical thickness greater than a horizontal width.

In an embodiment, the first contact part of the continuous support pattern may include an extension part which covers the top surface of the first storage electrode and extends to a side of the first storage electrode.

The extension part of the continuous support pattern may be formed to surround a side of an upper portion of the first storage electrode.

In an embodiment, the first contact part of the continuous support pattern may have a greater horizontal width than a horizontal width of the first storage electrode.

In an embodiment, a side of the first contact part of the continuous support pattern may be vertically aligned with a side of the first storage electrode.

In an embodiment, the connection part of the continuous support pattern may be located at a higher level than the first and second storage electrodes.

In an embodiment, the connection part of the continuous support pattern may have a bottom surface located at a lower level than the top surfaces of the first and second storage electrodes.

In an embodiment, the first contact part of the continuous support pattern may have a width smaller than a width of the first storage electrode.

In an embodiment, the semiconductor device may further include a core pattern formed in the first storage electrode. The core pattern may be formed of a different material from the first storage electrode and a top surface of the core pattern may directly contact the first contact part of the continuous support pattern.

In an embodiment, the semiconductor device may further include an insulating lower support pattern located below the continuous support pattern, spaced apart from the continuous support pattern, and interposed between a side of the first storage electrode pattern and a side of the second storage electrode.

In accordance with an embodiment of the inventive concept, a semiconductor device may include a substrate, a first storage electrode and a first insulating pattern sequentially stacked on the substrate, a second storage electrode and a second insulating pattern sequentially stacked on the substrate, a lower plate electrode which surrounds sides of the first storage electrode and first insulating pattern and sides of the second storage electrode and second insulating pattern, an upper plate electrode which is formed on the lower plate electrode and the first and second insulating patterns and which includes a material with a lower resistivity than a resistivity of the lower plate electrode, and a storage dielectric layer interposed between the lower plate electrode and the first storage electrode, between the lower plate electrode and the first insulating pattern, between the lower plate electrode and the second storage electrode, between the lower plate electrode and the second insulating pattern, and between the lower plate electrode and the substrate.

In an embodiment, the first storage electrode may include a first lower storage electrode and a first upper storage electrode sequentially stacked, and the second storage electrode may include a second lower storage electrode and a second upper storage electrode sequentially stacked.

The semiconductor device may further include a support pattern interposed between sides of the first upper storage electrode and the second upper storage electrode.

In an embodiment, the semiconductor device may further include an interlayer insulating layer formed on the upper plate electrode, a plug passing through the interlayer insulating layer and electrically connected to the upper plate electrode, and a conductive line formed on the plug.

In accordance with an embodiment of the inventive concept, a method of fabricating a semiconductor device may include forming a first storage electrode and a second storage electrode on a substrate, wherein the first storage electrode and the second storage electrode are spaced apart from each other, forming a continuous support pattern on top surfaces of the first and second storage electrodes, wherein the continuous support pattern is sized and dimensioned to support the first and second storage electrodes, forming a storage dielectric layer on the first and second storage electrodes and the continuous support pattern, and forming a plate electrode on the storage dielectric layer.

The method may include forming a lower molding layer on the substrate, forming first and second storage holes spaced apart from each other, wherein the first and second storage holes pass through the lower molding layer, forming a conductive material layer on the substrate having the first and second storage holes, and planarizing the conductive material layer until the lower molding layer is exposed.

The method may include forming an upper molding layer on the lower molding layer and the first and second storage electrodes, forming first and second openings passing through the upper molding layer, wherein the first and second openings expose the top surfaces of the first and second storage electrodes, respectively, forming an insulating material layer on the substrate having the first and second openings, and patterning the insulating material to form the continuous support pattern.

The method may include forming a lower support pattern between the first and second storage electrodes.

BRIEF DESCRIPTION OF THE DRAWINGS

Embodiments of the inventive concepts will be apparent from the description taken in conjunction with the accompanying drawings, wherein:

FIGS. 23A to 23G are cross-sectional views illustrating a method of fabricating a semiconductor device in accordance with an embodiment of the inventive concept;

DETAILED DESCRIPTION OF THE EMBODIMENTS

Various embodiments will now be described in greater detail with reference to the accompanying drawings, wherein the same notations may be used to identify the same or substantially the same elements throughout the specification and the drawings. These inventive concepts may, however, be embodied in different forms and should not be construed as limited to the embodiments set forth herein.

It will be understood that when an element or layer is referred to as being "on," "connected to" or "coupled to" another element or layer, it can be directly on, connected or coupled to the other element or layer or intervening elements or layers may be present. As used herein, the term "and/or" includes any and all combinations of one or more of the associated listed items.

As used herein, the singular forms "a," "an" and "the" are intended to include the plural forms as well, unless the context clearly indicates otherwise.

Figure 1:
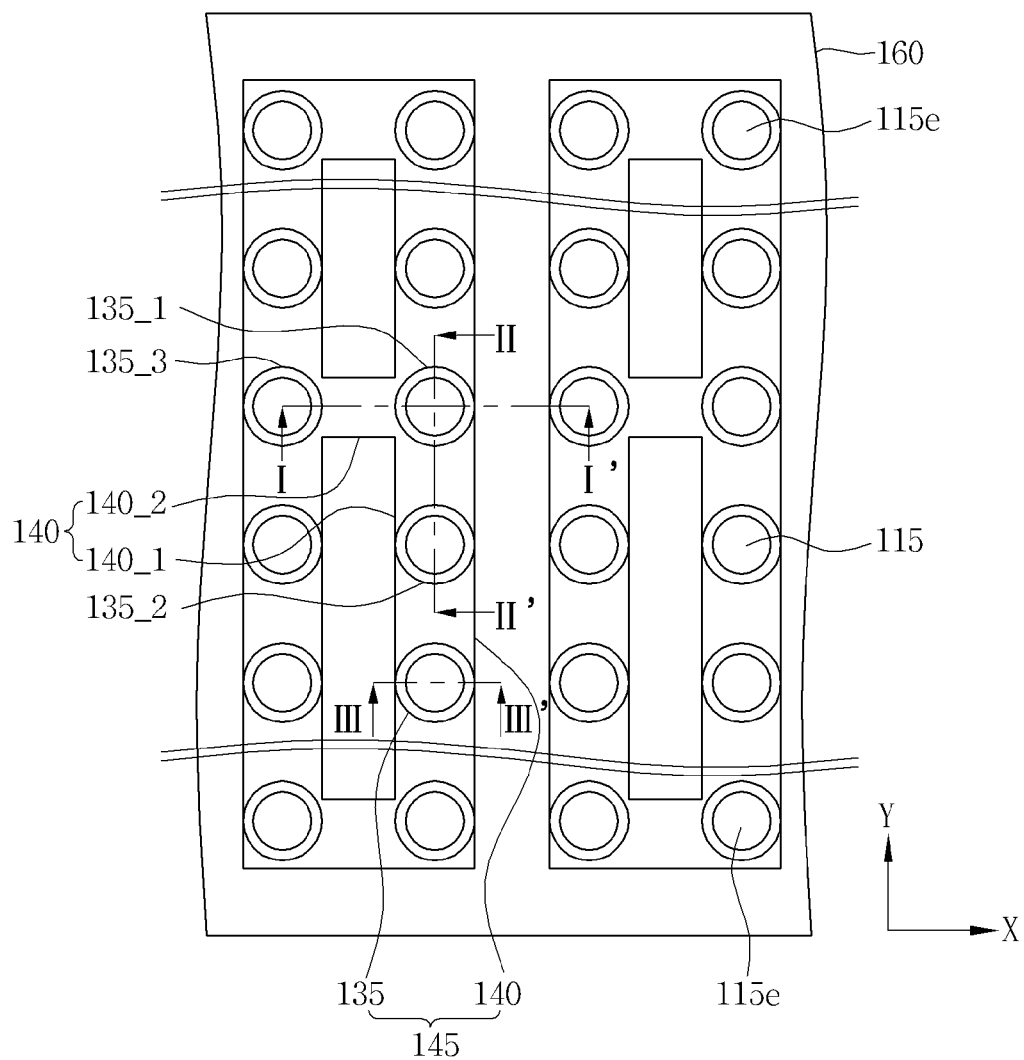
FIG. 1 is a plan view showing a semiconductor device in accordance with an embodiment of the inventive concept.
Figure 2:
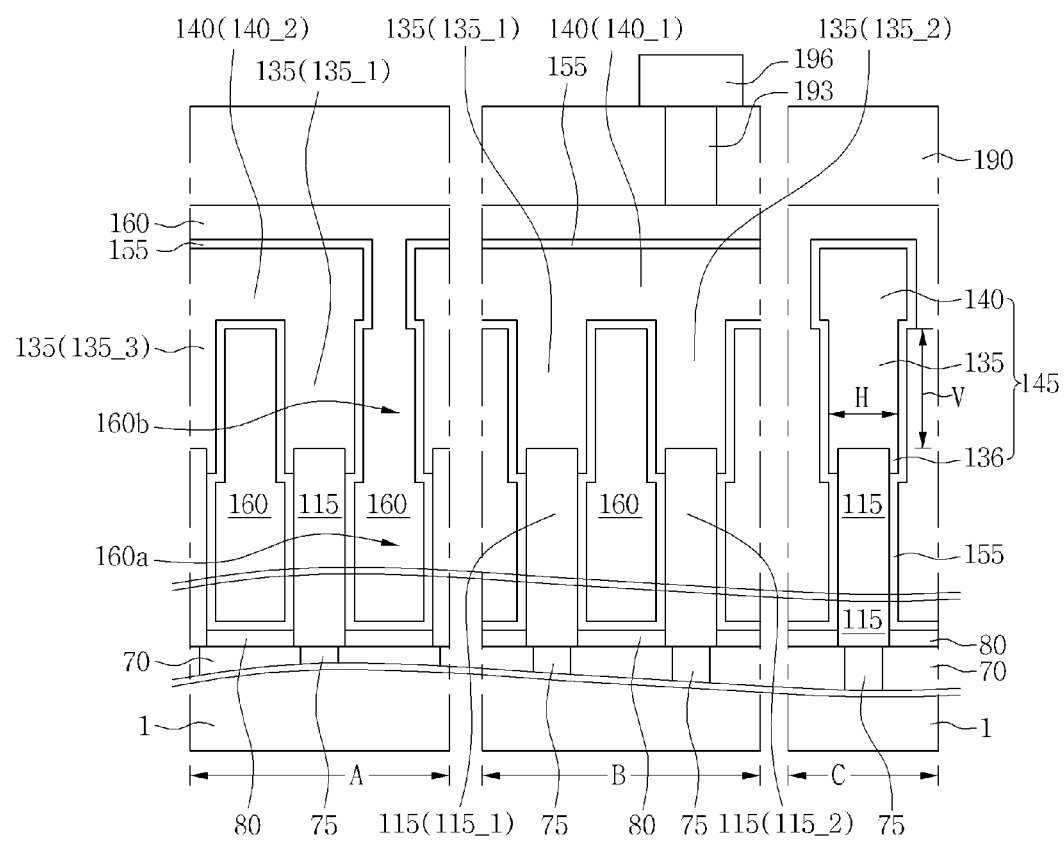
FIG. 2 is a cross-sectional view showing a semiconductor device in accordance with an embodiment of the inventive concept.

FIG. 1 is a plan view showing a semiconductor device in accordance with an embodiment of the inventive concept. FIG. 2 is a cross-sectional view showing a semiconductor device in accordance with an embodiment of the inventive concept. In FIG. 2, reference character "A" indicates the area taken along the line I-I' in FIG. 1, reference character "B" indicates the area taken along the line II-II' in FIG. 1, and reference character "C" indicates the area taken along the line III-III' in FIG. 1.

A semiconductor device in accordance with an embodiment of the inventive concept will be described with reference to FIG. 1 and FIG. 2.

Referring to FIG. 1 and FIG. 2, a substrate 1 may be prepared. The substrate 1 may be a semiconductor substrate. The substrate 1 may include a switching device, such as a transistor. A lower interlayer insulating layer 70 may be formed on the substrate 1. The lower interlayer insulating layer 70 may include an insulating material, such as silicon oxide. Conductive plugs 75 passing through the lower interlayer insulating layer 70 may be formed. Each of the plugs 75 may be electrically connected to the switching device, such as a transistor. For example, according to an embodiment, each of the plugs 75 may be electrically connected to one of source and drain regions of a transistor.

An etch stopping layer 80 may be formed on the lower interlayer insulating layer 70. The etch stopping layer 80 may include a material layer having etching selectivity with respect to the lower, interlayer insulating layer 70. For example, according to an embodiment, the lower interlayer insulating layer 70 may be formed of silicon oxide, and the etch stopping layer 80 may be formed of silicon nitride.

Two or more storage electrodes 115 spaced apart from each other may be formed on the substrate 1. The storage electrodes 115 may be formed in a pillar shape. The storage electrodes 115 may be formed on the lower interlayer insulating layer 70 and electrically connected to the plugs 75. The storage electrodes 115 may be formed in a cell array region of a memory device, such as DRAMs. The storage electrodes 115 may be formed of a conductive material. For example, according to an embodiment, the storage electrodes 115 may be formed of a doped polysilicon, a metal, or a metal nitride. For example, according to an embodiment, the storage electrodes 115 may be formed of titanium nitride (TiN). The storage electrodes 115 may include a first storage electrode 115_1 and a second storage electrode 115_2 which are spaced apart from each other.

A continuous support pattern 145 may be provided on the storage electrodes 115. The continuous support pattern 145 may be formed of an insulating material. The continuous support pattern 145 may be formed of silicon nitride. However, the embodiments of the inventive concept are not limited to a specific material. For example, according to an embodiment, the continuous support pattern 145 may be formed of an insulating material, such as a SiCN layer or a SiON layer.

The continuous support pattern 145 may include contact parts 135 and a connection part 140. The contact parts 135 may be continuously connected to the connection part 140. For example, according to an embodiment, the contact parts 135 and the connection part 140 may be continuously connected to each other and may include the same or substantially the same material. According to an embodiment, the contact parts 135 and the connection part 140 may be integrally formed with one another. For example, according to an embodiment, the contact parts 135 and the connection part 140 may be simultaneously formed of the same or substantially the same material by the same or substantially the same process. The contact parts 135 and the connection part 140 may be connected to each other without an interface between the contact parts 135 and the connection part 140.

The storage electrodes 115 may include the first storage electrode 115_1 and the second storage electrode 115_2 which are adjacent to each other. The continuous support pattern 145 may include a first contact part 135_1 which contacts a top surface of the first storage electrode 115_1, a second contact part 135_2 which contacts a top surface of the second storage electrode 115_2, and the connection part 140 which connects the first contact part 135_1 and the second contact part 135_2. The first and second contact parts 135_1 and 135_2 may be continuously connected to the connection part 140.

The contact parts 135 of the continuous support pattern 145 may be formed on top surfaces of the storage electrodes 115. The contact parts 135 of the continuous support pattern 145 may be connected to the top surfaces of the storage electrodes 115. The contact parts 135 of the continuous support pattern 145 may contact the top surfaces of the storage electrodes 115. The contact parts 135 of the continuous support pattern 145 may directly contact the top surfaces of the storage electrodes 115. Each of the contact parts 135 may have a vertical thickness V greater than a horizontal width H. The storage electrodes 115 and the contact parts 135 may be vertically stacked. The storage electrodes 115 and the contact parts 135 may be vertically aligned with each other.

The connection part 140 of the continuous support pattern 145 may be connected to two or more contact parts 135. The connection part 140 may connect the two or more contact parts 135 to each other. The connection part 140 of the continuous support pattern 145 may be located at a higher level than lower surfaces of the contact parts 135. The connection part 140 of the continuous support pattern 145 may be located at a higher level than the storage electrodes 115. The contact parts 135 of the continuous support pattern 145 may have a greater width than the storage electrodes 115. For example, according to an embodiment, the first contact part 135_1 of the continuous support pattern 145 may have a greater horizontal width than the first storage electrode 115_1. In the continuous support pattern 145, the contact parts 135 may protrude downward from the connection part 140. Sides of the contact parts 135 may not be vertically aligned with sides of the connection part 140. The contact parts 135 may protrude downward from some portions of the connection part 140.

In an exemplary embodiment, the connection part 140 of the continuous support pattern 145 may include a strip-shaped portion, and the contact parts 135 of the continuous support pattern 145 may protrude downward from the strip-shaped portion of the connection part 140.

In an exemplary embodiment, the continuous support pattern 145 may include strip-shaped first connection parts 140_1 and one or more second connection parts 140_2 connecting the strip-shaped first connection parts 140_1 to each other. The first connection parts 140_1 may be connected to each other by the second connection part 140_2 on dummy storage electrodes 115e located at end portions among the storage nodes 115. The first connection parts 140_1 may be connected to each other by the second connection part 140_2 located between middle portions of the first connection parts 140_1.

The connection part 140 may connect three or more contact parts 135_1, 135_2, and 135_3 to each other. For example, according to an embodiment, the connection part 140 may have the first connection parts 140_1 which are arranged in a first direction Y and which connect the first and second contact parts 135_1 and 135_2 adjacent to each other to each other, and the second connection parts 140_2 which are arranged in a second direction X crossing the first direction Y and which connect at least the first and third contact parts 135_1 and 135_3 adjacent to each other to each other. Accordingly, the continuous support pattern 145 may include the connection part 140 connecting at least three contact parts 135_1, 1352, and 1353, which are adjacent to each other, to each other. The three or more contact parts 135_1, 135_2, and 135_3 connected by the connection part 140 may not be arranged in a straight line. Since the storage electrodes 115 contact the contact parts 135_1, 1352, and 1353, and the contact parts 135_1, 1352, and 135_3 are connected to each other by the connection part 140, the storage electrodes 115 may be prevented, by the continuous support pattern 145, from collapsing. For example, according to an embodiment, the continuous support pattern 145 may prevent the storage electrodes 115 from collapsing during a fabrication process of a semiconductor device.

The continuous support pattern 145 may include extension parts 136 extended from the contact parts 135 along sides of the storage electrodes 115.

The extension parts 136 of the continuous support pattern 145 may be formed to surround sides of upper portions of the storage electrodes 115. For example, the extension parts 136 extended from the first contact part 135_1 of the continuous support pattern 145 may be formed to surround a side of an upper portion of the first storage electrode 115_1.

A storage dielectric layer 155 may be formed on the storage electrodes 115 and the continuous support patterns 145. The storage dielectric layer 155 may surround the sides of the storage electrodes 115, and extend upward to cover the continuous support pattern 145, and also extend on the etch stopping layer 80 disposed between the storage electrodes 115. The storage dielectric layer 155 may be formed to cover lower, side, and top surfaces of the continuous support pattern 145. According to an embodiment, the storage dielectric layer 155 may include TaO, TaON, AlO, HfO, ZrO, TiO, (Ba, Sr)TiO (BST), SrTiO (STO), BaTiO (BTO), Pb(Zr, Ti)O (PZT), (Pb, La)(Zr, Ti)O, Ba(Zr, Ti)O, Sr(Zr, Ti)O, or a combination thereof. A plate electrode 160 may be formed on the storage dielectric layer 155. The plate electrode 160 may be formed of a conductive material. For example, according to an embodiment, the plate electrode 160 may be formed of a conductive material, such as a doped polysilicon, a metal, or a metal nitride. For example, alternatively, the plate electrode 160 may be formed of titanium nitride.

The plate electrode 160 may include a first part 160a surrounding sides of the storage electrodes 115 and a second part 160b surrounding sides of the contact parts 135 of the continuous support pattern 145. The storage dielectric layer 155 may be interposed between the plate electrode 160 and the storage electrodes 115 and between the plate electrode 160 and the contact parts 135.

The plate electrode 160, the storage dielectric layer 155, and the storage electrodes 115 may be configured to form capacitors. The capacitors may store information in a memory device, such as DRAMs.

An upper interlayer insulating layer 190 may be formed on the plate electrode 160. The upper interlayer insulating layer 190 may be formed of silicon oxide.

A contact plug 193 passing through the upper interlayer insulating layer 190 may be formed. The contact plug 193 may be formed of a conductive material. For example, according to an embodiment, the contact plug 193 may include one of aluminum, copper, titanium nitride, tantalum nitride, and tungsten.

A metal line 196 electrically connected to the contact plug 193 may be formed on the upper interlayer insulating layer 190. According to an embodiment, the metal line 196 may include one of aluminum, copper, titanium nitride, tantalum nitride, and tungsten.

The storage electrodes 115 may be in the form of a pillar. However, the inventive concept should not be limited to the embodiments set forth herein. For example, according to an embodiment of the inventive concept, the storage electrodes 115 may be in the form of a solid pillar or in the form of a pillar having a depressed axial area as shown in FIG. 4.

Figure 3:
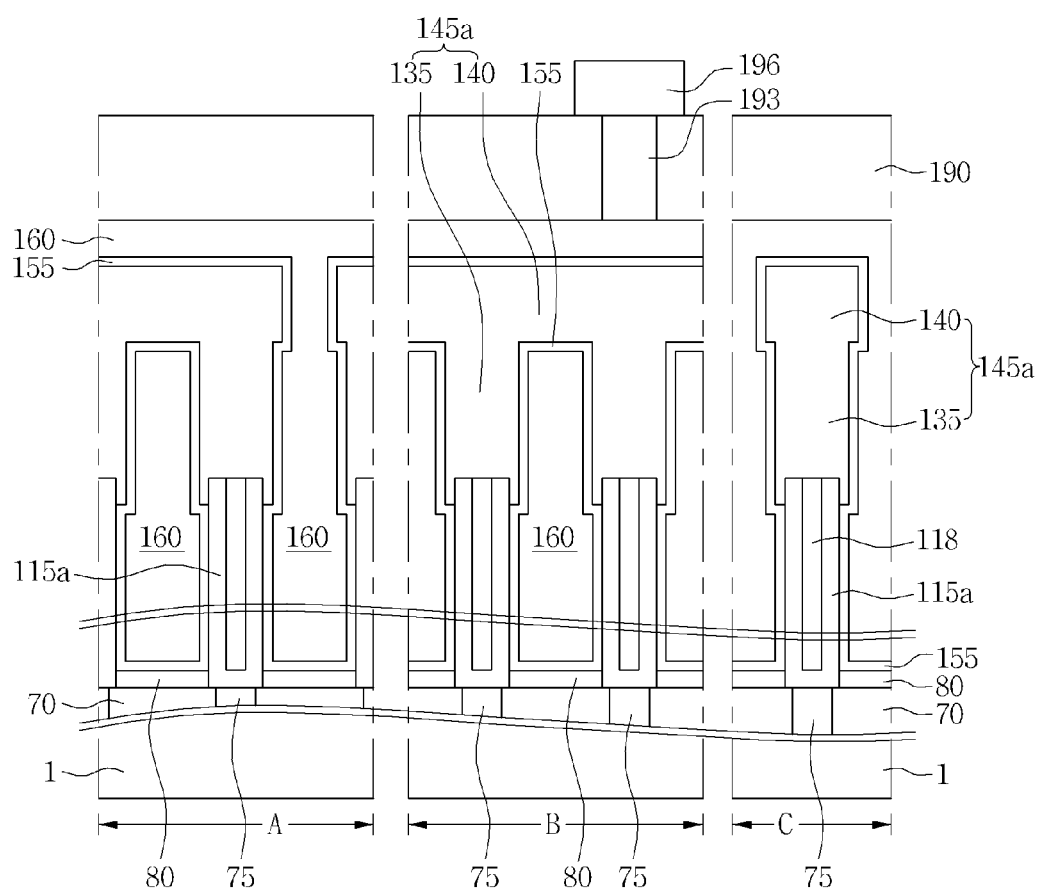
FIG. 3 is a cross-sectional view showing a semiconductor device in accordance with an embodiment of the inventive concept.
Figure 4:
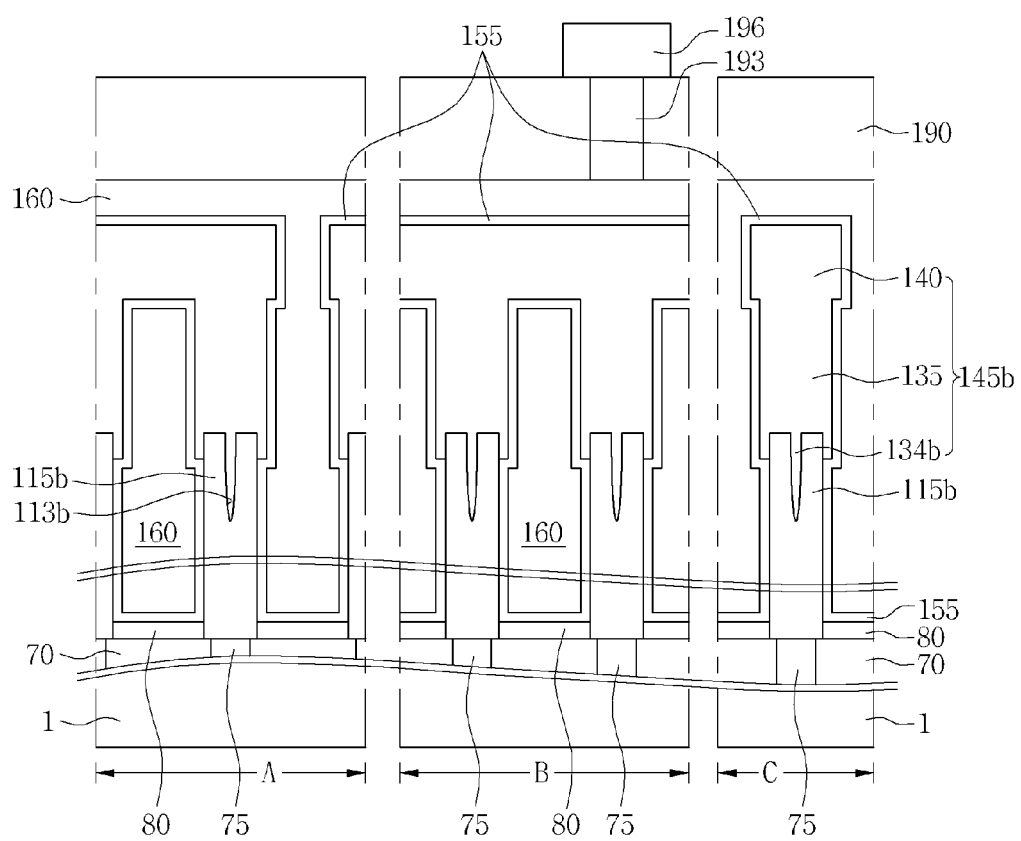
FIG. 4 is a cross-sectional view showing a semiconductor device in accordance with an embodiment of the inventive concept.

FIGS. 3 and 4 are cross-sectional views showing semiconductor devices in accordance with embodiments of the inventive concept. In FIG. 3 and FIG. 4, reference character "A" indicates the area taken along the line I-I' in FIG. 1, reference character "B" indicates the area taken along the line II-II' in FIG. 1, and reference character "C" indicates the area taken along the line III-III' in FIG. 1.

A semiconductor device in accordance with an embodiment of the inventive concept is described with reference to FIG. 3.

Referring to FIG. 1 and FIG. 3, storage electrodes 115a spaced apart from each other may be formed on a substrate 1. Each of the storage electrodes 115a may be shaped like a cylinder. For example, according to an embodiment, each of the storage electrodes 115a may be shaped like a cylinder having a depressed area 113a that extends from the middle of a top surface to a lower part of the corresponding storage electrode. Core patterns 118 may be formed in the depressed areas 113a of the storage electrodes 115a. Side and bottom surfaces of the core patterns 118 may be surrounded by the storage electrodes 115a.

The core patterns 118 may be formed of an insulating material, such as silicon nitride. However, the inventive concept should not be limited to the embodiments set forth herein. For example, according to an embodiment, the core patterns 118 may be formed of a conductive material different from the storage electrodes 115. For example, according to an embodiment, the storage electrodes 115 may be formed of a metal nitride, such as titanium nitride, and the core patterns 118 may be formed of a metal, such as tungsten.

A continuous support pattern 145a may be formed on the substrate having the storage electrodes 115a and the core patterns 118. The continuous support pattern 145a may include contact parts 135 in contact with upper parts of the storage electrodes 115a and a connection part 140 connecting the contact parts 135. The contact parts 135 may be directly connected to or in contact with the top surfaces of the storage electrodes 115a and top surfaces of the core patterns 118.

The contact parts 135 may be in contact with the top surfaces of the storage electrodes 115a and core patterns 118, and extend to outer side surfaces of the storage electrodes 115a.

A storage dielectric layer 155 may be formed on the substrate having the storage electrodes 115a and the continuous support pattern 145a. A plate electrode 160 may be formed on the storage dielectric layer 155.

A semiconductor device in accordance with an embodiment of the inventive concept is described with reference to FIG. 4.

Referring to FIG. 1 and FIG. 4, two or more storage electrodes 115b may be formed on a substrate 1. Each of the storage electrodes 115b may have a depressed area 113b that extends downward from the middle of a top surface thereof. A continuous support pattern 145b may be formed on the storage electrodes 115b.

The continuous support pattern 145b may include contact parts 135 in contact with upper parts of the storage electrodes 115b, extension parts 134b extending from the contact parts 135 to inner sides of the storage electrodes 115b, and a connection part 140 connecting the contact parts 135 to each other. The contact parts 135 may contact the top surfaces of the storage electrodes 115b. The contact parts 135 may contact the top surfaces of the storage electrodes 115b and extend along sides of the storage electrodes 115b.

Sides and bottom surfaces of the extension parts 134b of the continuous support pattern 145 may be surrounded by the storage electrodes 115b.

A storage dielectric layer 155 may be formed on the substrate having the storage electrodes 115b and the continuous support pattern 145b. A plate electrode 160 may be formed on the storage dielectric layer 155.

Figure 5:
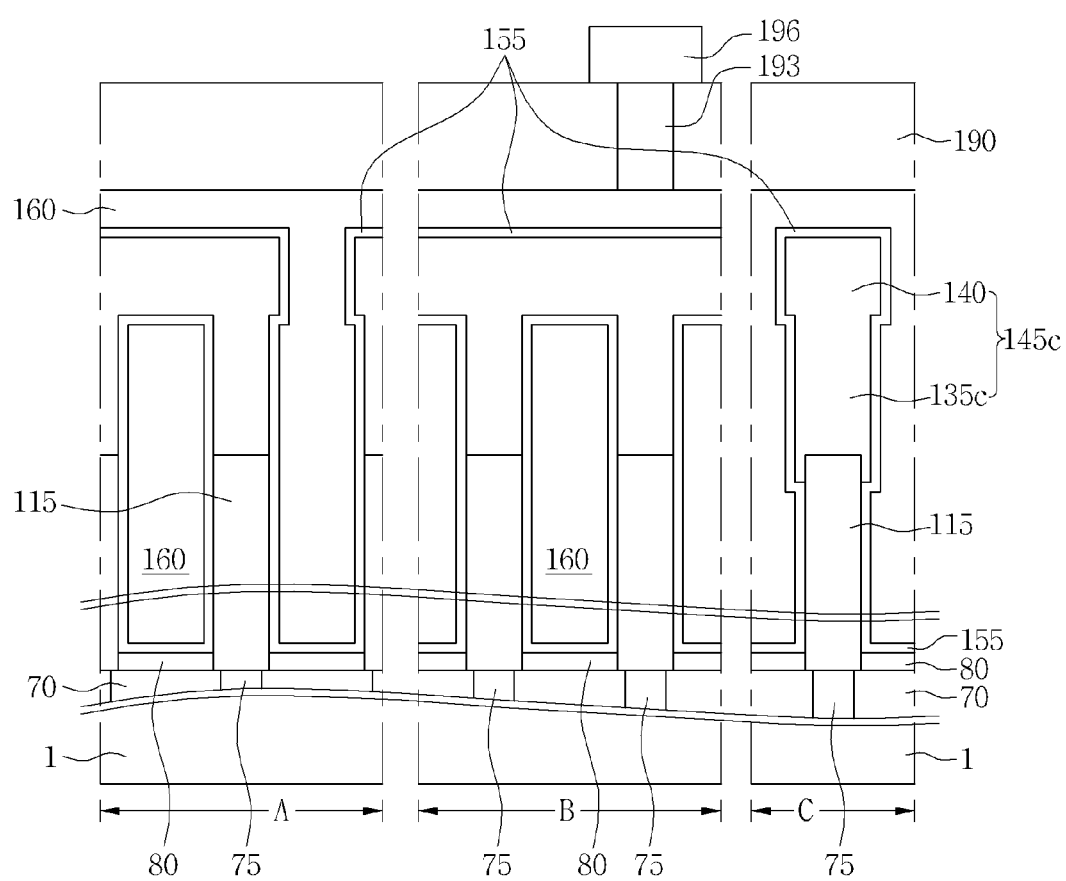
FIG. 5 is a cross-sectional view showing a semiconductor device in accordance with an embodiment of the inventive concept.

FIG. 5 is a cross-sectional view illustrating a semiconductor device in accordance with an embodiment of the inventive concept. In FIG. 5, reference character "A" indicates the area taken along the line I-I' in FIG. 1, reference character "B" indicates the area taken along the line II-II' in FIG. 1, and reference character "C" indicates the area taken along the line III-III' in FIG. 1.

Referring to FIG. 1 and FIG. 5, two or more storage electrodes 115 may be fainted on a substrate 1. A continuous support pattern 145c may be formed on the storage electrodes 115. The continuous support pattern 145c may include contact parts 135c in contact with the storage electrodes 115, and a connection part 140 connecting the contact parts 135c. The contact parts 135c and the connection part 140 may be continuously connected to each other. The contact parts 135c may be directly in contact with top surfaces of the storage electrodes 115. The contact parts 135c may have sides vertically aligned with sides of the storage electrodes 115.

A storage dielectric layer 155 may be formed on the substrate having the storage electrodes 115 and the continuous support pattern 145c. A plate electrode 160 may be formed on the storage dielectric layer 155.

Figure 6:
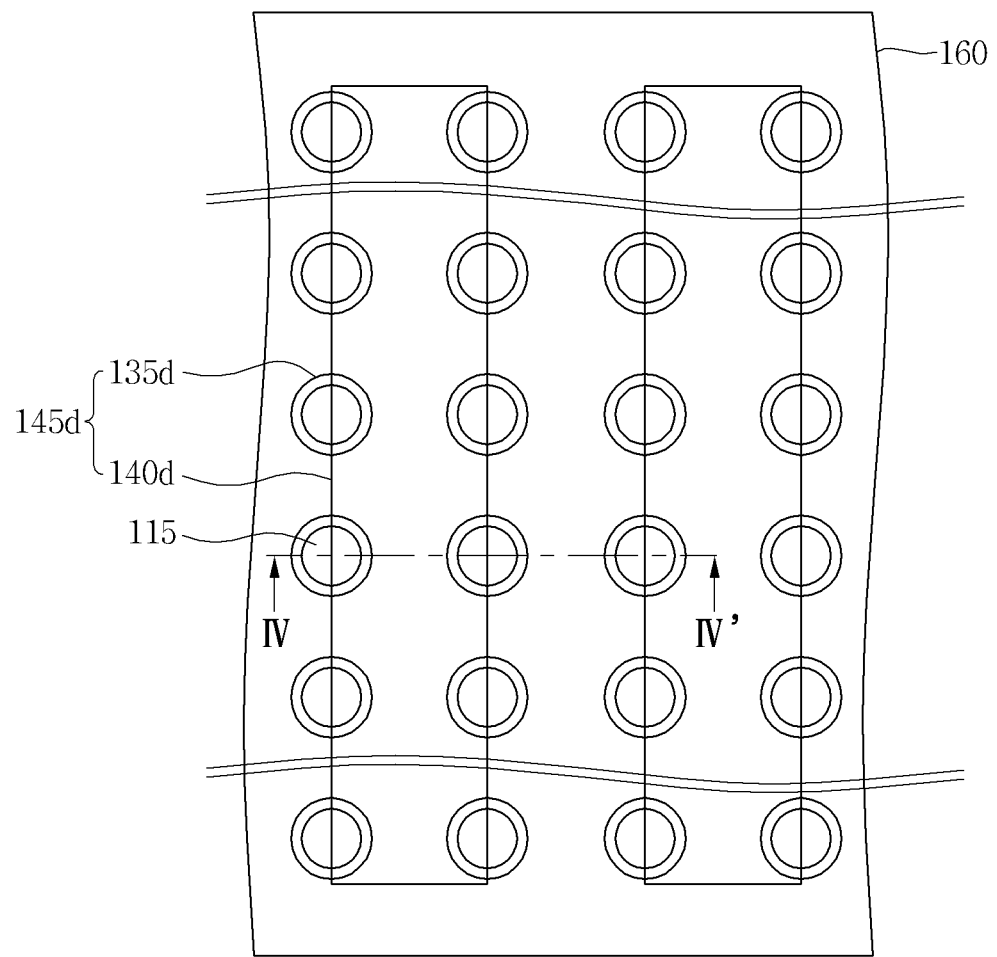
FIG. 6 and FIG. 7 are a plan view and a cross-sectional view showing a semiconductor device in accordance with an embodiment of the inventive concept.
Figure 7:
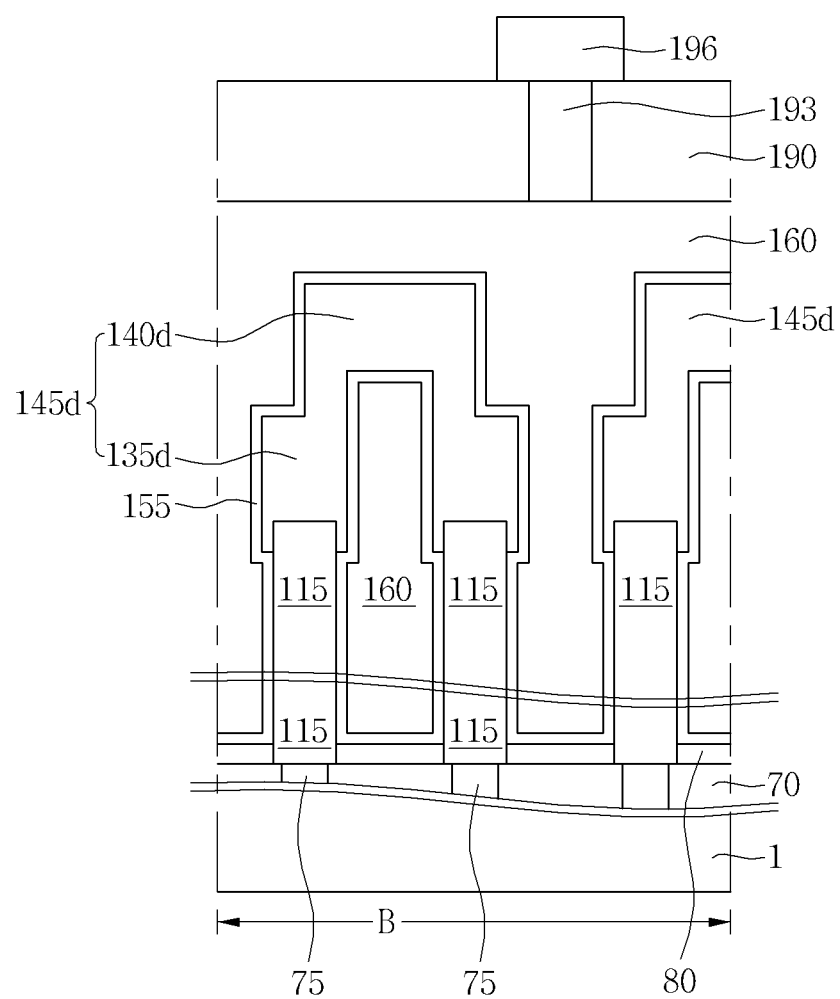

A semiconductor device in accordance with an embodiment of the inventive concept is described with reference to FIG. 6 and FIG. 7. FIG. 6 is a plan view illustrating a semiconductor device in accordance with an embodiment of the inventive concept. FIG. 7 is a cross-sectional view taken along the line IV-IV' of FIG. 6.

Referring to FIG. 6 and FIG. 7, a lower interlayer insulating layer 70 may be formed on a substrate 1. Conductive plugs 75 passing through the lower interlayer insulating layer 70 may be formed. Storage electrodes 115 may be formed on the lower interlayer insulating layer 70.

A continuous support pattern 145d may be formed on the storage electrodes 115. The continuous support pattern 145d may include contact parts 135d and a connection part 140d. The contact parts 135d of the continuous support pattern 145d may be directly connected to the top surfaces of the storage electrodes 115. The contact parts 135d may have sides vertically aligned with sides of they storage electrodes 115. The connection part 140d of the continuous support pattern 145d may connect two or more contact parts 135d to each other.

When viewed in a plan view, the connection part 140d of the continuous support pattern 145d may include a strip-shaped portion. For example, according to an embodiment, when viewed in a plan view, the connection part 140d may be formed in a strip shape, and two or more contact parts 135d may be connected to each of the opposite side edges of the line-shaped connection part 140d.

The connection part 140d of the continuous support pattern 145d may be continuously connected to some portions of top surfaces of the contact parts 135d. The connection part 140d may cover some portions of the top surfaces of the contact parts 135d. For example, according to an embodiment a portion of the top surface of the contact part 135d may be connected to the connection part 140d.

The connection part 140d may be at a higher level than bottom surfaces of the contact parts 135d. The sides of the contact parts 135d may not be vertically aligned with a side of the connection part 140d.

A storage dielectric layer 155 may be formed on the substrate having the storage electrodes 115 and the continuous support pattern 145d. A plate electrode 160 may be formed on the storage dielectric layer 155.

Figure 8:
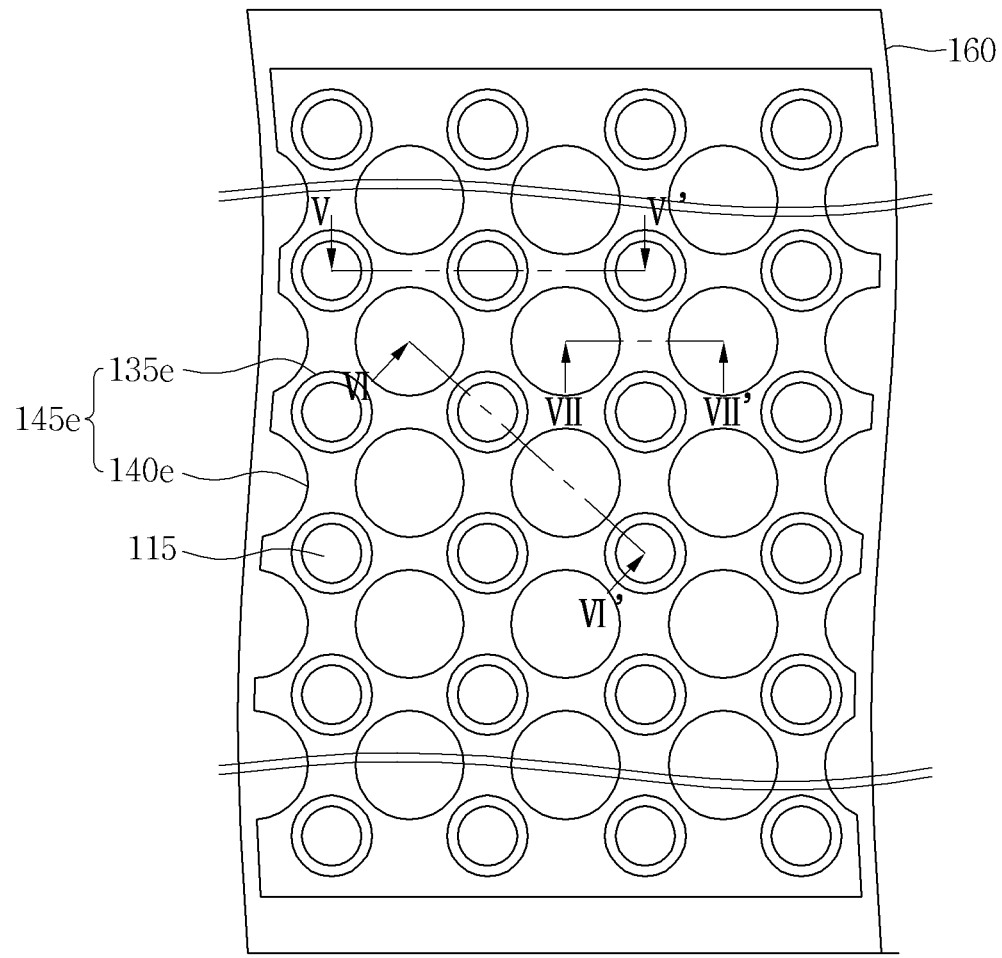
FIG. 8 and FIG. 9 are a plan view and a cross-sectional view showing a semiconductor device in accordance with an embodiment of the inventive concept.
Figure 9:
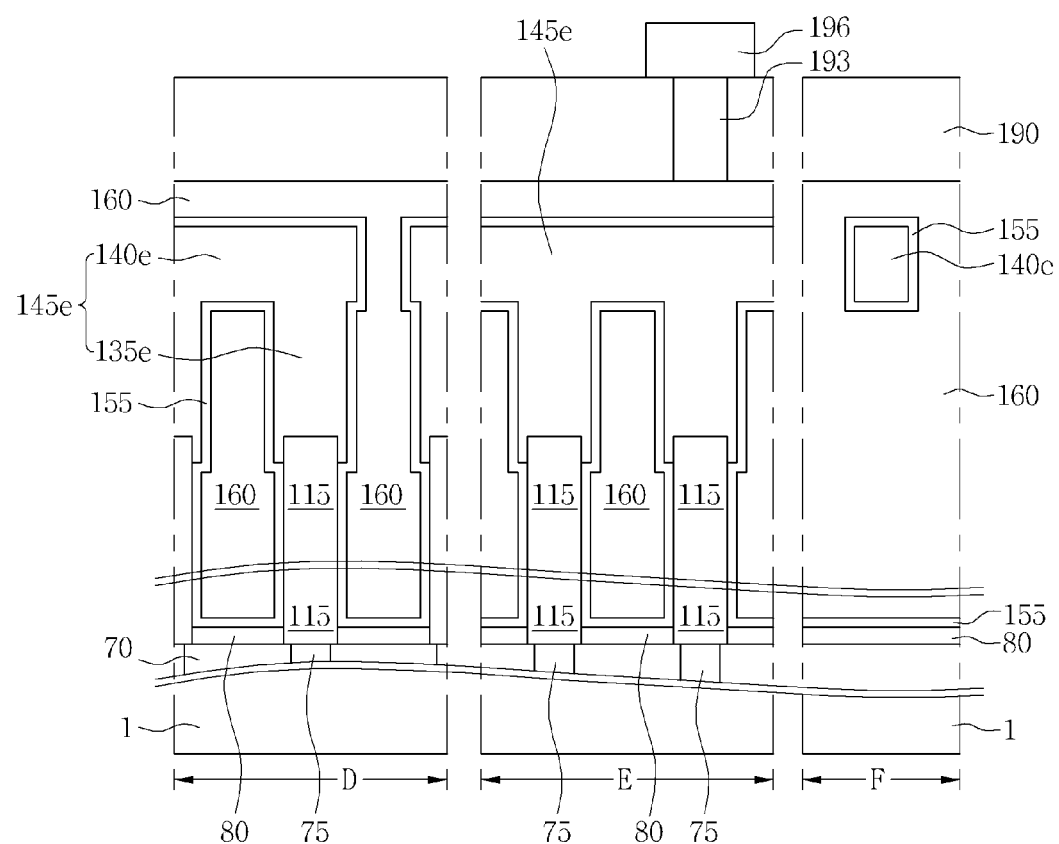

A semiconductor device in accordance with an embodiment of the inventive concept is described with reference to FIG. 8 and FIG. 9. FIGS. 8 and 9, respectively, are a plan view and a cross-sectional view illustrating a semiconductor device in accordance with an embodiment of the inventive concept. In FIG. 9, reference character "D" indicates the area taken along the line V-V' in FIG. 8, reference character "E" indicates the area taken along the line VI-VI' in FIG. 8, and reference character "F" indicates the area taken along the line VII-VII' in FIG. 8.

Referring to FIG. 8 and FIG. 9, a lower interlayer insulating layer 70 may be formed on a substrate 1. Conductive plugs 75 passing through the lower interlayer insulating layer 70 may be foamed. Storage electrodes 115 may be formed on the lower interlayer insulating layer 70.

A continuous support pattern 145e may be formed on the storage electrodes 115. The continuous support pattern 145e may be formed of an insulating material, such as silicon nitride. The continuous support pattern 145e may include contact parts 135e and a connection part 140e.

The contact parts 135e may be formed on top surfaces of the storage electrodes 115. The contact parts 135e may be directly in contact with the top surfaces of the storage electrodes 115. The contact parts 135e may have greater widths than widths of the storage electrodes 115. Each of the contact parts 135e may have a vertical thickness greater than a horizontal width.

The connection part 140e may connects the contact parts 135e to each other. The connection part 140e may be a form of a grid in which two or more lines intersect each other at a right angle.

A storage dielectric layer 155 may be formed on the substrate having the storage electrodes 115 and the continuous support pattern 145e. A plate electrode 160 may be formed on the storage dielectric layer 155.

A semiconductor device in accordance with an embodiment of the inventive concept is described with reference to FIG. 10A.

Figure 10A:
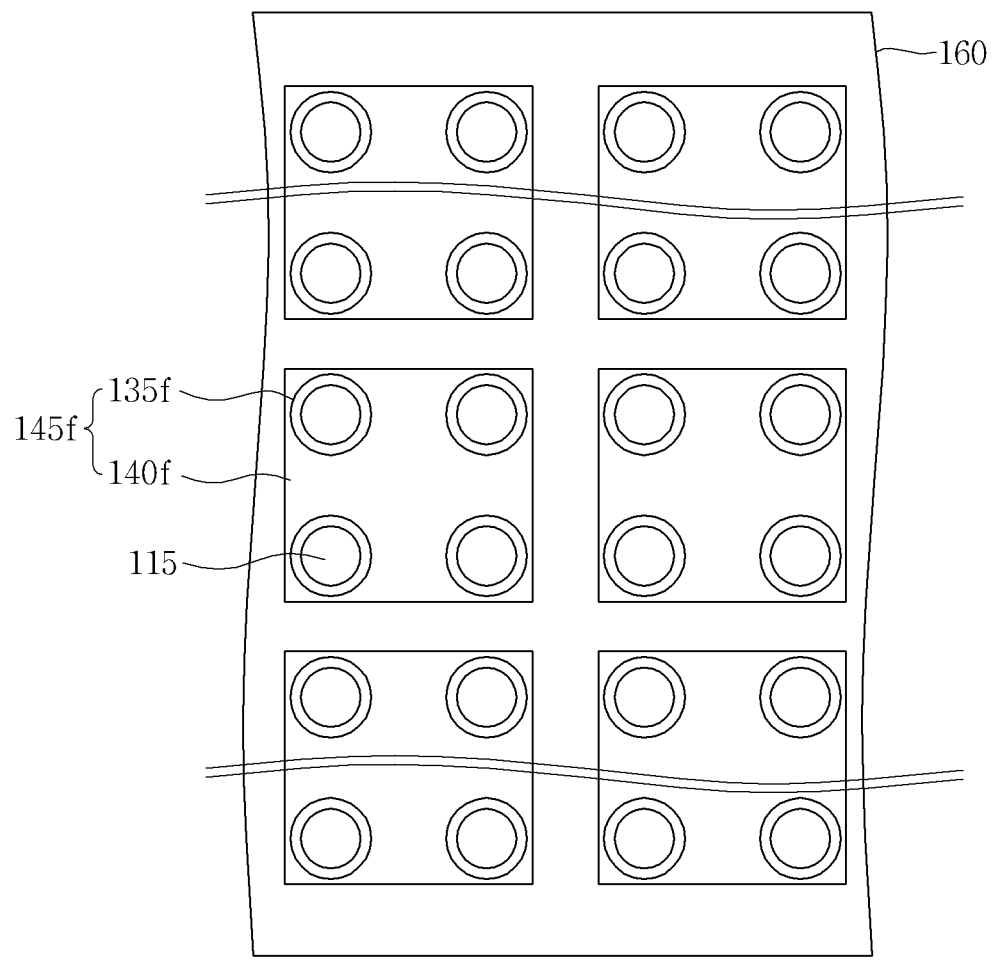
FIGS. 10A and 10B are plan views showing semiconductor devices in accordance with embodiments of the inventive concept.

Referring to FIG. 10A, a plurality of continuous support patterns 145f connected to a plurality of storage electrodes 115 may be formed. Each of the continuous support patterns 145f may be connected to storage electrodes 115 arranged along a first direction and to storage electrodes 115 arranged along a second direction which intersects the first direction. Each of the continuous support patterns 145f may include contact parts 135f in contact with top surfaces of the storage electrodes 115 and a connection part 140f connecting the contact parts 135f to each other. The connection part 140f may have a rectangular or circular shape.

A semiconductor device in accordance with an embodiment of the inventive concept is described with reference to FIG. 10B.

Figure 10B:
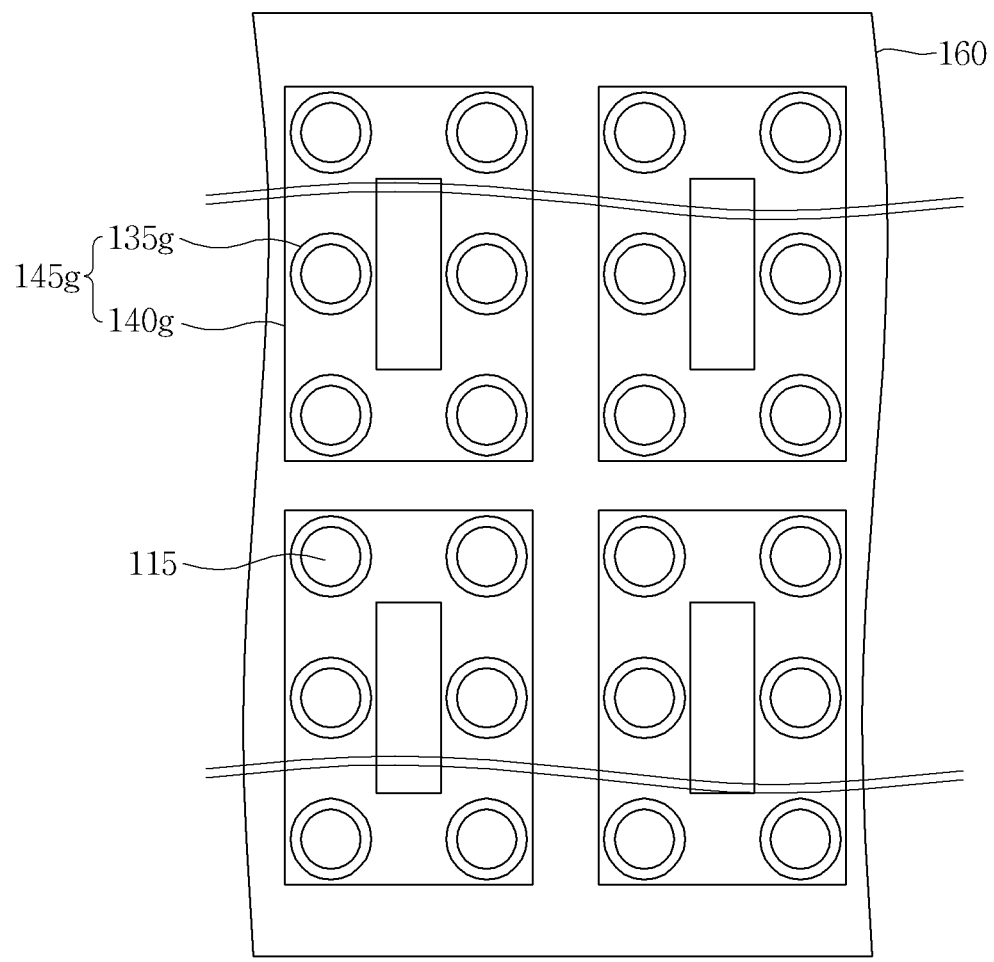

Referring to FIG. 10B, a plurality of continuous support patterns 145g connected to a plurality of storage electrodes 115 may be formed. The continuous support patterns 145g may be spaced apart from each other. Each of the continuous support patterns 145g may be connected to storage electrodes 115 arranged along a first direction and to storage electrodes 115 arranged along a second direction which intersects the first direction. Each of the continuous support patterns 145g may include contact parts 135g in contact with top surfaces of the storage electrodes 115 and a connection part 140g connecting the contact parts 135g to each other. The connection part 140g may be shaped like a donut or ring which is empty in the middle thereof.

Figure 11:
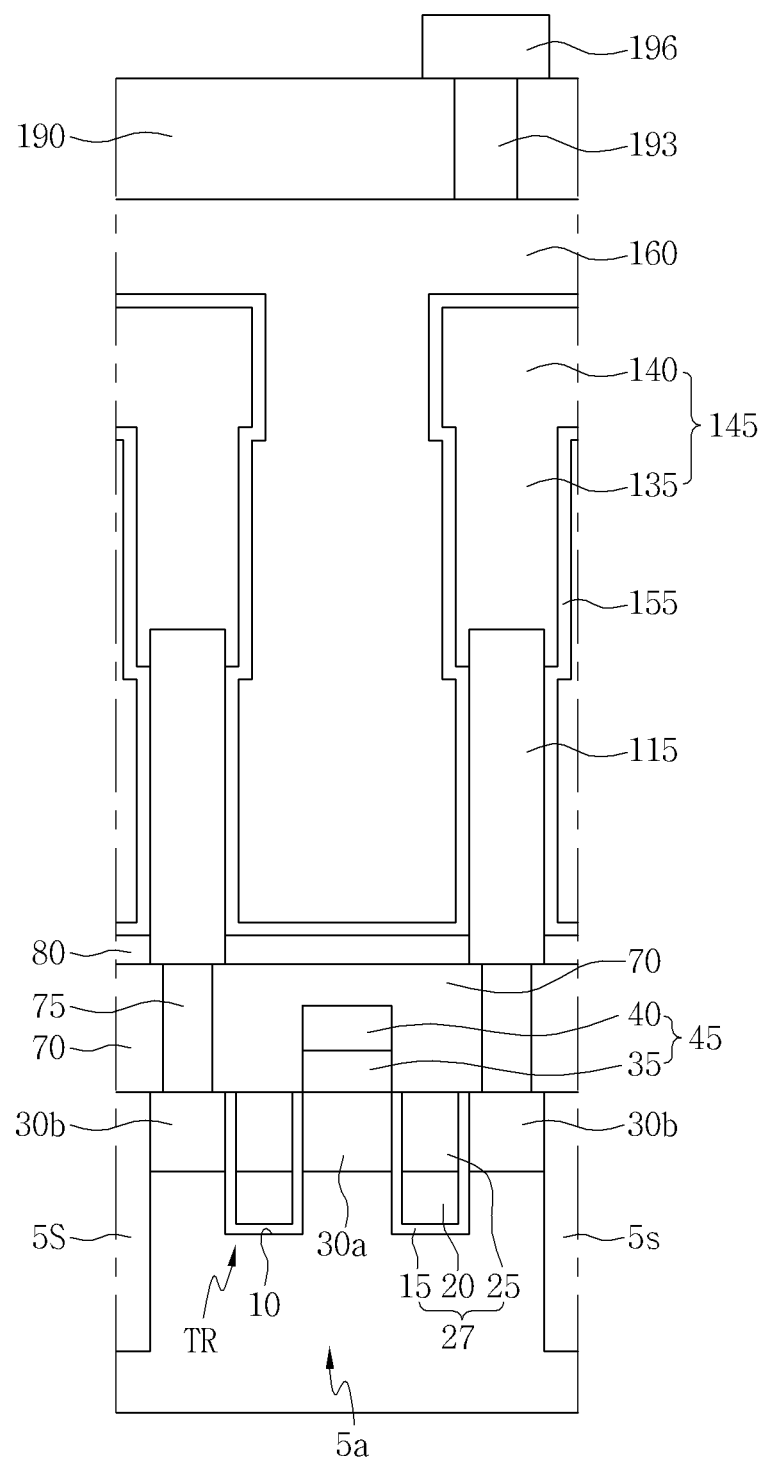
FIG. 11 is a cross-sectional view showing a semiconductor device in accordance with an embodiment of the inventive concept.

The semiconductor devices described with reference to FIGS. 1 to 10B may include switching devices, such as transistors. FIG. 11 is a cross-sectional view showing a semiconductor device in accordance with an embodiment of the inventive concept.

Referring to FIG. 11, an isolation area 5s defining an active area 5a may be formed in a substrate 1. The isolation area 5s may be a trench isolation area. A gate trench 10 may be formed in the active area 5a. The gate trench 10 may intersect the active area 5a and may extend to the isolation area 5s. A gate structure 27 may be formed in the gate trench 10. The gate structure 27 may include a gate dielectric layer 15, a gate electrode 20, and an insulating capping pattern 25. The gate electrode 20 may partially fill the gate trench 10. The gate electrode 20 and the capping pattern 25 may be sequentially stacked. The gate dielectric layer 25 may be interposed between the gate electrode 20 and the active area 5a and between the capping pattern 25 and the active area 5a. First and second source/drain regions 30a and 30b may be formed in the active area 5a at two sides of the gate structure 27. The gate structure 27 and the first and second source/drain regions 30a and 30b may be configured to form a transistor TR.

A bit-line structure 45 electrically connected to the first source/drain region 30a may be formed on the substrate having the transistor TR. The bit-line structure 45 may include a conductive bit-line 40 and a bit-line plug 35 formed between the bit-line 40 and the first source/drain region 30a.

A lower interlayer insulating layer 70 may be formed on the substrate having the bit-line structure 45. Contact plugs 75 passing through the lower interlayer insulating layer 70 and electrically connected to the second source/drain regions 30b may be formed. An etch stopping layer 80 may be formed on the lower interlayer insulating layer 70.

As described above in connection with FIG. 2, a plurality of storage electrodes 115 spaced apart from each other may be formed. The storage electrodes 115 may be formed on the contact plugs 75 and electrically connected to the contact plugs 75.

As described above in connection with FIG. 2, a continuous support pattern 145 directly connected to top surfaces of the storage electrodes 115 may be formed. The continuous support pattern 145 may include contact parts 135 and a connection part 140.

A storage dielectric layer 155 may be formed on the storage electrodes 115 and the continuous support pattern 145. The storage dielectric layer 155 may surround sides of the storage electrodes 115, extend up to cover the continuous support pattern 145, and extend onto the etch stopping layer 80 formed between the storage electrodes 115. A plate electrode 160 may be formed on the storage dielectric layer 155. An upper interlayer insulating layer 190 may be formed on the plate electrode 160. A plug 193 passing through the upper interlayer insulating layer 190 may be fon ied. A metal line 196 electrically connected to the plug 193 may be formed on the upper interlayer insulating layer 190.

A method of fabricating a semiconductor device in accordance with an embodiment of the inventive concept is described with reference to FIG. 1 and FIGS. 12A to 13I. FIGS. 12A and 12B and FIGS. 13A to 13I are flowcharts and cross-sectional views illustrating a method of fabricating a semiconductor device in accordance with an embodiment of the inventive concept. In FIGS. 13A to 13I, reference character "A" indicates the area taken along the line I-I' in FIG. 1, reference character "B" indicates the area taken along the line II-IF in FIG. 1, and reference character "C" indicates the area taken along the line III-III' in FIG. 1.

Figure 12A:
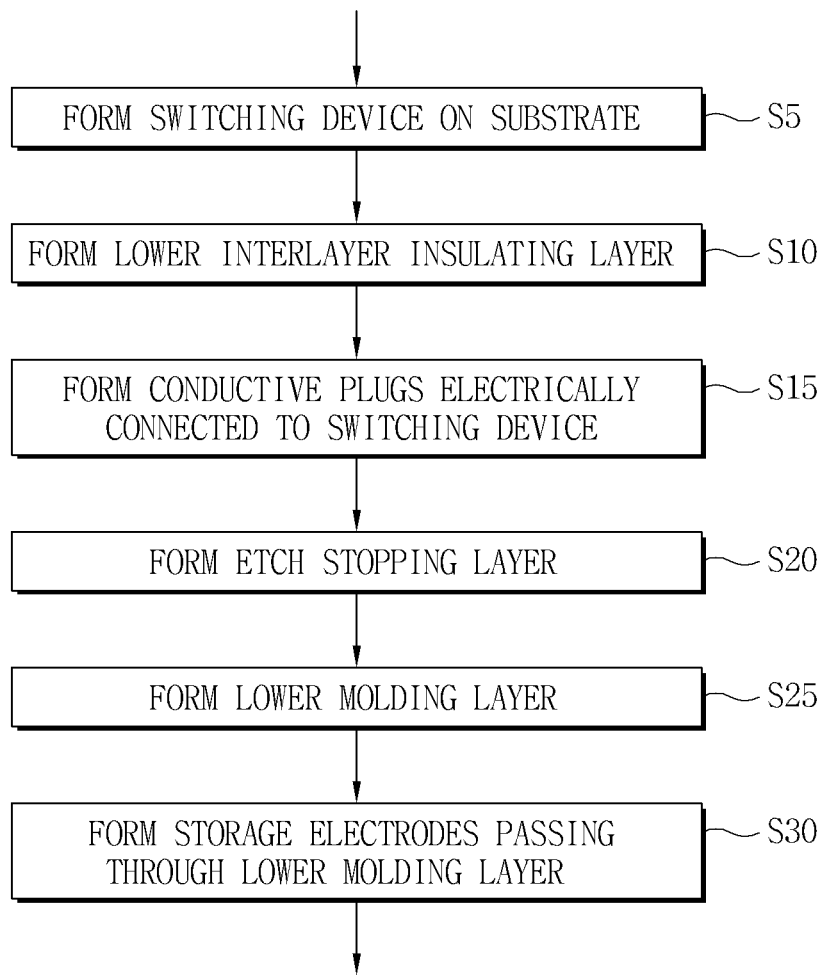
FIGS. 12A and 12B are flowcharts illustrating a method of fabricating a semiconductor device in accordance with an embodiment of the inventive concept.
Figure 13A:
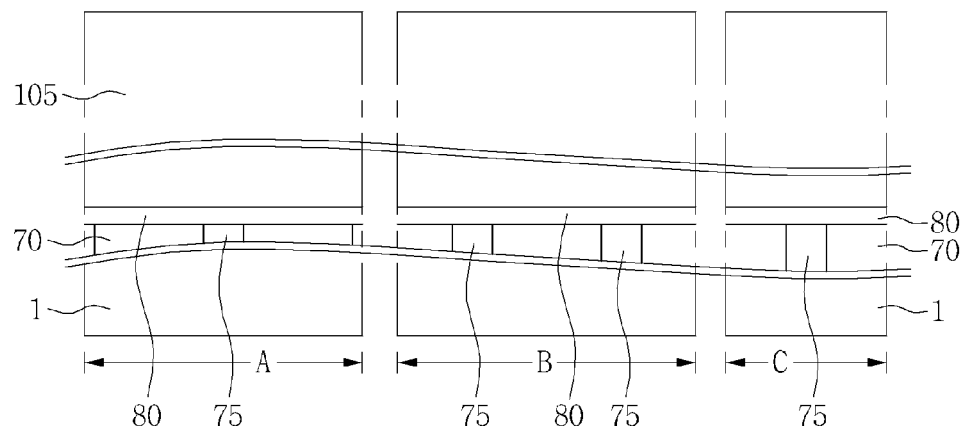
FIGS. 13A to 13I are cross-sectional views illustrating a method of fabricating a semiconductor device in accordance with an embodiment of the inventive concept.

Referring to FIGS. 1, 12A, and 13A, a substrate 1 may be prepared. A switching device may be formed on the substrate 1 (S5). The switching device may include a MOS transistor. For example, according to an embodiment, the switching transistor may be the transistor TR described in connection with FIG. 11. A lower interlayer insulating layer 70 may be formed on the substrate 1 having the switching device (S10). The lower interlayer insulating layer 70 may be formed of silicon oxide.

Conductive contact plugs 75 passing through the lower interlayer insulating layer 70 to be electrically connected to the switching device may be formed (S15). When the switching device is an NMOS transistor, the plugs 75 may be electrically connected to one of source and drain areas of the NMOS transistor.

An etch stopping layer 80 may be formed (S20). The etch stopping layer 80 may be formed to cover the conductive plugs 75 on the lower interlayer insulating layer 70. The etch stopping layer 80 may be formed of a material different from the lower interlayer insulating material 70. The etch stopping layer 80 may be formed of a material having etching selectivity with respect to the lower interlayer insulating layer 70. For example, according to an embodiment, the lower interlayer insulating layer 70 may be formed of silicon oxide, and the etch stopping layer 80 may be formed of silicon nitride.

A lower molding layer 105 may be formed on the etch stopping layer 80 (S25). The lower molding layer 105 may be formed of a material having etching selectivity with respect to the etch stopping layer 80. For example, according to an embodiment, the etch stopping layer 80 may be formed of silicon nitride, and the lower molding layer 105 may be formed of silicon oxide.

Figure 13B:
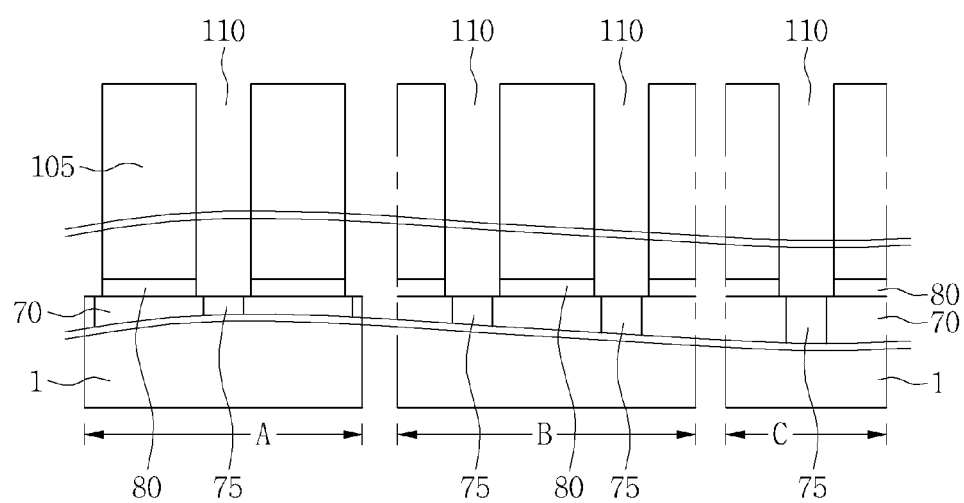

Referring to FIG. 1 and FIG. 13B, a plurality of storage holes 110 spaced apart from each other may be formed by patterning the lower molding layer 105 and the etch stopping layer 80. The storage holes 110 may sequentially pass through the lower molding layer 105 and the etch stopping layer 80.

Figure 13C:
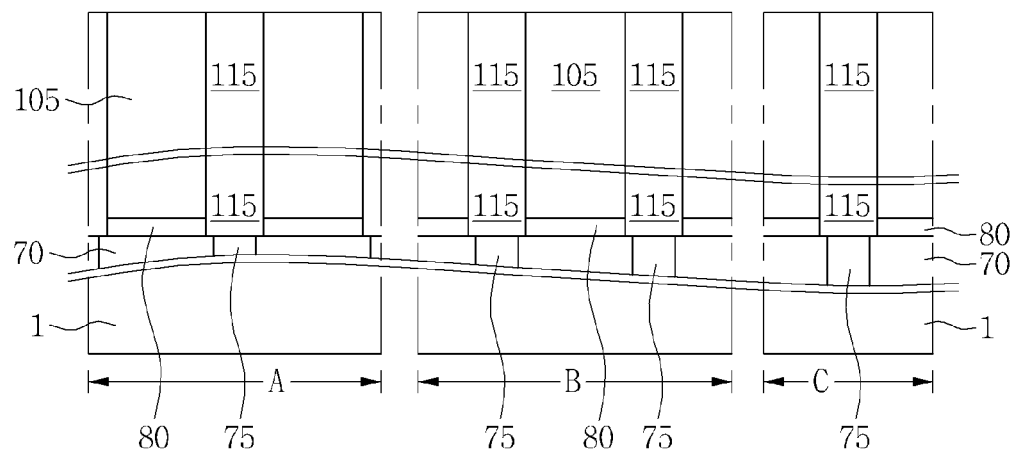

Referring to FIGS. 1, 12A, and 13C, a plurality of storage electrodes 115 passing through the lower molding layer 105 may be formed (S30). The storage electrodes 115 may be electrically connected to the plugs 75.

The formation of the storage electrodes 115 may include forming a conductive material layer on the substrate having the storage holes 110 and planarizing the conductive material layer until the lower molding layer 105 is exposed. Accordingly, the storage electrodes 115 may be formed to be confined in the storage holes 110. According to an embodiment, the planarization of the conductive material layer may be performed using a chemical-mechanical polishing (CMP) process.

Alternatively, the planarization of the conductive material layer may be performed using an etchback process. For example, according to an embodiment, the planarization of the conductive material layer may include etching the conductive material layer until the lower molding layer 105 is exposed.

Figure 12B:
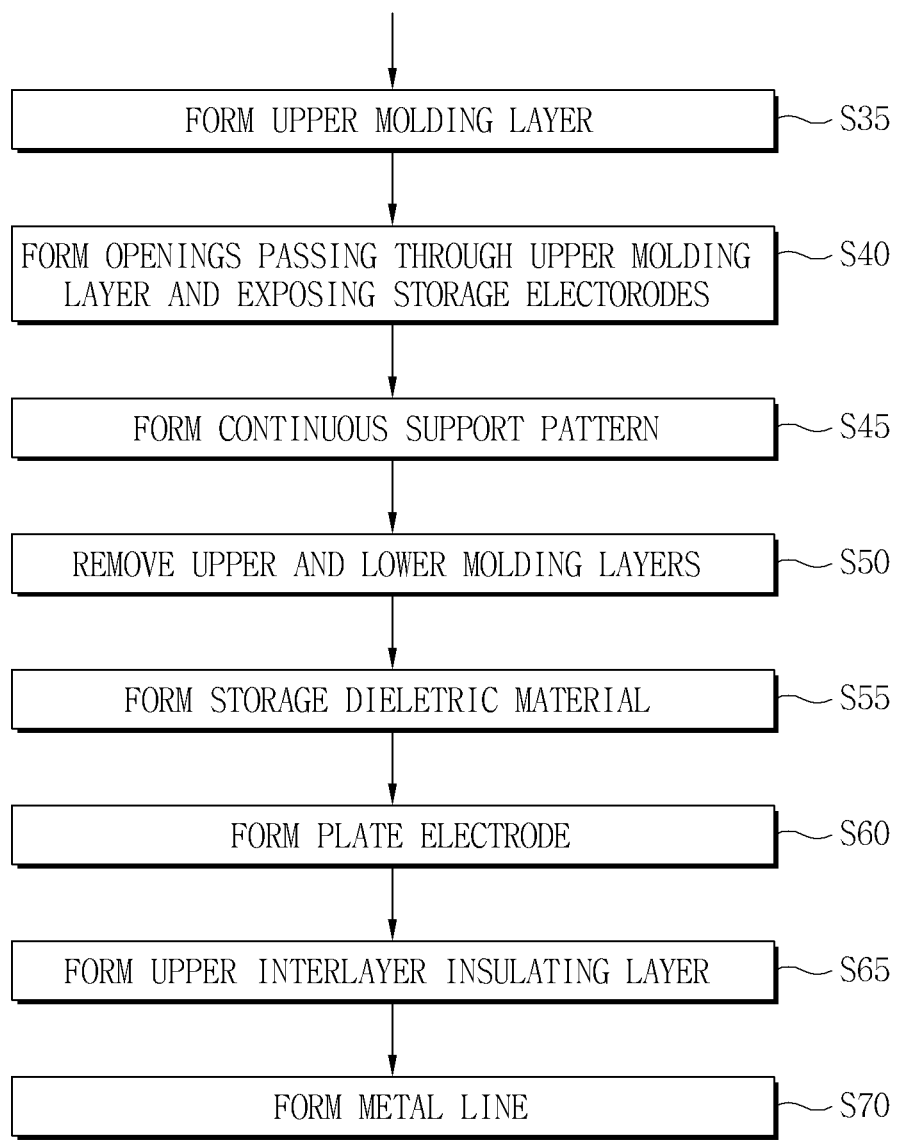
Figure 13D:
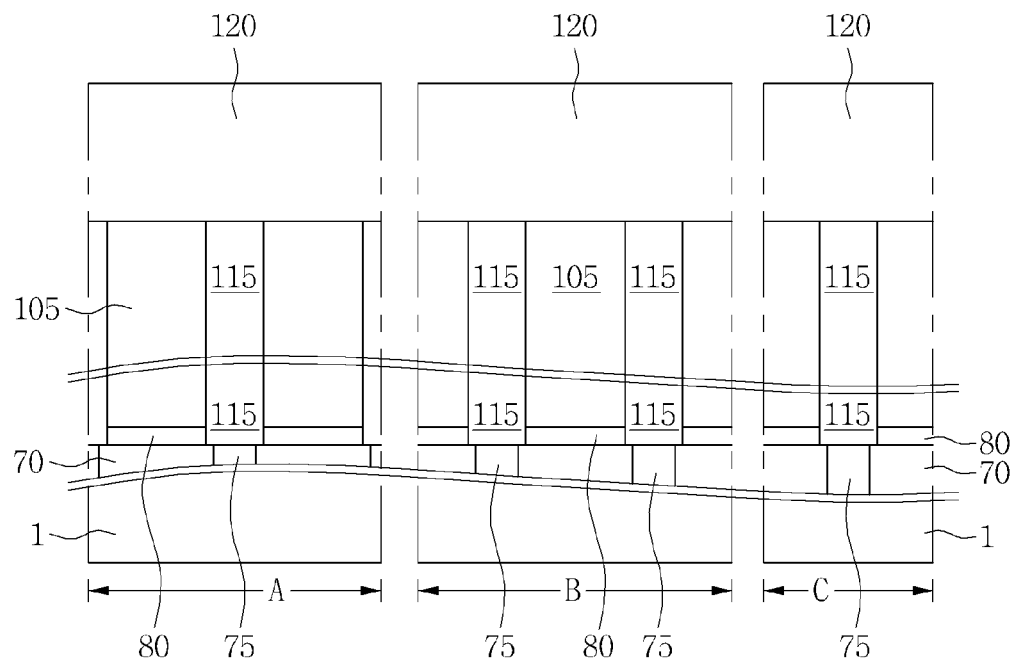

Referring to FIGS. 1, 12B, and 13D, an upper molding layer 120 may be formed (S35). The upper molding layer 120 may be formed to cover the storage electrodes 115 on the lower molding layer 105.

The upper molding layer 120 may be formed of a material which can be removed by the same or substantially the same etching process as an etching process performed on the lower molding layer 105. For example, according to an embodiment, the upper molding layer 120 may be formed of the same or substantially the same material as the lower molding layer 105. For example, according to an embodiment, the upper molding layer 120 and the lower molding layer 105 may be formed of silicon oxide.

Figure 13E:
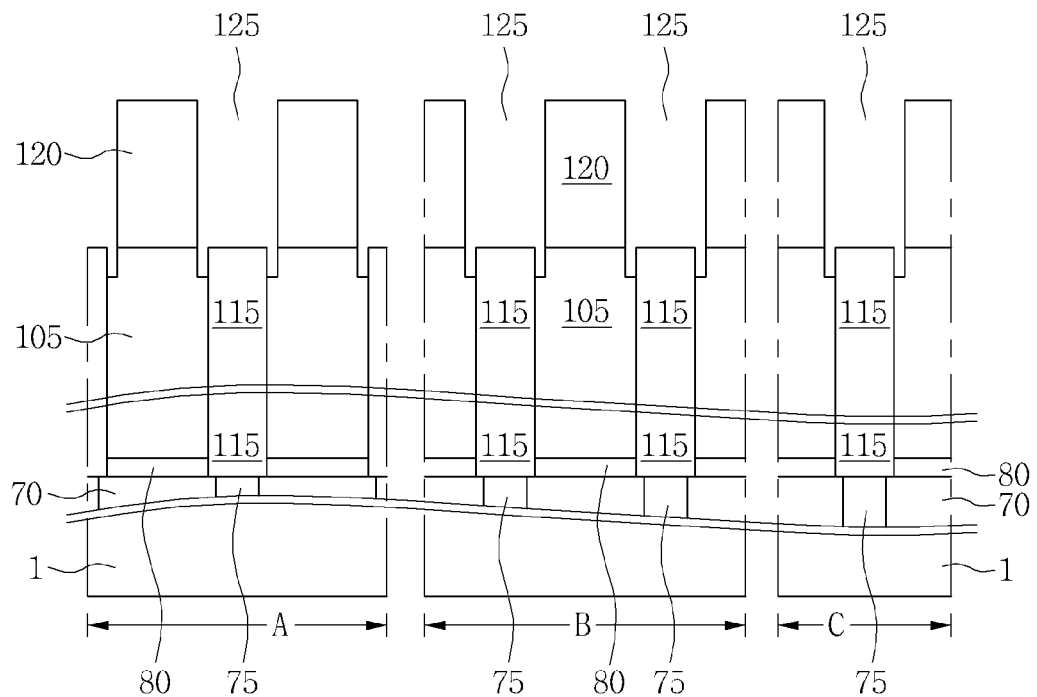

Referring to FIGS. 1, 12B, and 13E, openings 125 passing through the upper molding layer 120 and exposing the storage electrodes 115 may be formed (S40). The openings 125 may be spaced apart from each other. The openings 125 may expose top surfaces of the storage electrodes 115. The openings 125 may expose the top surfaces and upper side surfaces of the storage electrodes 115. The openings 125 may expose upper portions of the storage electrodes 115. The top and side surfaces of the upper portions of the storage electrodes 115 may be exposed by the openings 125.

Figure 13F:
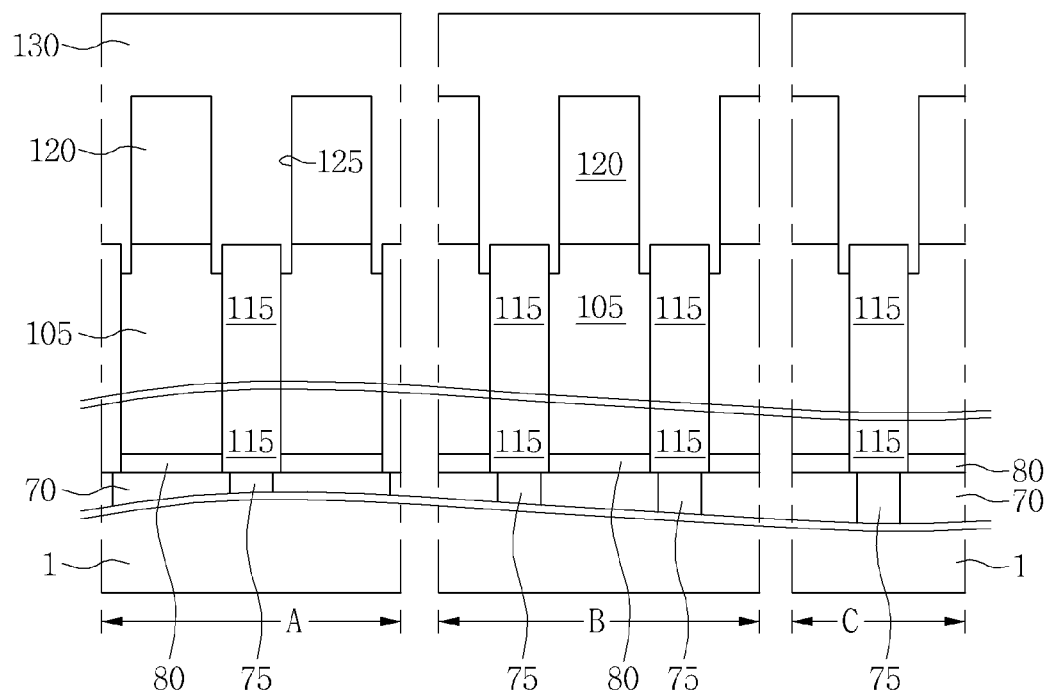

Referring to FIG. 1 and FIG. 13F, an insulating material layer 130 may be formed on the substrate having the openings 125. The insulating material layer 130 may be formed of a material different from the upper and lower molding layers 105 and 120. The insulating material layer 130 may be formed of a material having etching selectivity with respect to the upper and lower molding layers 105 and 120. For example, according to an embodiment, the upper and lower molding layers 105 and 120 may be formed of silicon oxide, and the insulating material layer may be formed of silicon nitride. The insulating material layer 130 may be formed of an insulating material, such as SiCN or SiON.

Figure 13G:
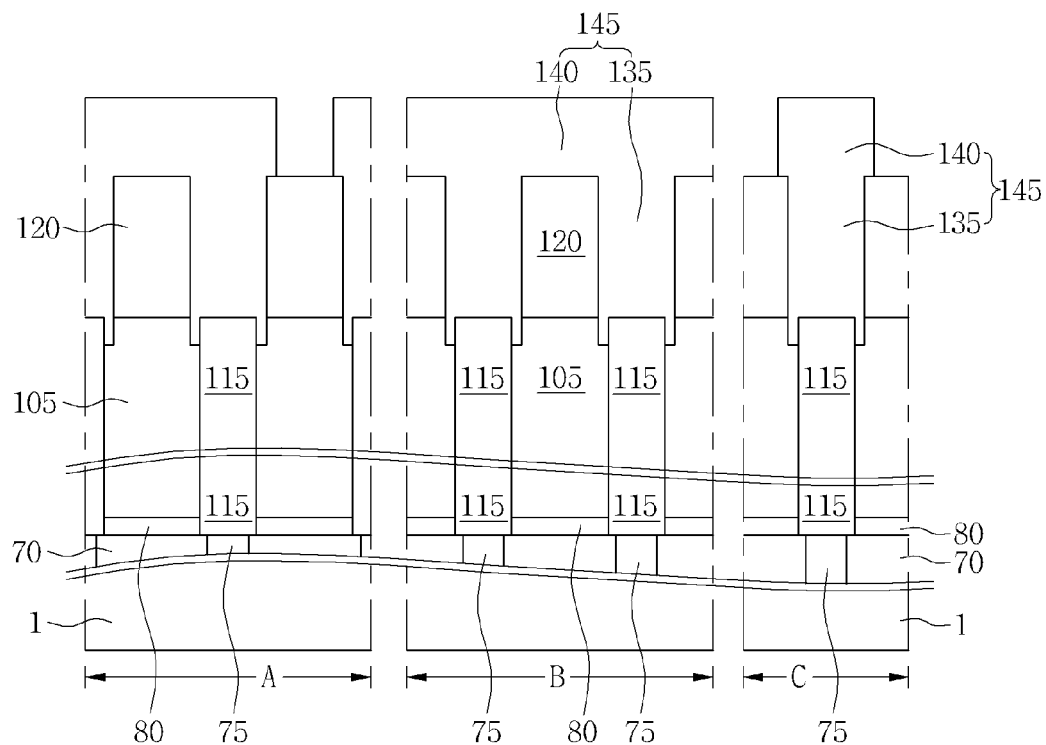

Referring to FIGS. 1, 12B, and 13G a continuous support pattern 145 may be formed (S45). The continuous support pattern 145 may be formed by patterning the insulating material layer (130 in FIG. 13F). The continuous support pattern 145 may include contact parts 135 and a connection part 140.

The contact parts 135 of the continuous support pattern 145 may be formed in the openings 125. The contact parts 135 of the continuous support pattern 145 may be formed in the openings 125 and in contact with the storage electrodes 115 exposed by the openings 125. The contact parts 135 may be in contact with the top and side surfaces of the upper portions of the storage electrodes 115.

The connection part 140 of the continuous support pattern 145 may be formed on the upper molding layer 120 and connect the contact parts 135 confined in the openings 125 to each other. Therefore, the connection part 140 may be formed on a higher level than the contact parts 135. The connection part 140 may be formed on a higher level than the storage electrodes 115. Since the contact parts 135 and the connection part 140 are formed by patterning one layer, for example, the insulating material layer (130 in FIG. 13F), the contact parts 135 and the connection part 140 may be continuously connected to each other.

The connection part 140 may be formed in various shapes, such as a strip, a square, a donut, a grid. For example, according to an embodiment, the connection part 140 may include strip-shaped first connection portions 140_1, and a second connection portion 140_2 connecting the first connection portions 140_1 to each other.

Figure 13H:
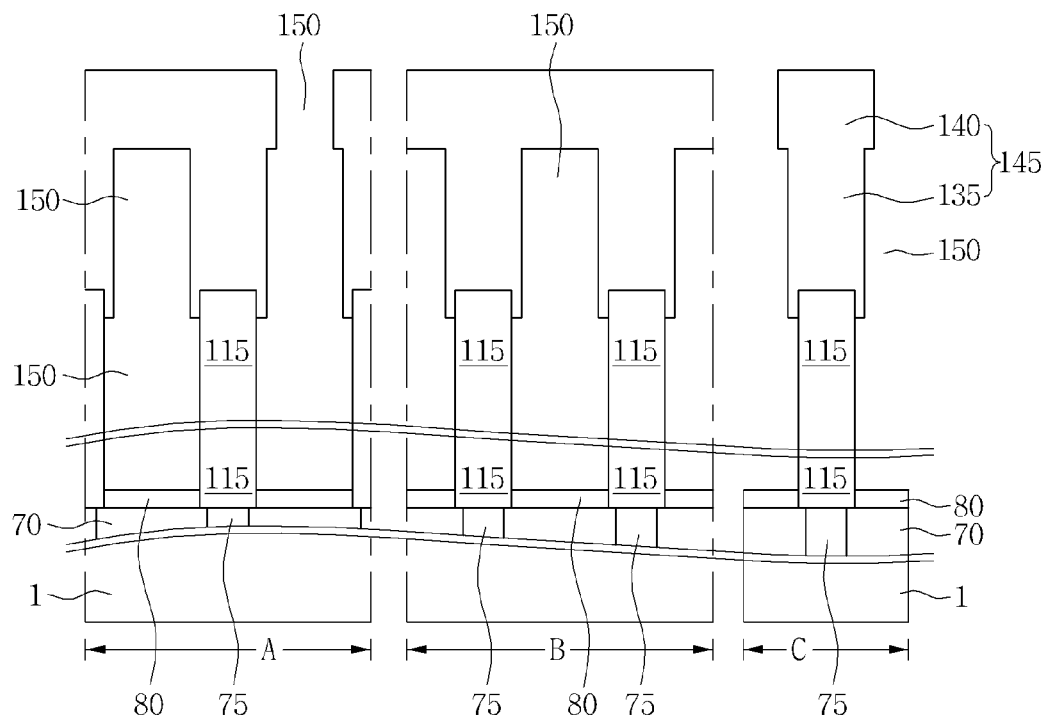

Referring to FIGS. 1, 12B, and 13H, the lower and upper molding layers 105 and 120 may be removed (S50). The lower and upper molding layers 105 and 120 may be removed using an etching process. Since the continuous support pattern 145 and the etch stopping layer 80 have etching selectivity with respect to the lower and upper molding layers 105 and 120, the continuous support pattern 145 and the etch stopping layer 80 may remain after the lower and upper molding layers 105 and 120 are removed. The storage electrodes 115 may remain, too.

The lower and upper molding layers 105 and 120 may be removed to form an empty space 150. Due to the empty space 150, the storage electrodes 115 and the continuous support pattern 145 may be exposed. The continuous support pattern 145 may prevent the storage electrodes 115 from collapsing.

Figure 13I:
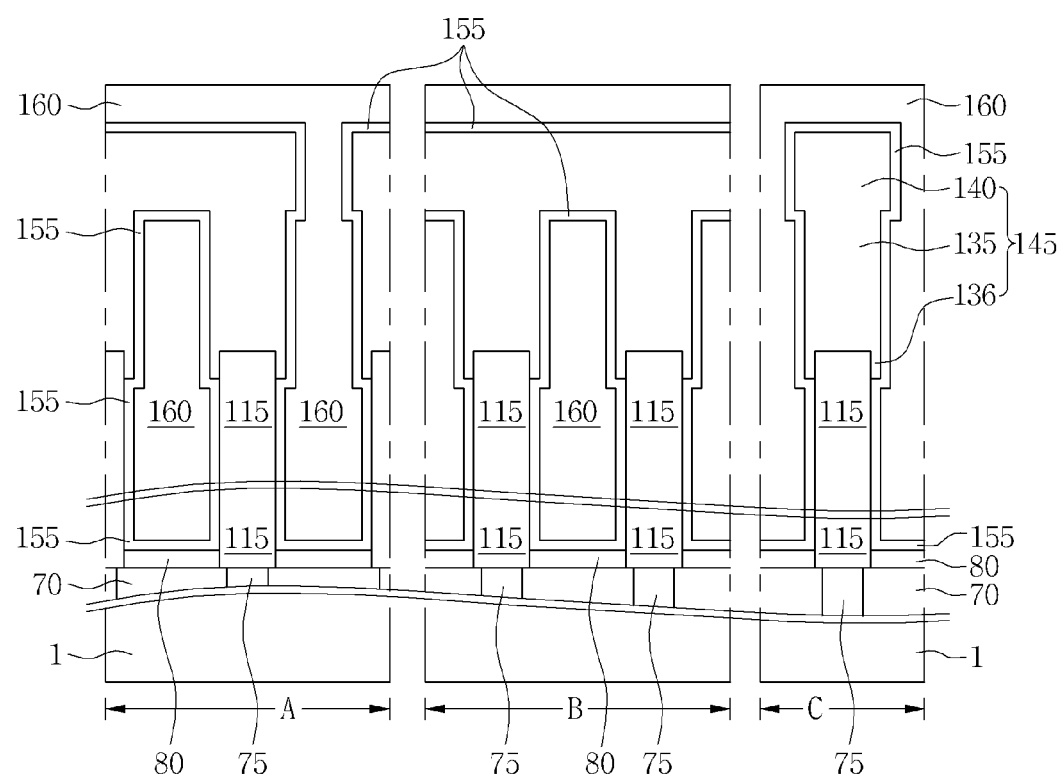

Referring to FIGS. 1, 12B, and 13I, a storage dielectric layer 155 may be formed (S55). The storage dielectric layer 155 may be conformally formed on the substrate having the empty space 150.

Each of the contact parts 135 of the continuous support pattern 145 may have a vertical thickness greater than a horizontal width, and the connection part 140 of the continuous support pattern 145 may be located at a higher level than the storage electrodes 115. Since areas in which the storage electrodes 115 are located have symmetrical structures, process gas or source gas for founing the storage dielectric layer is uniformly supplied into the empty space 150 in which the storage electrodes 115 are located, the storage dielectric layer 155 may be formed to have a uniform thickness on the storage electrodes 115. Therefore, the storage dielectric layer 155 may be formed to have a uniform thickness on sides of the storage electrodes 115.

The storage dielectric layer 155 may be a capacitor dielectric layer. According to an embodiment, the storage dielectric layer 155 may be formed of a TaO layer, a TaON layer, an AlO layer, a HfO layer, a ZrO layer, a TiO layer, a (Ba, Sr)TiO (BST) layer, a SrTiO (STO) layer, a BaTiO (BTO) layer, a Pb(Zr, Ti)O (PZT) layer, a (Pb, La)(Zr, Ti)O layer, a Ba(Zr, Ti)O layer, a Sr(Zr, Ti)O layer, or a combination thereof.

A plate electrode 160 may be formed on the substrate 1 having the storage dielectric layer 155 (S60). The plate electrode 160 may be formed on the storage dielectric layer 155, fill the empty space 150, and cover the continuous support pattern 145.

The plate electrode 160 may be configured to include one of a Ru layer, a Pt layer, an Ir layer, a Ti layer, a TiN layer, a W layer, a WN layer, a Ta layer, a TaN layer, a TiAlN layer, a TiSiN layer, a TaAlN layer, and a TaSiN layer.

Next, referring to FIG. 2 and FIG. 12B, an upper interlayer insulating layer 190 may be formed on a substrate having the plate electrode 160 (S65). A contact plug 193 passing through the upper interlayer insulating layer 190 and electrically connected to the plate electrode 160 may be formed. A metal line 196 electrically connected to the contact plug 193 may be formed on the upper interlayer insulating layer 190 (S70).

Figure 14:
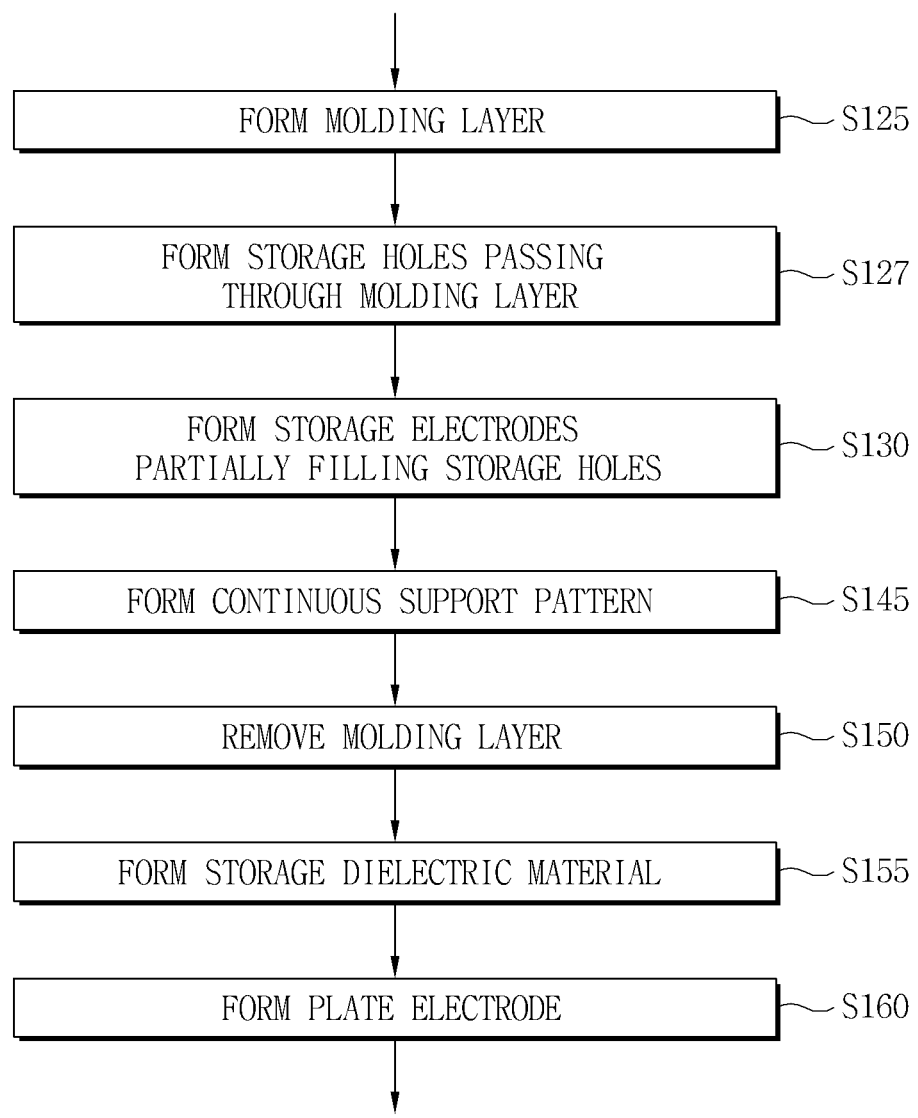
FIG. 14 is a flowchart illustrating a method of fabricating a semiconductor device in accordance with an embodiment of the inventive concept.

A method of fabricating a semiconductor device in accordance with an embodiment of the inventive concept is described with reference to FIG. 14 and FIGS. 15A to 15D. FIG. 14 is a flowchart illustrating a method of fabricating a semiconductor device according to an embodiment of the inventive concept, and FIGS. 15A to 15D are cross-sectional views illustrating a method of fabricating a semiconductor device in accordance with an embodiment of the inventive concept. In FIGS. 15A to 15D, reference character "A" indicates the area taken along the line I-I' in FIG. 1, reference character "B" indicates the area taken along the line II-II' in FIG. 1, and reference character "C" indicates the area taken along the line III-III' in FIG. 1.

Figure 15A:
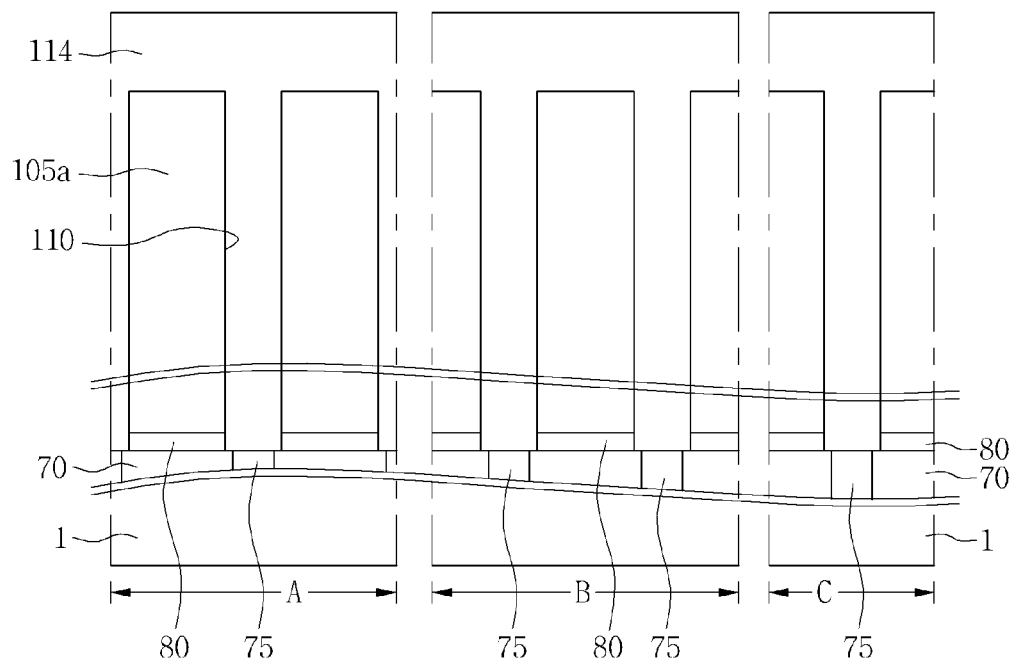
FIGS. 15A to 15D are cross-sectional views illustrating a method of fabricating a semiconductor device in accordance with an embodiment of the inventive concept.

Referring to FIGS. 1, 14, and 15A, as described above in connection with FIG. 13A, a lower interlayer insulating layer 70 may be formed on a substrate 1 having a switching device, and plugs 75 passing through the lower interlayer insulating layer 70 may be formed. A etch stopping layer 80 may be formed on the lower interlayer insulating layer 70.

A molding layer 105a may be formed on the etch stopping layer 80 (S125). The molding layer 105a may be formed of a material having etching selectivity with respect to the etch stopping layer 80. For example, according to an embodiment, the etch stopping layer 80 may be formed of silicon nitride, and the molding layer 105a may be formed of a silicon oxide.

A plurality of storage holes 110 passing through the molding layer and the etch stopping layer 80 may be formed (S127). The storage holes 110 may pass through the molding layer 105a and the etch stopping layer 80. The storage holes 110 may expose the plugs 75.

A conductive material layer 114 may be formed on the substrate 1 having the storage holes 110.

In an embodiment, the conductive material layer 114 may be formed to fill the storage holes 110 and to cover the molding layer 105a.

In an embodiment, the conductive material layer 114 may be formed to conformally cover bottoms and sides of the storage holes 110.

Figure 15B:
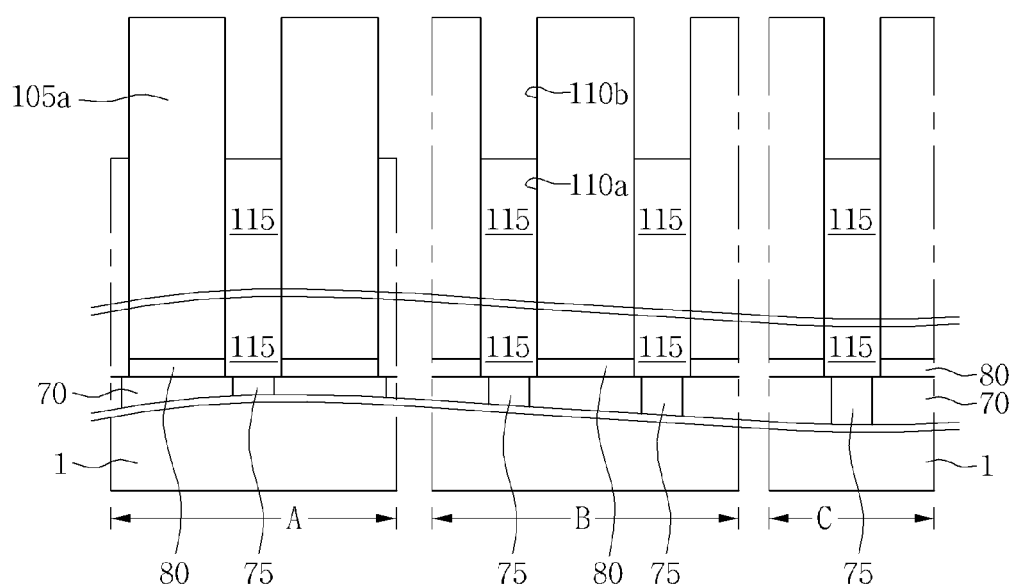

Referring to FIGS. 1, 14, and 15B, storage electrodes 115 may be formed to partially fill the storage holes 110 (S130). Forming the storage electrodes 115 may include etching the conductive material layer 114 using an etchback process. Each of the storage holes 110 may include a first portion 110a filled with the storage electrodes 115 and a second portion 110b disposed on the first portion 110a. Sides of the storage electrodes 115 may be surrounded by the molding layer 105a. Top surfaces of the storage electrodes 115 may be exposed by the second portion 110b of the storage holes 110.

In an embodiment, each of the second portions 110b has a vertical thickness greater than a horizontal width.

Figure 15C:
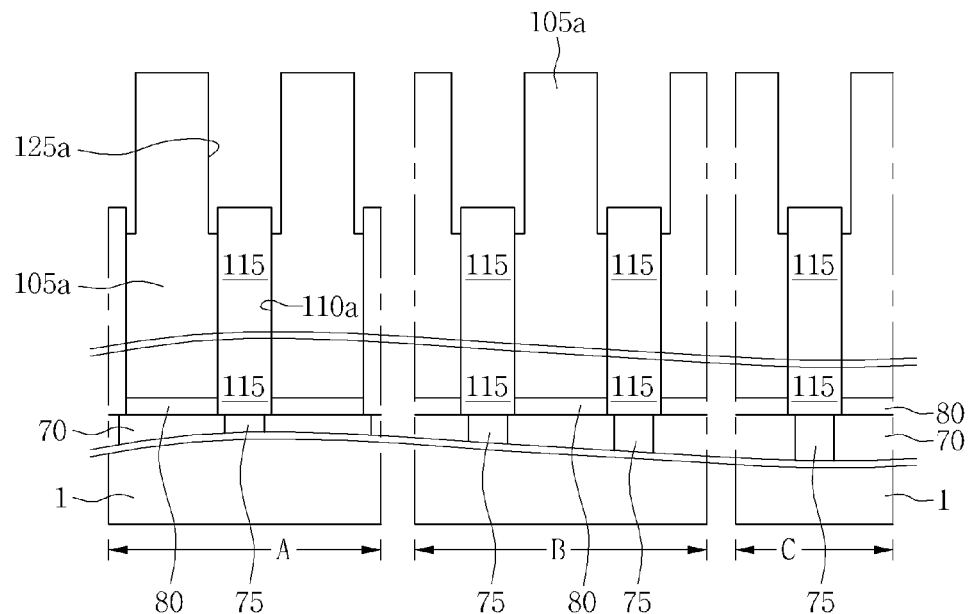

Referring to FIG. 1 and FIG. 15C, an etching process may be performed to extend the horizontal widths of the second portions 110b of the storage holes 110. Accordingly, the extended second portions 110b of the storage holes 110 may have widths greater than a width of the first portion 110a. The extended second portions 110b of the storage holes 110 may expose top and side surfaces of upper portions of the storage electrodes 115.

Figure 15D:
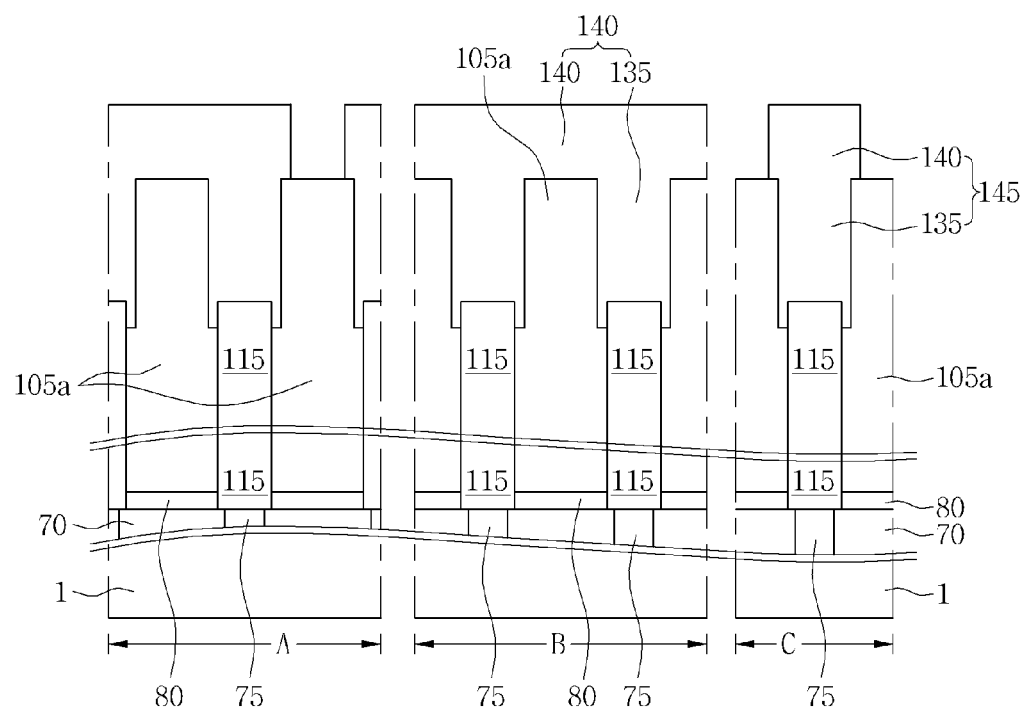

Referring to FIGS. 1, 14, and 15D, as described above in connection with FIG. 13G, a continuous support pattern 145 may be formed (S145). The continuous support pattern 145 may include contact parts 135 and a connection part 140 connecting the contact parts 135. The contact parts 135 may fill the extended second portion 110b of the storage holes 110.

In an embodiment, to form the semiconductor device described in connection with FIG. 5, the continuous support pattern 145 may be formed without a process for expanding the second portions 110b of the storage holes 110. The contact parts 135c filling the second portions 110b of the continuous support pattern 145 may have sides vertically aligned with sides of the storage electrodes 115.

Next, the molding layer 105a may be selectively removed (S150). A storage dielectric layer may be formed on the substrate 1 in which the molding layer 105a has been removed (S155). A plate electrode may be formed on the storage dielectric layer (S160).

Figure 16:
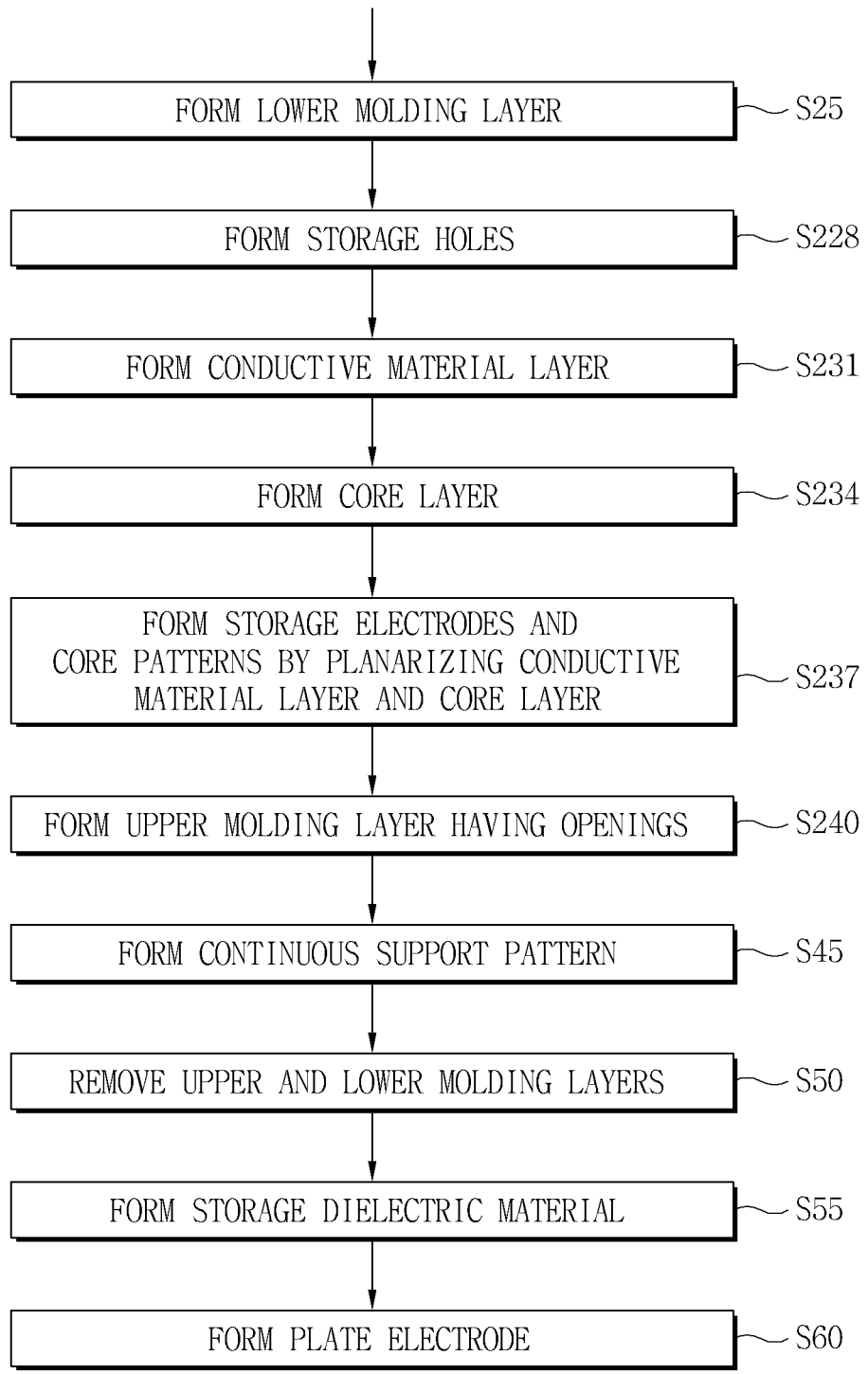
FIG. 16 is a flowchart illustrating a method of fabricating a semiconductor device in accordance with an embodiment of the inventive concept.

A method of fabricating a semiconductor device in accordance with an exemplary embodiment of the inventive concept is described with reference to FIG. 16 and FIGS. 17A to 17F. FIG. 16 is a flowchart illustrating a method of fabricating a semiconductor device according to an embodiment of the inventive concept, and FIGS. 17A to 17F are cross-sectional views illustrating a method of fabricating a semiconductor device in accordance with an embodiment of the inventive concept. In FIGS. 17A to 17F, reference character "A" indicates the area taken along the line I-I' in FIG. 1, reference character "B" indicates the area taken along the line II-II' in FIG. 1, and reference character "C" indicates the area taken along the line III-III' in FIG. 1.

Figure 17A:
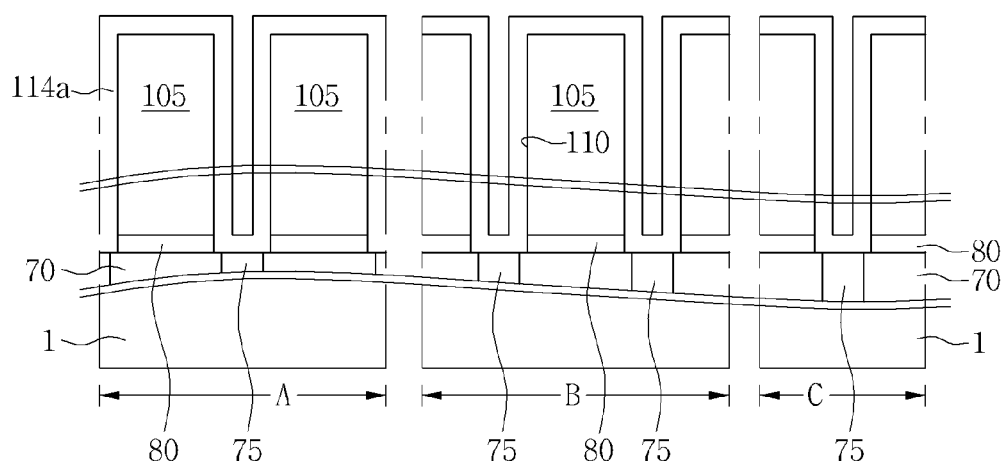
FIGS. 17A to 17F are cross-sectional views illustrating a method of fabricating a semiconductor device in accordance with an embodiment of the inventive concept.

Referring to FIGS. 1, 16, and 17A, as described above in connection with FIG. 13A, a lower interlayer insulating layer 70 may be formed on a substrate 1 having a switching device, and plugs 75 passing through the lower interlayer insulating layer 70 may be formed. An etch stopping layer 80 may be formed on the lower interlayer insulating layer 70.

A lower molding layer 105 may be formed on the etch stopping layer 80 (S25). The lower molding layer 105 may be formed of a material having etching selectivity with respect to the etch stopping layer 80. For example, according to an embodiment, the etch stopping layer 80 may be formed of silicon nitride, and the lower molding layer 105 may be formed of silicon oxide.

A plurality of storage holes 110 passing through the lower molding layer 105 and the etch stopping layer 80 may be formed (S228). The storage holes 110 may expose the plugs 75.

A conductive material layer 114a may be formed on the substrate having the storage holes 110 (S231). The conductive material layer 114a may be conformally formed. The conductive material layer 114a may conformally cover inner walls of the storage holes 110 to open upper portions of the storage holes 110.

Figure 17B:
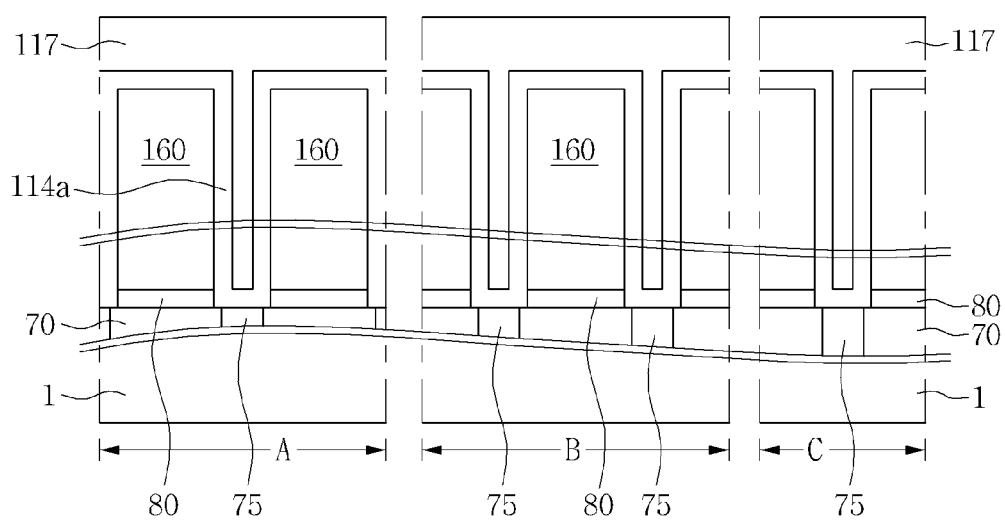

Referring to FIGS. 1, 16, and 17B, a core layer 117 filling the storage holes 110 may be formed on the conductive material layer 114a (S234).

Figure 17C:
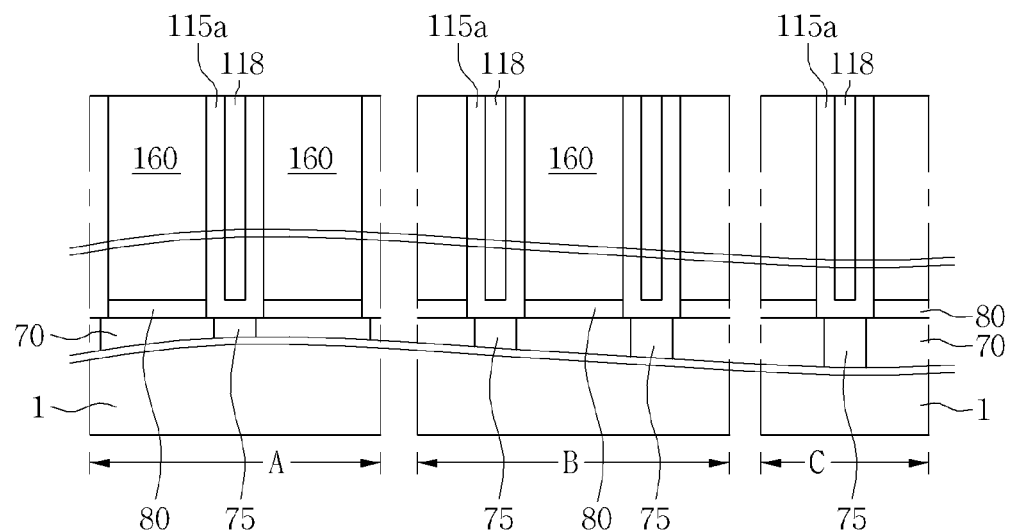

Referring to FIGS. 1, 16, and 17C, storage electrodes 115a and core patterns 118 which are confined in the storage holes 110 may be formed by planarizing the conductive material layer 114a and the core layer 117 (S237). For example, according to an embodiment, the storage electrode 115a and core pattern 118 may be formed by planarizing the conductive material layer 114a and the core layer 117 until the lower molding layer 105 is exposed. According to an embodiment, the planarization may be perfoin ed using CMP process or etchback process. For example, according to an embodiment, the storage electrode 115a and the core pattern 118 may be formed by etching the conductive material layer 114a and the core layer 117 until the lower molding layer 105 is exposed.

Figure 17D:
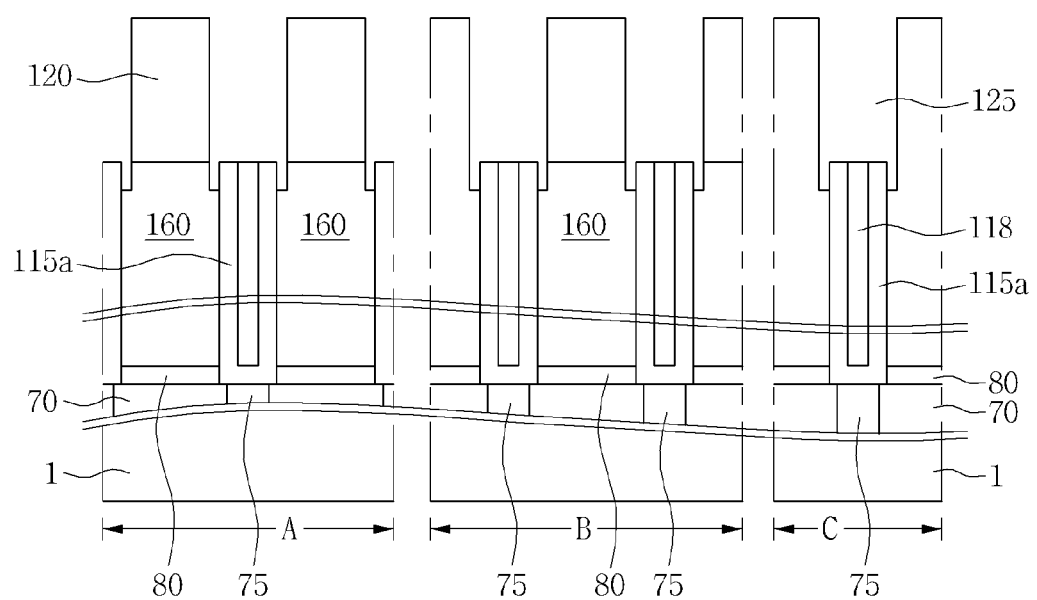

Referring to FIGS. 1, 16, and 17D, as described above in connection with FIGS. 13D and 13E, an upper molding layer 120 having openings 125 may be formed (S240). The openings 125 of the upper molding layer 120 may expose top surfaces of the storage electrode 115a and core pattern 118.

Figure 17E:
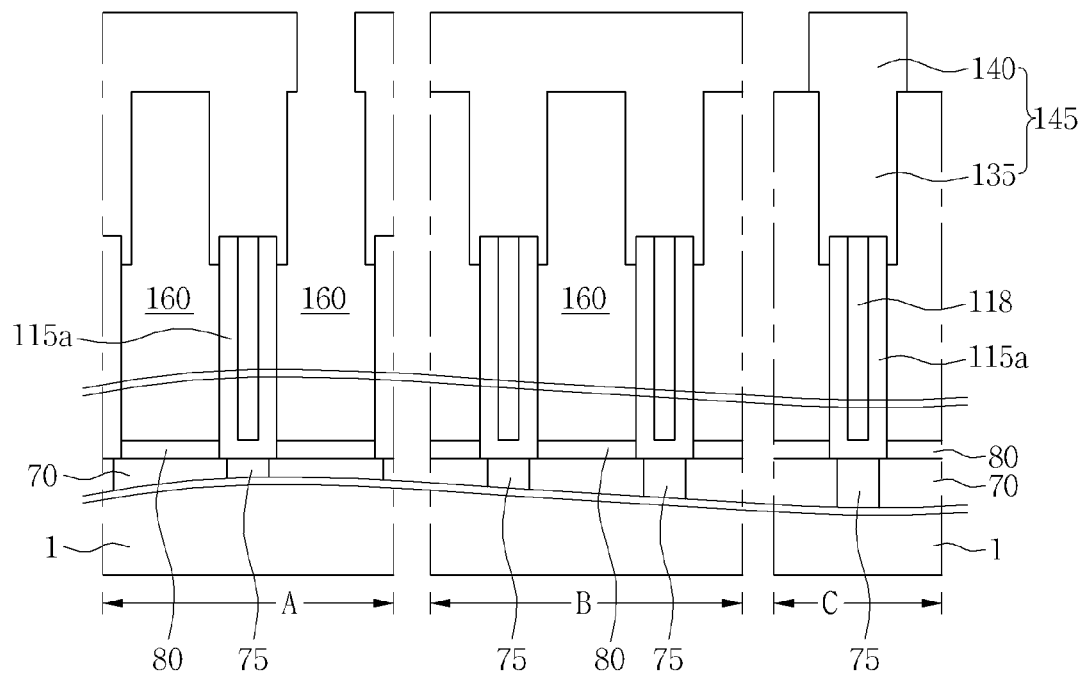

Referring to FIGS. 1, 16, and 17E, as described above in connection with FIGS. 13F and 13G, a continuous support pattern 145 may be formed (S45). The continuous support pattern 145 may include contact parts 135 filling the openings 125 and a connection part 140 continuously connected to the contact parts 135.

Figure 17F:
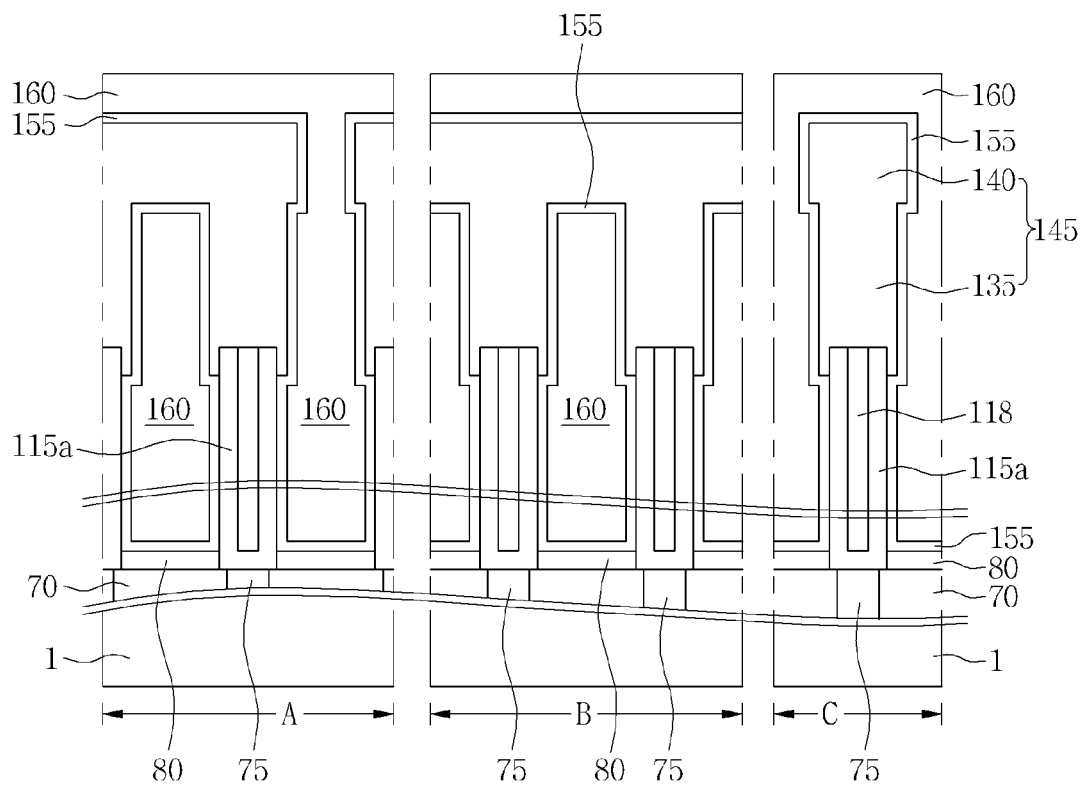

Referring to FIGS. 1, 16, and 17F, the lower and upper molding layers 105 and 120 may be selectively removed by etching process (S50). The continuous support pattern 145 may prevent the storage electrodes 115a from collapsing due to empty spaces generated by removing the lower and upper molding layers 105 and 120. The core patterns 118 may form a multilayer along with storage electrodes 118 to prevent the storage electrodes 115a from bending. A storage dielectric layer 155 may be formed on the resultant structure (S55). A plate electrode 160 may be formed on the storage dielectric layer 155 (S60).

Figure 18A:
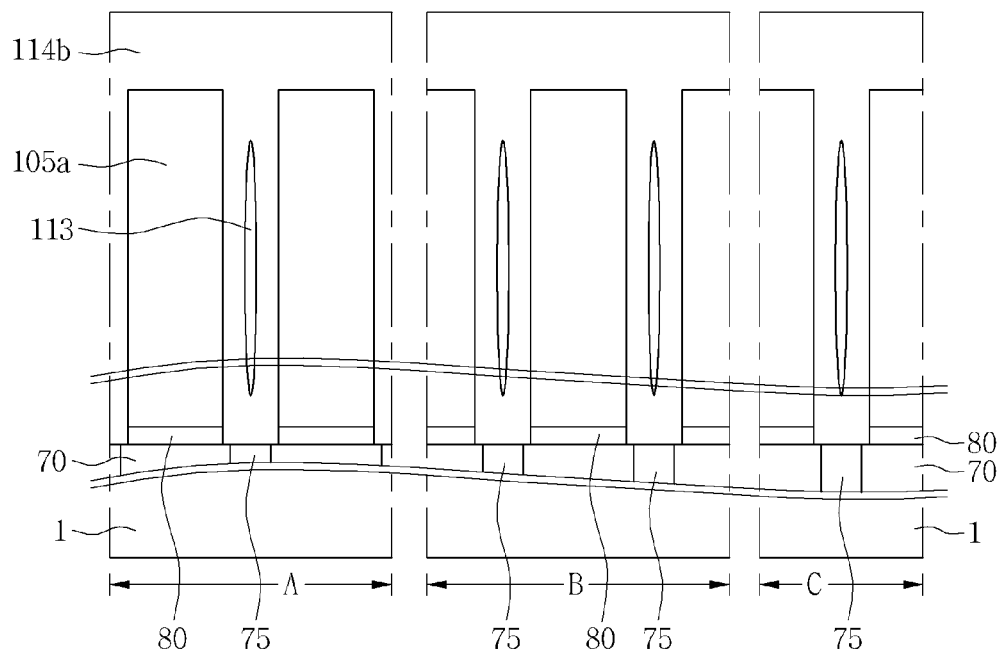
FIGS. 18A to 18C are cross-sectional views illustrating a method of fabricating a semiconductor device in accordance with an embodiment of the inventive concept.
Figure 18B:
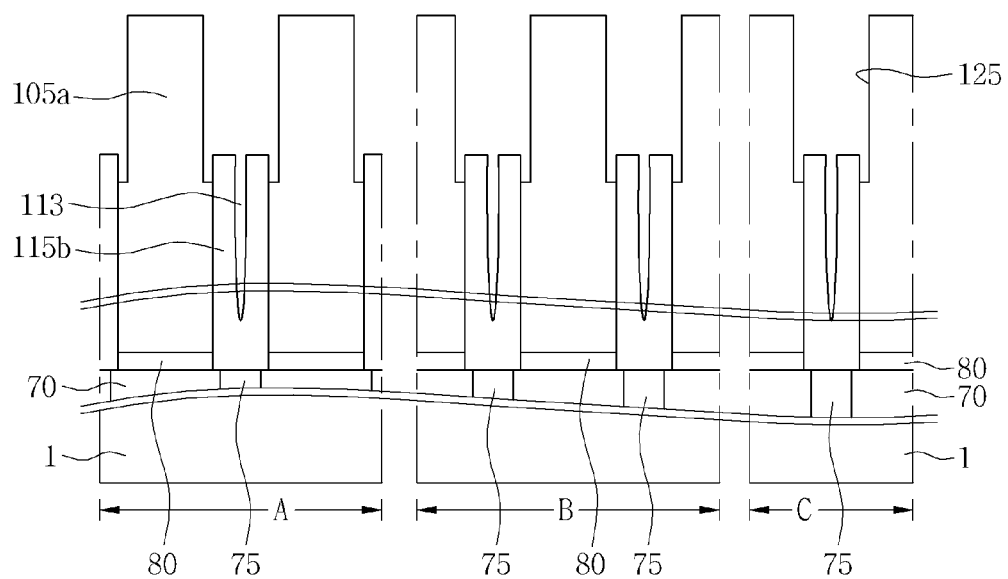
Figure 18C:
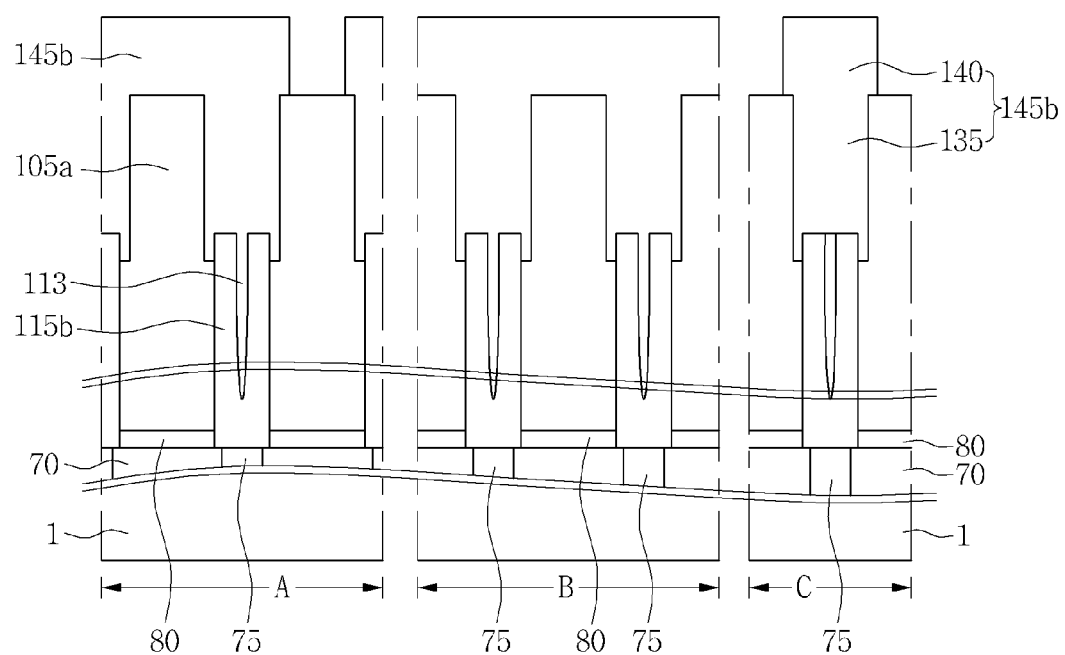

Next, a method of fabricating a semiconductor device in accordance with an embodiment of the inventive concept is described with reference to FIGS. 18A to 18C. In FIGS. 18A to 18C, reference character "A" indicates the area taken along the line I-I' in FIG. 1, reference character "B" indicates the area taken along the line II-II' in FIG. 1, and reference character "C" indicates the area taken along the line III-III' in FIG. 1.

Referring to FIG. 1 and FIG. 18A, as described above in connection with FIG. 13A, a lower interlayer insulating layer 70 may be formed on a substrate 1 having a switching device, and plugs 75 passing through the lower interlayer insulating layer 70 may be formed. An etch stopping layer 80 may be formed on the lower interlayer insulating layer 70. A molding layer 105a may be formed on the etch stopping layer 80. A plurality of storage holes 110 passing through the molding layer 105a and the etch stopping layer 80 may be formed. A conductive material layer 114b may be formed on the substrate having the storage holes 110. The conductive material layer 114b formed in the storage holes 110 may have empty spaces 113.

Referring to FIG. 1 and FIG. 18B, the conductive material layer 114b may be etched to form storage electrodes 115b partly filling the storage holes 110. The empty spaces 113 located in the conductive material layer 114b may be exposed by etching the conductive material layer 114b. The exposed empty spaces 113 may be defined as depressed portions 113b in the top surfaces of the storage electrodes 115b.

Referring to FIG. 1 and FIG. 18C, a continuous support pattern 145b may be formed on the substrate having the storage electrodes 115b. The continuous support pattern 145b may be connected to the top surfaces of the storage electrodes 115b. The continuous support pattern 145b may include contact parts 135 directly in contact with the top surfaces of the storage electrodes 115b, inner extension parts 134b filling the depressed portions 113b of the storage electrodes 115b, and a connection part 140 connecting the contact parts 135 to each other. Then, the molding layer 105a may be removed.

The continuous support pattern 145b may prevent the storage electrodes 115b from collapsing due to the empty spaces formed by removing the molding layer 105a. The inner extension parts 134b of the continuous support pattern 145b may prevent the storage electrodes 115b from bending. A storage dielectric layer and a plate electrode may be sequentially formed on the resultant structure.

Figure 19:
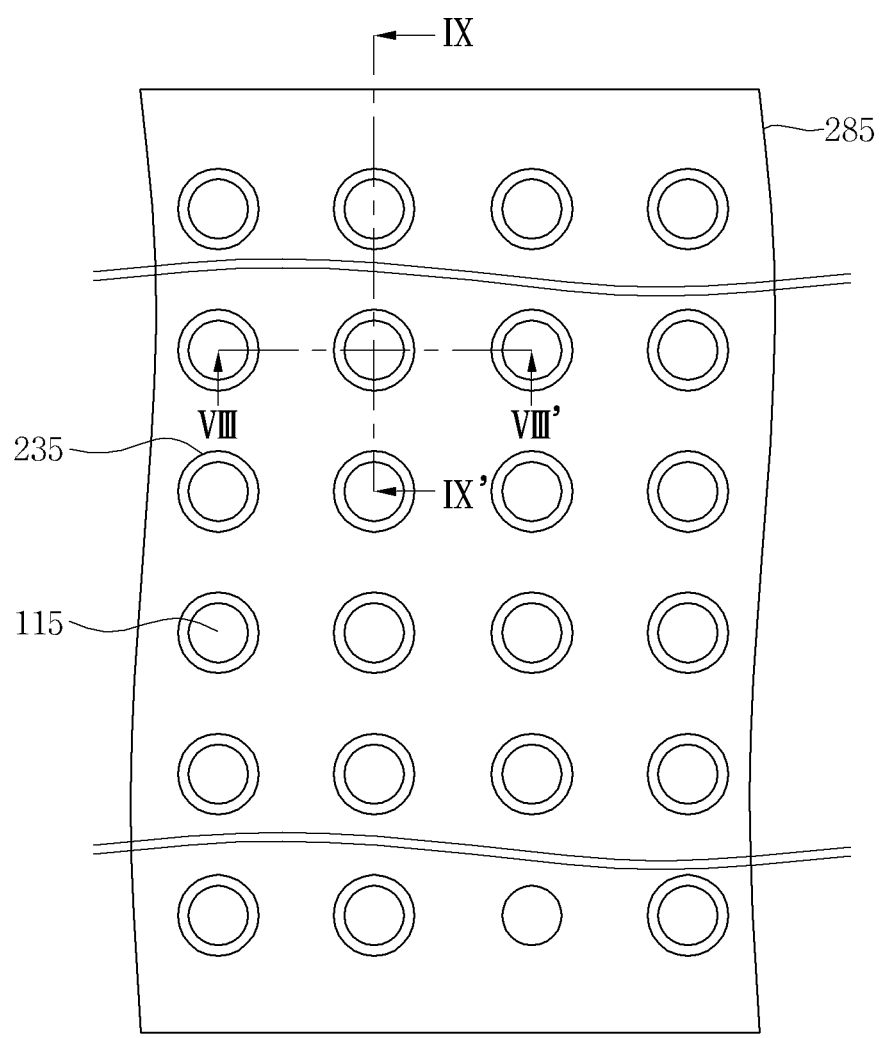
FIG. 19 is a plan view showing a semiconductor device in accordance with an embodiment of the inventive concept.
Figure 20:
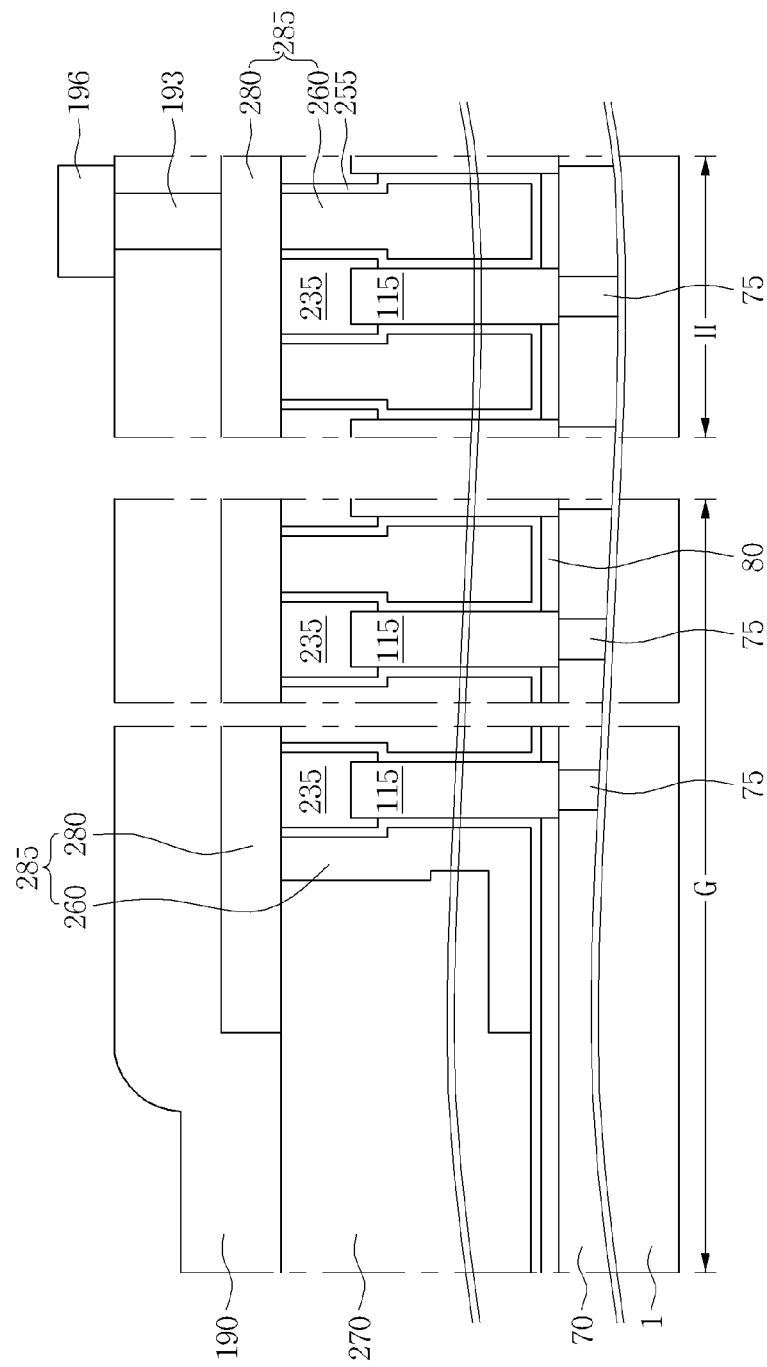
FIG. 20 is a cross-sectional view showing a semiconductor device in accordance with an embodiment of the inventive concept.
Figure 21:
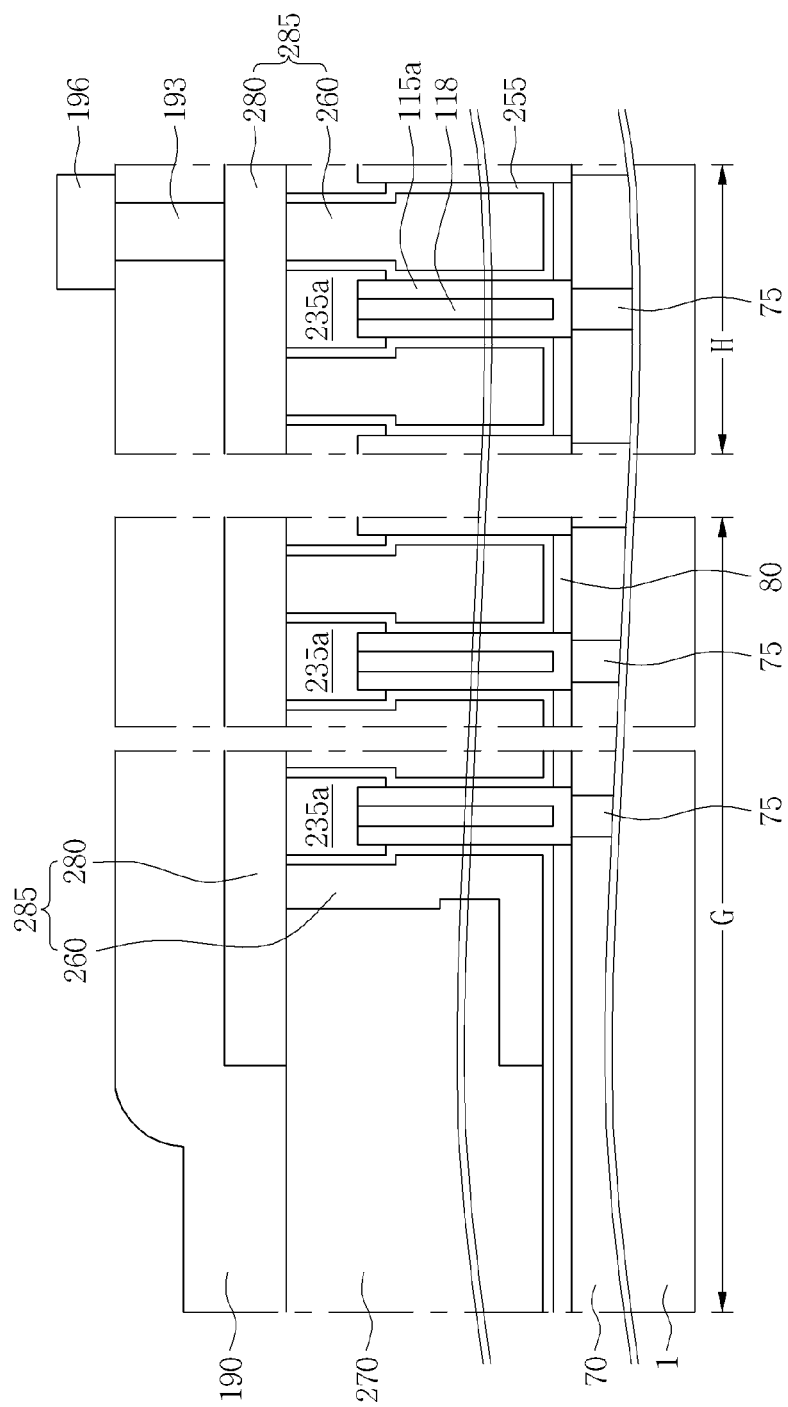
FIG. 21 is a cross-sectional view showing a semiconductor device in accordance with an embodiment of the inventive concept.

FIG. 19 is a plan view illustrating a semiconductor device in accordance with an embodiment of the inventive concept. FIG. 20 and FIG. 21 are cross-sectional views illustrating semiconductor devices in accordance with embodiments of the inventive concept. In FIG. 20 and FIG. 21, reference character "G" indicates the area taken along the line VIII-VIII' in FIG. 19, and reference character "H" indicates the area taken along the line IX-IX' in FIG. 19.

A semiconductor device in accordance with an embodiment of the inventive concept is described with reference to FIG. 19 and FIG. 20.

Referring to FIG. 19 and FIG. 20, a lower interlayer insulating layer 70 may be formed on a substrate 1. Conductive contact plugs 75 passing through the lower interlayer insulating layer 70 may be formed. An etch stopping layer 80 may be formed on the lower interlayer insulating layer 70.

A plurality of storage electrodes 115 spaced apart from each other may be formed on the substrate 1. The storage electrodes 115 may be formed on the lower interlayer insulating layer 70 and may pass through the etch stopping layer 80 to be electrically connected to the contact plugs 75.

In an embodiment, the storage electrodes 115 may be formed in a pillar shape. However, the inventive concept should not be limited to the embodiments set forth herein. For example, according to an embodiment, the storage electrodes 115 may include the cylinder-shaped electrodes 115a as described above in connection with FIG. 3. Alternatively, the storage electrodes 115 include electrodes 115b having depressed portions that extend downward from top surfaces thereof, as described above in connection with FIG. 4.

Insulating patterns 235 may be formed on the storage electrodes 115. The insulating patterns 235 may be vertically aligned with the storage electrodes 115.

The insulating patterns 235 may be directly in contact with the top surfaces of the storage electrodes 115. The insulating patterns 235 may be in contact with the top surfaces of the storage electrodes 115 and may extend to sides of the storage electrodes 115. The insulating patterns 235 may be spaced apart from each other. The insulating patterns 235 may be formed of an insulating material, such as silicon nitride.

In an embodiment, the insulating patterns 235 may have a greater width than a width of the storage electrode 115.

A storage dielectric layer 255 may be formed on the substrate having the storage electrodes 115 and the insulating patterns 235. The storage dielectric layer 255 may be formed to surround sides of sequentially stacked storage electrodes 115 and insulating patterns 235.

A plate electrode 285 may be formed on the substrate having the storage dielectric layer 255. The plate electrode 285 may include a lower plate electrode 260 and an upper plate electrode 280 which includes a material having a lower resistivity than a resistivity of the lower plate electrode 260. For example, according to an embodiment, the lower plate electrode 260 may be formed of a metal nitride, such as titanium nitride, and the upper plate electrode 280 may be formed of a metal having low resistivity compared to the lower plate electrode 260, such as tungsten or aluminum.

The lower plate electrode 260 may be formed to surround the sides of the storage electrodes 115 and insulating patterns 235. The storage dielectric layer 255 may be interposed between the storage electrodes 115 and the lower plate electrode 260, between the insulating patterns 235 and the lower plate electrode 260, and between the etch stopping layer 80 and the lower plate electrode 260.

The upper plate electrode 280 may be formed on the lower plate electrode 260 and the insulating patterns 235. The upper plate electrode 280 may be in contact with and electrically connected to the lower plate electrode 260. The upper plate electrode 280 may be directly in contact with the insulating patterns 235. An upper portion of the storage dielectric layer 255 may be in contact with the upper plate electrode 280, the lower plate electrode 260, and the insulating patterns 235.

An intermetal insulating layer 270 may be formed on the substrate 1 at the same or substantially the same level as the lower plate electrode 260. Edges of the upper plate electrode 280 may be located on a top surface of the intermetal insulating layer 270. The intermetal insulating layer 270 may be formed of silicon oxide. An upper interlayer insulating layer 190 may be formed to cover the plate electrode 285 and the intermetal insulating layer 270. The upper interlayer insulating layer 190 may be formed of silicon oxide. A contact plug 193 passing through the upper interlayer insulating layer 190 may be formed. A metal line 196 electrically connected to the contact plug 193 may be formed on the upper interlayer insulating layer 190.

The storage electrodes 115 may be formed in a pillar shape. However, the inventive concept should not be limited to the embodiments set forth herein. For example, according to an embodiment, the storage electrodes 115 may be formed in a cylinder shape. Referring to FIG. 21, cylinder-shaped storage electrodes 115a may be formed on the substrate 1. Each of the storage electrodes 115a may be in the form of a cylinder which has a depressed portion that extends downward from the center of a top surface thereof. Core patterns 118 may be formed in the depressed portions of the storage electrodes 115a. Sides and bottoms of the core patterns 118 may be surrounded by the storage electrodes 115a. The storage electrodes 115a may form, a filler shape along with the core patterns 118. An insulating pattern 235a may be formed on the top surfaces of the storage electrodes 115a.

Figure 22:
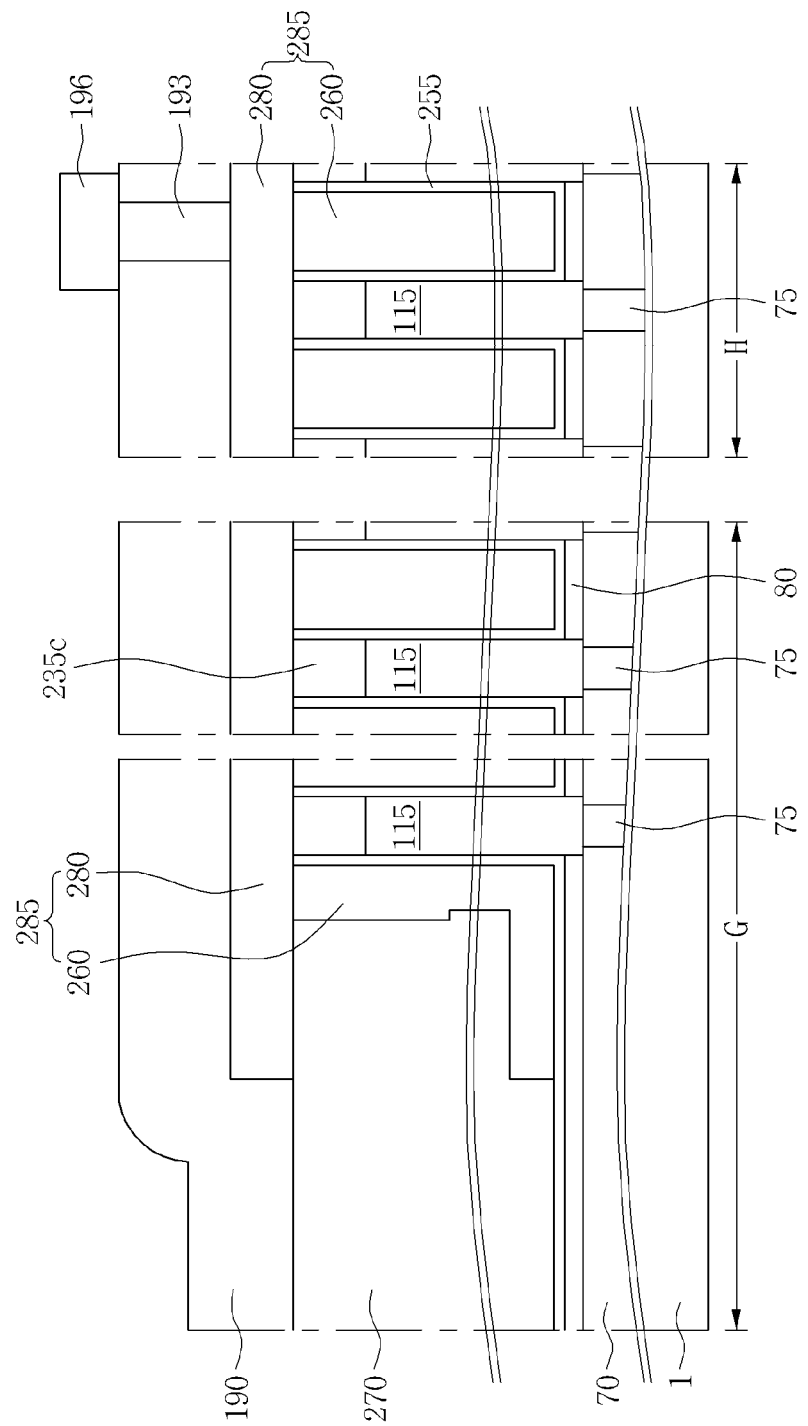
FIG. 22 is a cross-sectional view showing a semiconductor device in accordance with an embodiment of the inventive concept.

In an embodiment, the insulating patterns 235 may have greater widths than widths of the storage electrodes 115. However, the inventive concept should not be limited to the embodiments set forth herein. For example, according to an embodiment, as shown in FIG. 22, insulating patterns 235c having the same or substantially the same horizontal width as the storage electrodes 115 may be formed. For example, according to an embodiment, referring to FIG. 22, the insulating patterns 235c having sides vertically aligned with the storage electrodes 115 may be formed on the storage electrodes 115.

Insulating patterns having a smaller horizontal width than widths of the storage electrodes 115 may be formed.

FIGS. 23A to 23F are cross-sectional views illustrating a method of fabricating a semiconductor device in accordance with an embodiment of the inventive concept. In FIGS. 23A to 23F, reference character "G" indicates the area taken along the line VIII-VIII' in FIG. 19, and reference character "H" indicates the area taken along the line IX-IX' in FIG. 19.

Figure 23A:
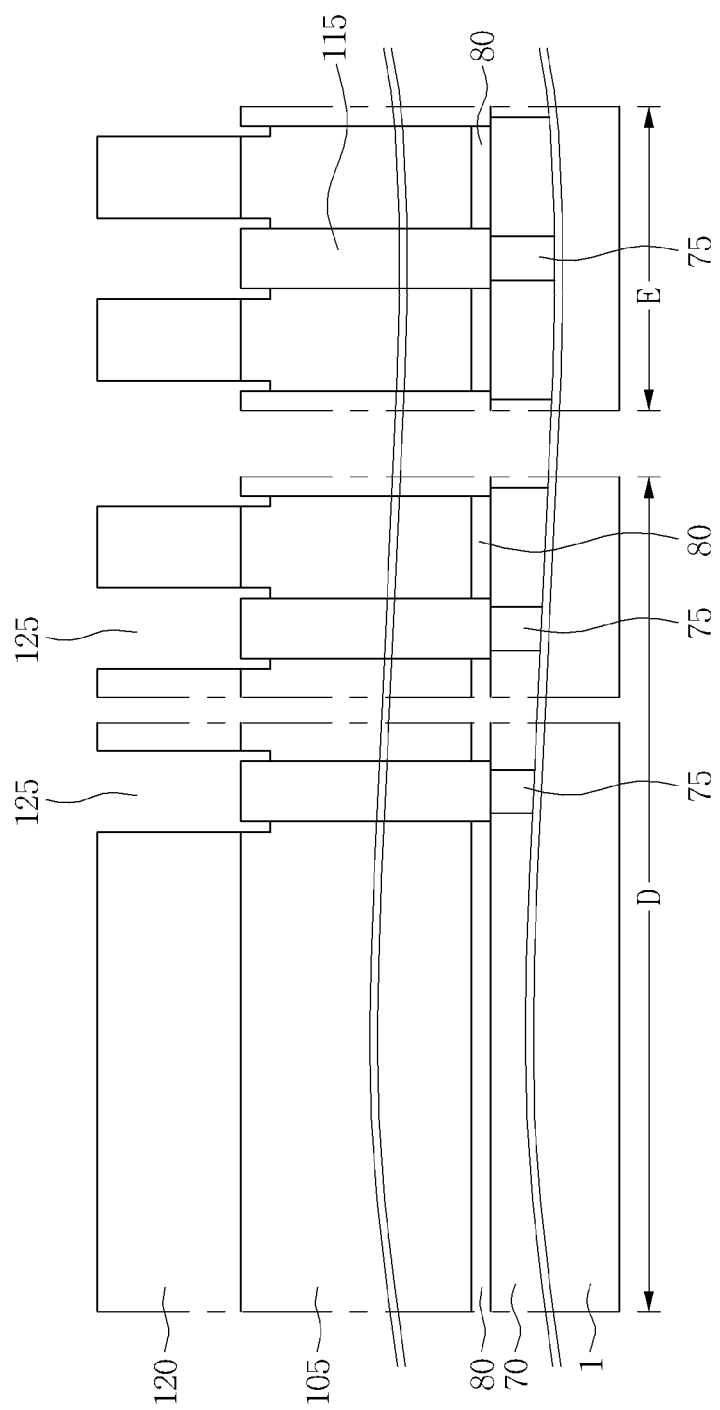

Referring to FIG. 19 and FIG. 23A, as described above in connection with FIG. 13A, a lower interlayer insulating layer 70 and plugs 75 passing through the lower interlayer insulating layer 70 may be formed on a substrate 1 having a switching device. An etch stopping layer 80 may be formed on the lower interlayer insulating layer 70. A lower molding layer 105 may be formed on the etch stopping layer 80. Storage electrodes 115 passing through the lower molding layer 105 and the etch stopping layer 80 may be formed. An upper molding layer 120 may be formed on the substrate having the storage electrodes 115. Openings 125 exposing top surfaces of the storage electrodes 115 may be formed by patterning the upper molding layer 120.

In an embodiment, as described above in connection with FIGS. 14, 15A to 15C, after forming the molding layer having storage holes, storage electrodes 115 partly filling the storage holes may be formed.

Figure 23B:
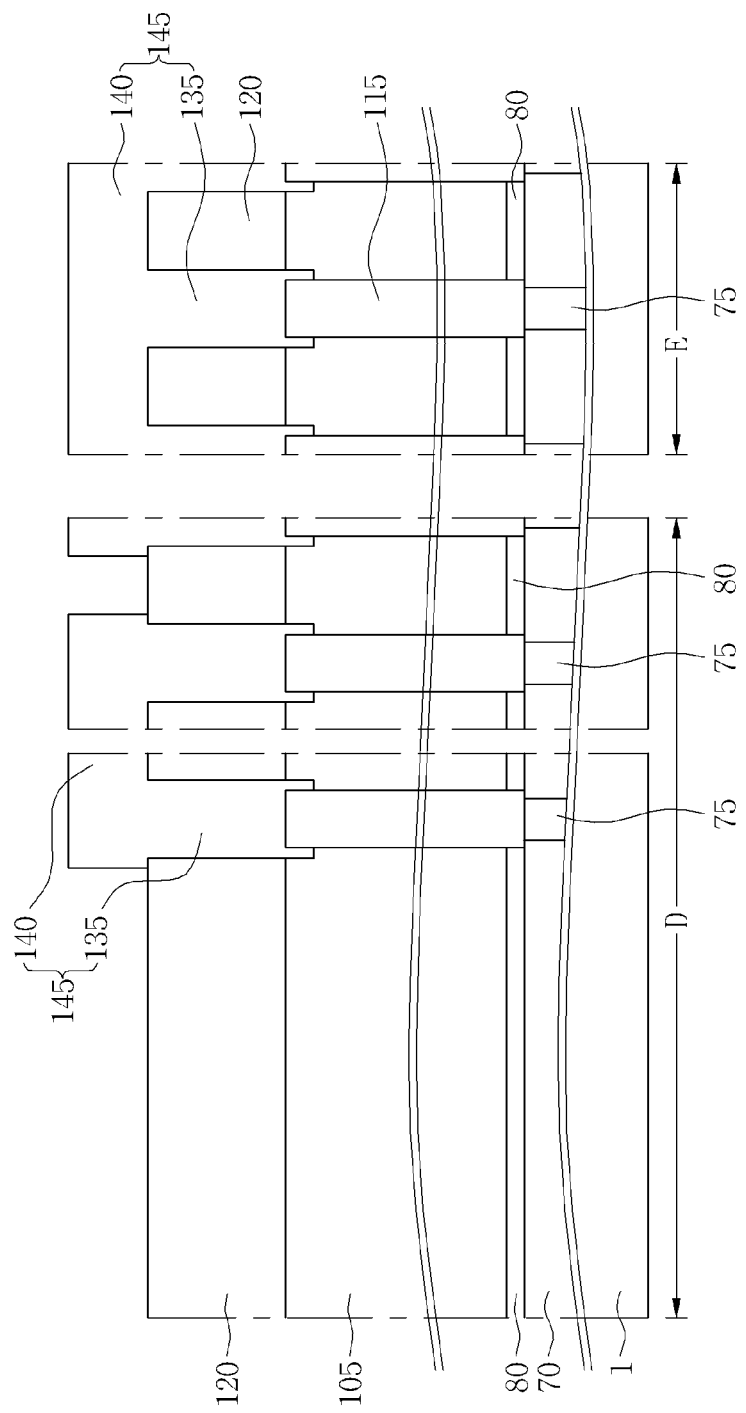

Referring to FIG. 23B, a continuous support pattern 145, which includes contact parts 135 filling the openings 125 and a connection part 140 formed on the upper molding layer 120, may be formed.

Figure 23C:
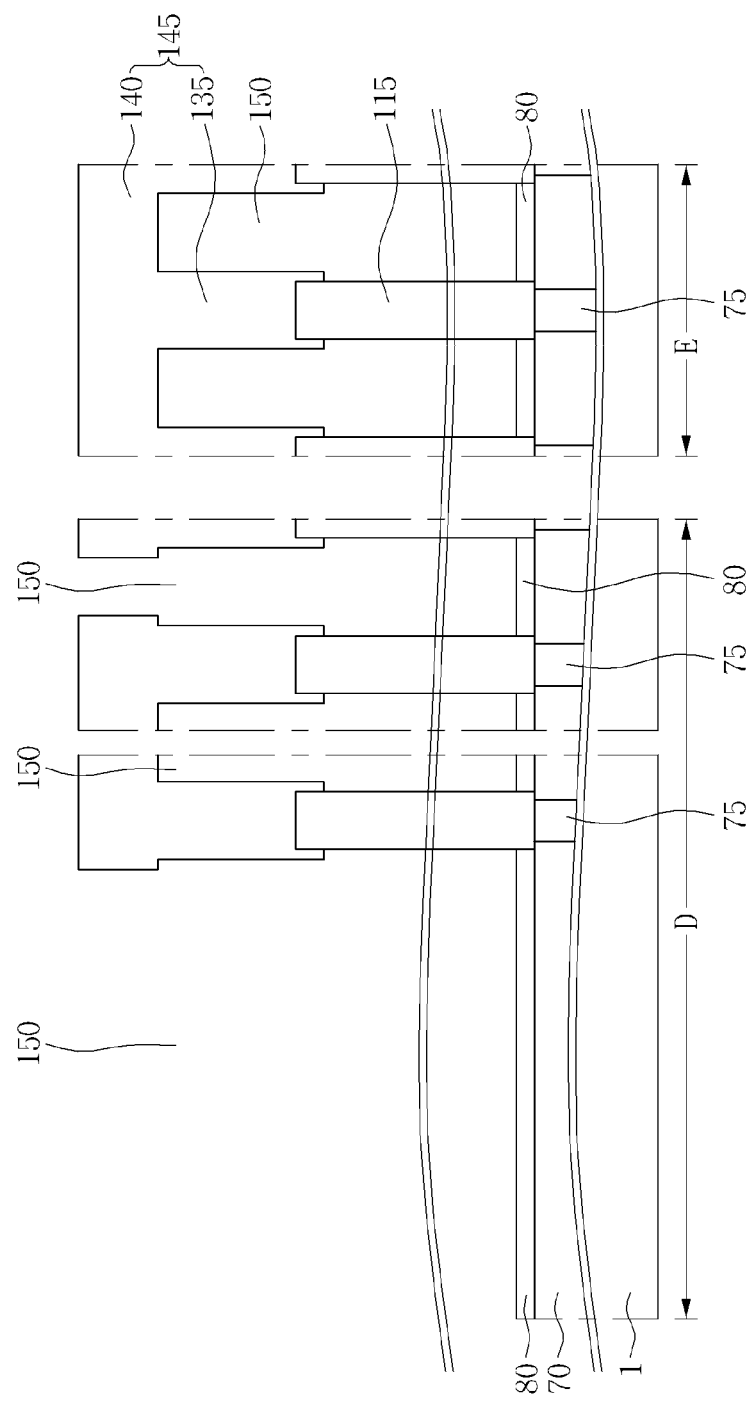

Referring to FIG. 23C, empty spaces 150 may be formed by removing the upper and lower molding layers 120 and 105. The storage electrodes 115 and the continuous support pattern 145 may be exposed by the empty spaces 150. The continuous support pattern 145 may prevent the storage electrodes 115 from collapsing.

Figure 23D:
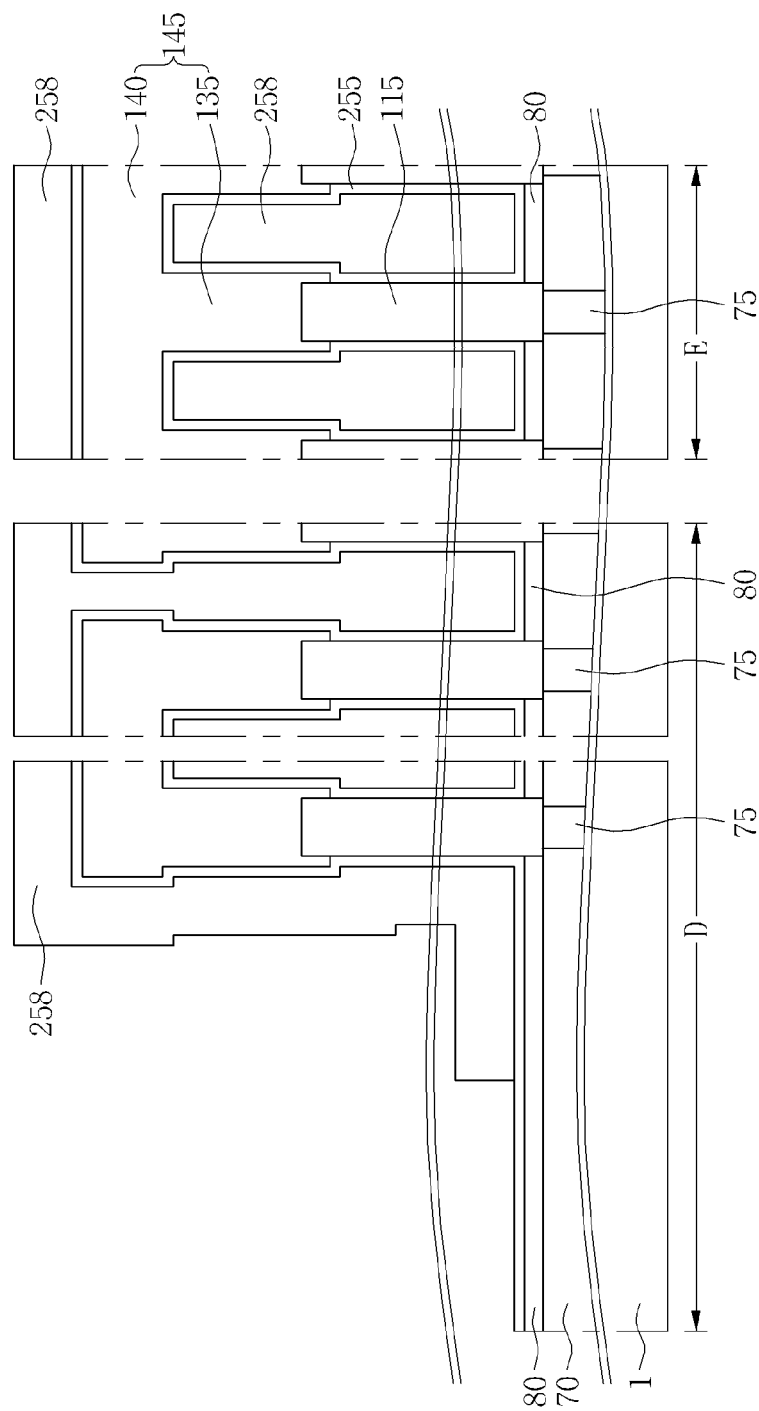

Referring to FIG. 23D, a storage dielectric layer 255 may be formed on the exposed storage electrodes 115. A lower conductive pattern 258 filling the empty spaces 150 may be formed on the substrate having the storage dielectric layer 255. The lower conductive pattern 258 may cover the storage electrodes 115 and the continuous support pattern 145.

Referring to FIG. 23E, an intermetal insulating layer 268 may be formed on the substrate having the lower conductive pattern 258. The intermetal insulating layer 268 may be formed of silicon oxide.

Figure 23F:
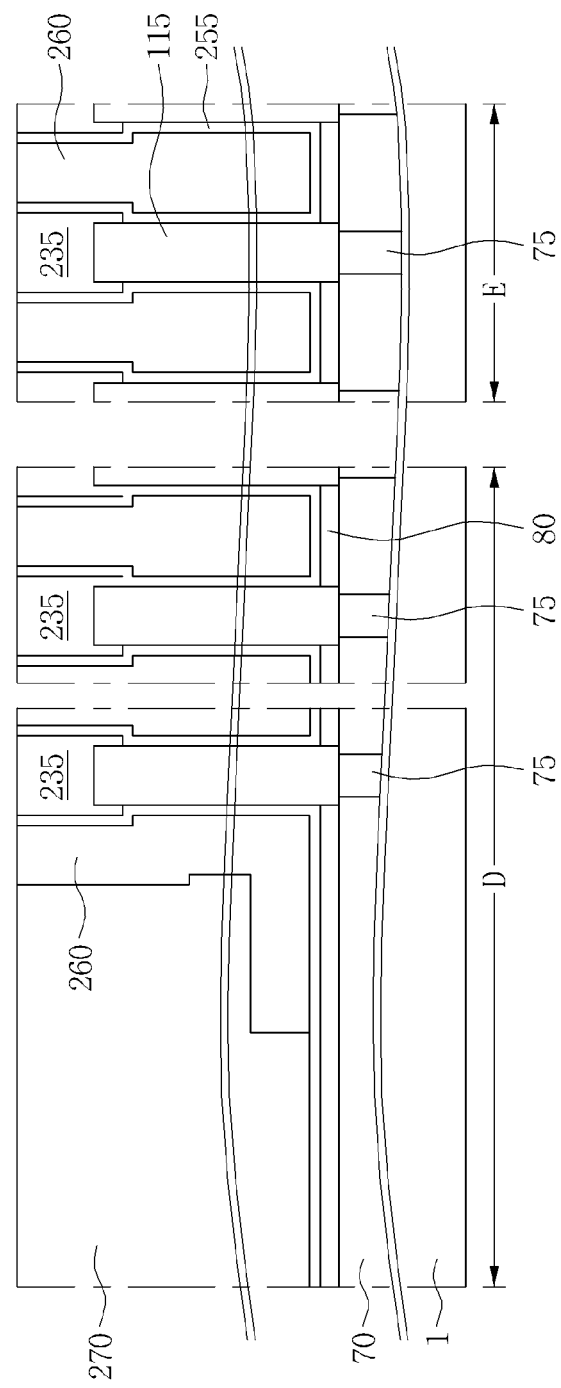

Referring to FIG. 23F, the intermetal insulating layer 268, the lower conductive pattern 258, and the continuous support pattern 145 may be planarized.

In an embodiment, the planarization process may be performed until the contact parts 135 of the continuous support pattern 145 are exposed.

In an embodiment, the planarization process may be performed until the lower conductive pattern 258 disposed at the lower portion of the connection part 140 is exposed while the contact parts 135 of the continuous support pattern 145 are exposed.

The planarization process may be performed using a CMP process and/or etchback process. The contact parts 135 remaining after the CMP process may be defined as insulating patterns 235, and the remaining lower conductive pattern 258 may be defined as lower plate electrodes 260. During the planarization process, thicknesses of the contact parts 135 may decrease. As a result, the insulating patterns 235 may be thinner than the contact parts 135.

Figure 23G:
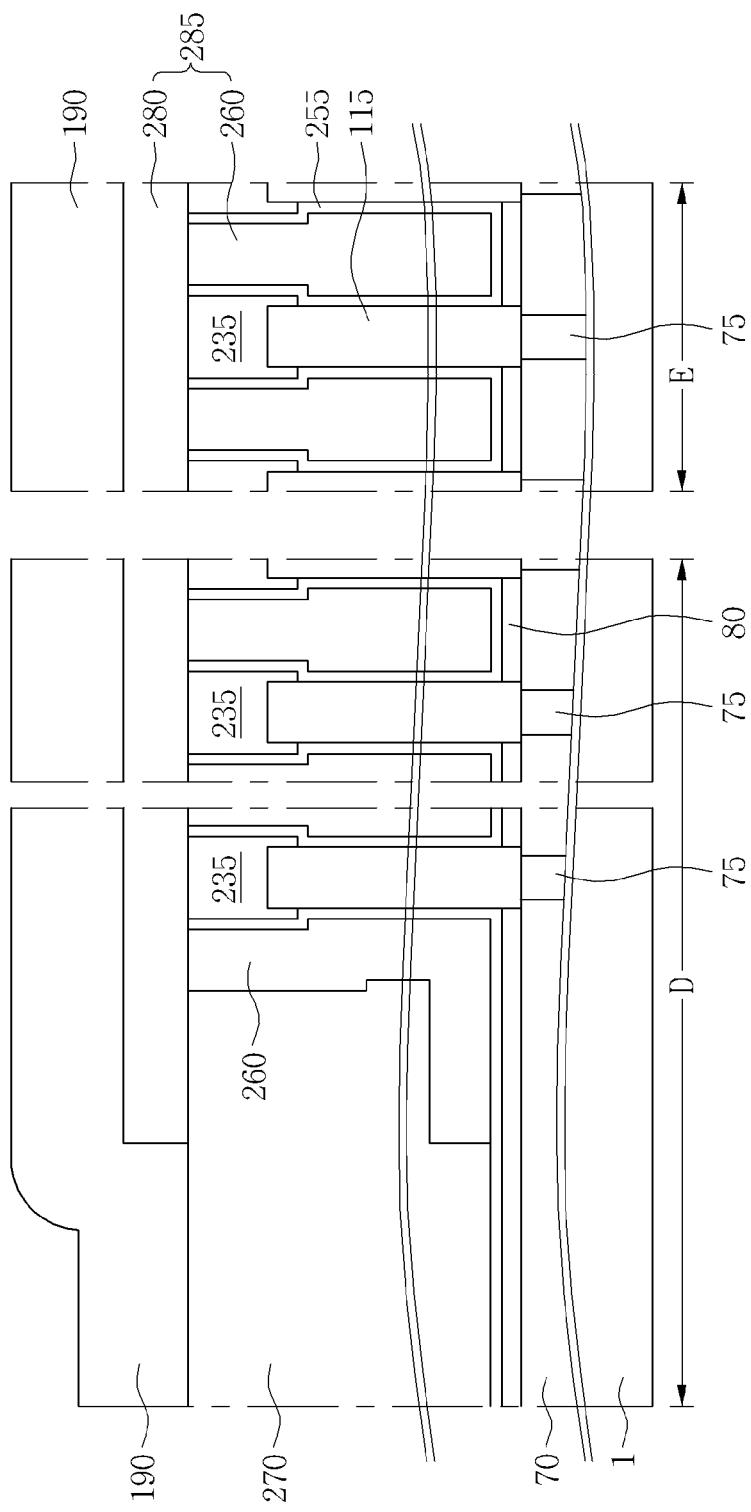

Referring to FIG. 23G, an upper plate electrode 280 may be formed on the substrate having the insulating patterns 235 and the lower plate electrodes 260. The upper plate electrode 280 may be formed of a metal having lower resistivity than the lower plate electrodes 260. The lower and upper plate electrodes 260 and 280 may be configured to form a plate electrode 285. An upper interlayer insulating layer 190 may be formed on the substrate having the upper plate electrode 280.

Referring again to FIG. 20, a plug 193 passing through the upper interlayer insulating layer 190 and a metal line 196 on the plug 193 may be formed.

Figure 24:
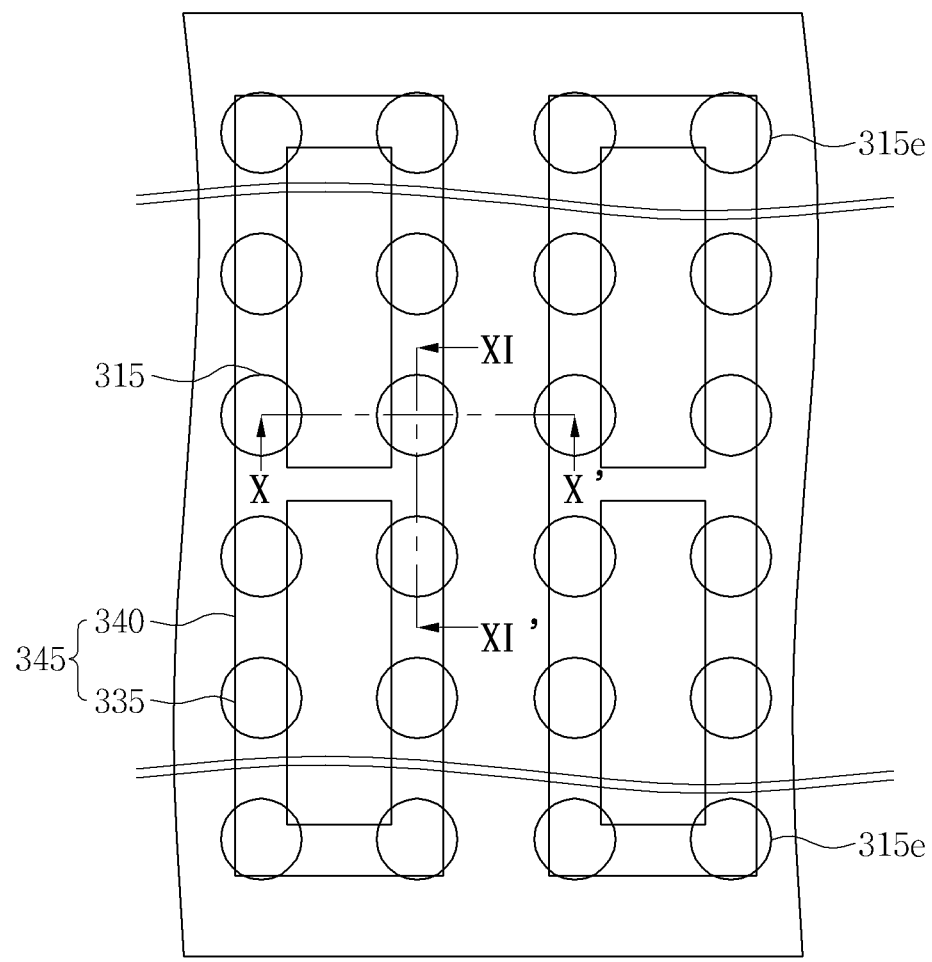
FIG. 24 is a cross-sectional view showing a semiconductor device in accordance with an embodiment of the inventive concept.

FIG. 24 is a plan view illustrating a semiconductor device in accordance with an embodiment of the inventive concept. FIGS. 25 to 28 are cross-sectional views showing semiconductor devices in accordance with embodiments of the inventive concept. In FIGS. 25 to 28, reference character "I" indicates the area taken along the line X-X' in FIG. 24, and reference character "J" indicates the area taken along the line XI-XI' in FIG. 24.

A semiconductor device in accordance with an embodiment of the inventive concept is described with reference to FIG. 24 and FIG. 25.

Figure 25:
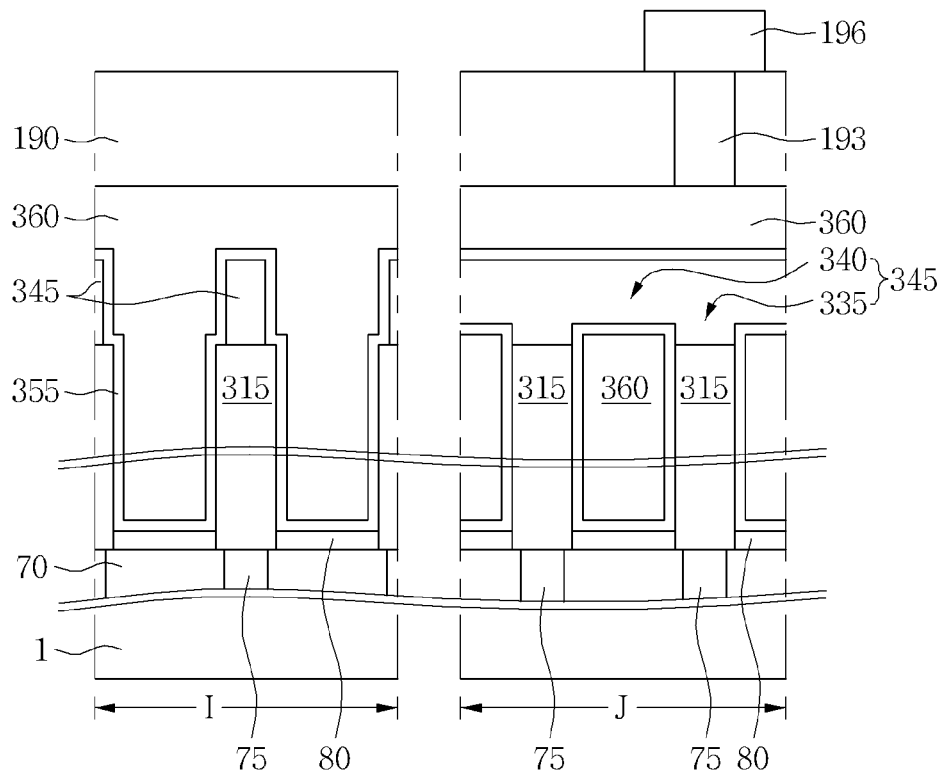
FIG. 25 is a cross-sectional view showing a semiconductor device in accordance with an embodiment of the inventive concept.

Referring to FIG. 24 and FIG. 25, a lower interlayer insulating layer 70 may be formed on a substrate 1. Conductive plugs 75 passing through the lower interlayer insulating layer 70 may be formed. An etch stopping layer 80 may be formed on the lower interlayer insulating layer 70. Storage electrodes 315 may be formed on the lower interlayer insulating layer 70.

A continuous support pattern 345 may be formed on the storage electrodes 315. The continuous support pattern 145 may be formed of an insulating material, such as silicon nitride. The continuous support pattern 345 may include contact parts 335 and a connection part 340. The contact parts 335 and the connection part 340 may be continuously connected to each other. The contact parts 335 may be directly in contact with top surfaces of the storage electrodes 315. The connection part 340 of the continuous support pattern 345 may be located at a higher level than the storage electrodes 315.

In an embodiment, the continuous support pattern 345 may include a portion having a smaller width than widths of the storage electrodes 315. For example, according to an embodiment, the contact parts 335 of the continuous support pattern 345 may have a smaller width than widths of the storage electrodes 315.

A storage dielectric layer 355 may be formed on the storage electrodes 315 and the continuous support pattern 345. The storage dielectric layer 355 may cover the storage electrodes 315 and the continuous support pattern 345. The storage dielectric layer 355 may surround sides of the storage electrodes 315, extend up to cover the continuous support pattern 345, and extend onto the etch stopping layer 80 between the storage electrodes 315.

A plate electrode 360 may be formed on the storage dielectric layer 355. An upper interlayer insulating layer 190 may be formed on the plate electrode 360. A plug 193 passing through the upper interlayer insulating layer 190 and electrically connected to the plate electrode 360 and a metal line 196 on the plug 193 may be formed.

A semiconductor device in accordance with an embodiment of the inventive concept is described with reference to FIG. 24 and FIG. 26.

Figure 26:
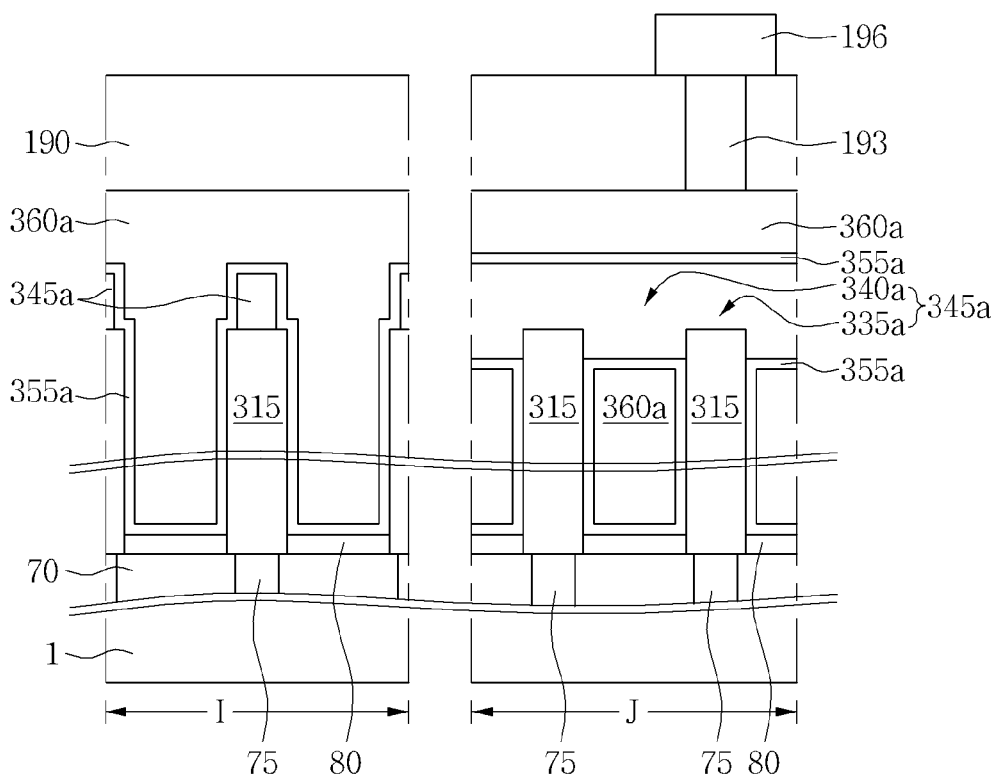
FIG. 26 is a cross-sectional view showing a semiconductor device in accordance with an embodiment of the inventive concept.

Referring to FIG. 24 and FIG. 26, a lower interlayer insulating layer 70 may be formed on a substrate 1. Conductive plugs 75 passing through the lower interlayer insulating layer 70 may be formed. Storage electrodes 315 may be formed on the lower interlayer insulating layer 70.

A continuous support pattern 345a may be formed on the storage electrodes 315. The continuous support pattern 345a may include contact parts 335a and a connection part 340a. The contact parts 335a and the connection part 340a may be continuously connected to each other without an interface. The contact parts 335a may be directly in contact with top surfaces of the storage electrodes 315. A bottom surface of the connection part 340a of the continuous support pattern 345a may be located at a lower level than the top surfaces of the storage electrodes 315.

The connection part 340a of the continuous support pattern 345a may be directly in contact with sides of upper portions of the storage electrodes 315. Accordingly, the continuous support pattern 345a may be directly in contact with the top surfaces of the storage electrodes 315 and directly in contact with the sides of the upper portions of the storage electrodes 315.

In an embodiment, the continuous support pattern 345a may include a portion having a smaller width than widths of the storage electrodes 315. For example, according to an embodiment, the contact parts 335a of the continuous support pattern 345a may have a smaller width than widths of the storage electrodes 315.

A storage dielectric layer 355a may be formed on the storage electrodes 315 and the continuous support pattern 345a. A plate electrode 360a may be formed on the storage dielectric layer 355a.

An upper interlayer insulating layer 190 may be formed on the plate electrode 360a. A plug 193 passing through the upper interlayer insulating layer 190 and electrically connected to the plate electrode 360a, and a metal line 196 on the plug 193 may be formed.

A semiconductor device in accordance with an embodiment of the inventive concept is described with reference to FIG. 24 and FIG. 27.

Figure 27:
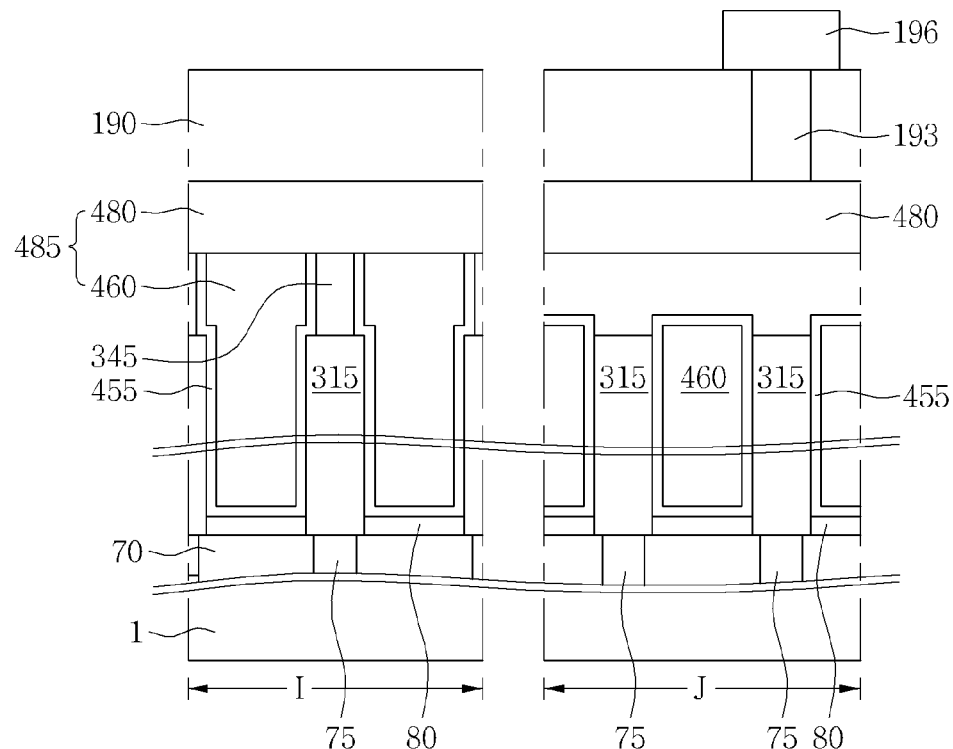
FIG. 27 is a cross-sectional view showing a semiconductor device in accordance with an embodiment of the inventive concept.

Referring to FIG. 24 and FIG. 27, as in FIG. 25, storage electrodes 315 and a continuous support pattern 345 may be formed on a substrate 1. The continuous support pattern 345 may be disposed on the storage electrodes 315. The continuous support pattern 345, as described above in connection with FIG. 25, may include contact parts 335 and a connection part 340. The contact parts 335 may be directly in contact with top surfaces of the storage electrodes 315. The connection part 340 of the continuous support pattern 345 may be located at a higher level than the storage electrodes 315. The continuous support pattern 345 may include a portion having a smaller width than widths of the storage electrodes 315.

Lower plate electrodes 460 surrounding sides of the storage electrodes 315 and the continuous support pattern 345 may be formed.

A storage dielectric layer 455 interposed between the lower plate electrode 460 and the storage electrodes 315, between the lower plate electrode 460 and the continuous support pattern 345, and between the lower plate electrode 460 and the substrate 1, may be formed.

An upper plate electrode 480 may be formed to cover the lower plate electrode 460 and the continuous support pattern 345. The upper plate electrode 480 may include a material having lower resistivity than the lower plate electrode 460.

The upper plate electrode 480 may be directly in contact with the lower plate electrode 460 and directly in contact with a top surface of the continuous support pattern 345.

The lower and upper plate electrodes 460 and 480 may be configured to form a plate electrode 485.

An upper interlayer insulating layer 190 may be formed on the plate electrode 485. A plug 193 passing through the upper interlayer insulating layer 190 and electrically connected to the plate electrode 485, and a metal line 196 on the plug 193 may be formed.

A semiconductor device in accordance with an embodiment of the inventive concept is described with reference to FIG. 24 and FIG. 28.

Figure 28:
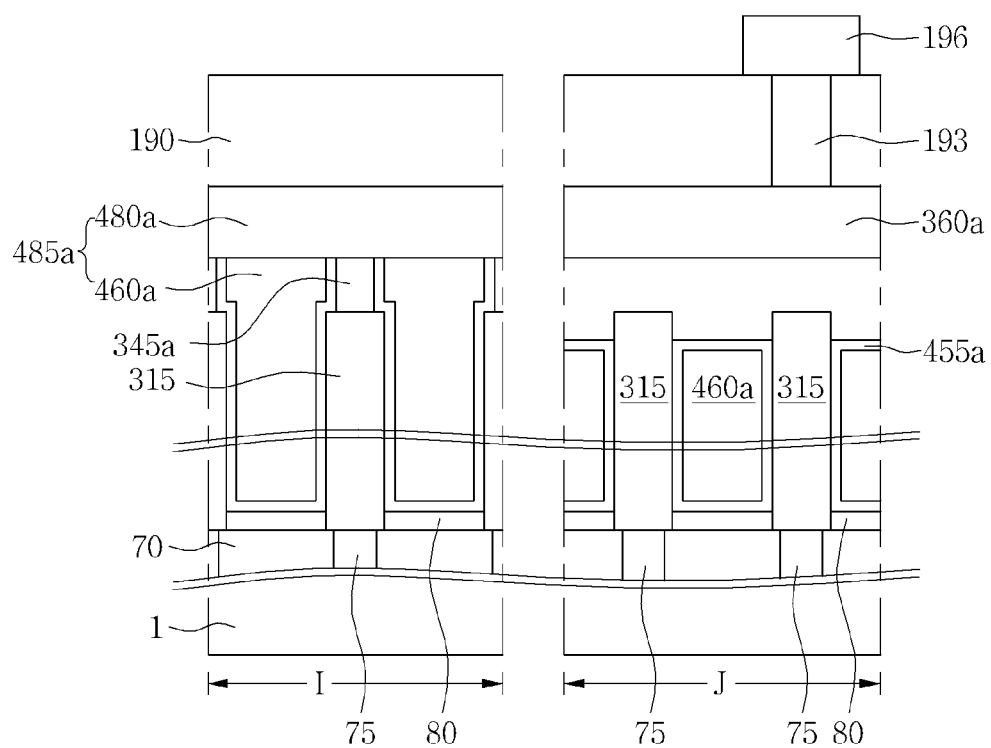
FIG. 28 is a cross-sectional view showing a semiconductor device in accordance with an embodiment of the inventive concept.

Referring to FIG. 24 and FIG. 28, as shown in FIG. 26, the storage electrodes 315 and the continuous support pattern 345a may be formed on a substrate 1. The continuous support pattern 345a may be disposed on the storage electrodes 315. The continuous support pattern 345a, as described above in connection with FIG. 26, may include contact parts 335a and a connection part 340a. The contact parts 335a may be directly in contact with the top surfaces of the storage electrodes 315. A bottom surface of the connection part 340a of the continuous support pattern 345a may be located at a lower level than the top surfaces of the storage electrodes 315. The continuous support pattern 345a may be in contact with the top surfaces of the storage electrodes 315 and side surfaces of upper portions of the storage electrodes 315.

A lower plate electrode 460a may be formed to surround the sides of the storage electrodes 315 and the continuous support pattern 345a.

A storage dielectric layer 455a interposed between the lower plate electrode 460a and the storage electrodes 315, between the lower plate electrode 460a and the continuous support pattern 345, and between the lower plate electrode 460 and the substrate 1 may be formed.

An upper plate electrode 480a may be formed to cover the lower plate electrode 460a and the continuous support pattern 345a. The upper plate electrode 480a may include a material having low resistivity compared to the lower plate electrode 460a. The upper plate electrode 480a may be directly in contact with the lower plate electrode 460a and the top surface of the continuous support pattern 345a. The lower and upper plate electrodes 460a and 480a may configure a plate electrode 485a.

An upper interlayer insulating layer 190 may be formed on the plate electrode 485a. A plug 193 passing through the upper interlayer insulating layer 190 and electrically connected to the plate electrode 485a may be formed, and a metal line 196 may be formed on the plug 193.

Figure 29:
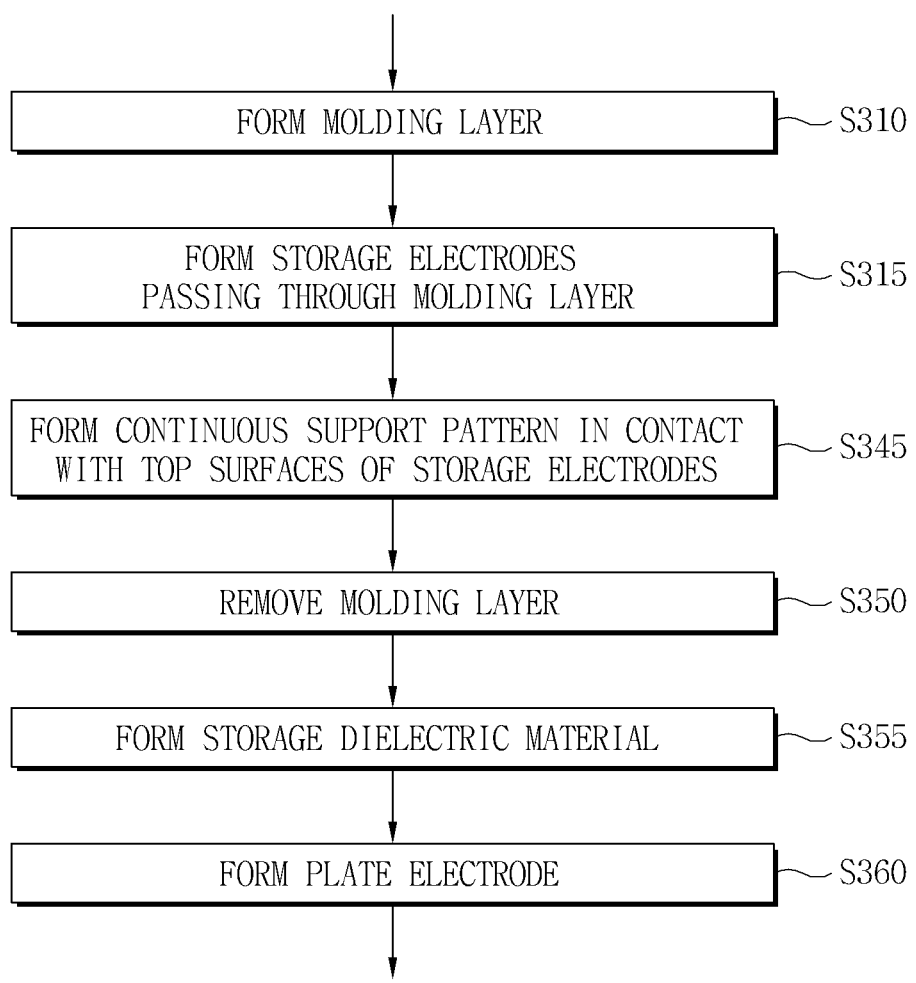
FIG. 29 is a flowchart illustrating a method of fabricating a semiconductor device in accordance with an embodiment of the inventive concept.

A method of fabricating a semiconductor device in accordance with an embodiment of the inventive concept is described with reference to FIGS. 29 and 30A to 30D. FIG. 29 is a flowchart illustrating a method of fabricating a semiconductor device according to an embodiment of the inventive concept, and FIGS. 30A to 30D are cross-sectional views illustrating a method of fabricating a semiconductor device in accordance with the embodiment of the inventive concept. In FIGS. 30A to 30D, reference character "I" indicates the area taken along the line X-X' in FIG. 24, and reference character "J" indicates the area taken along the line XI-XI' in FIG. 24.

Figure 30A:
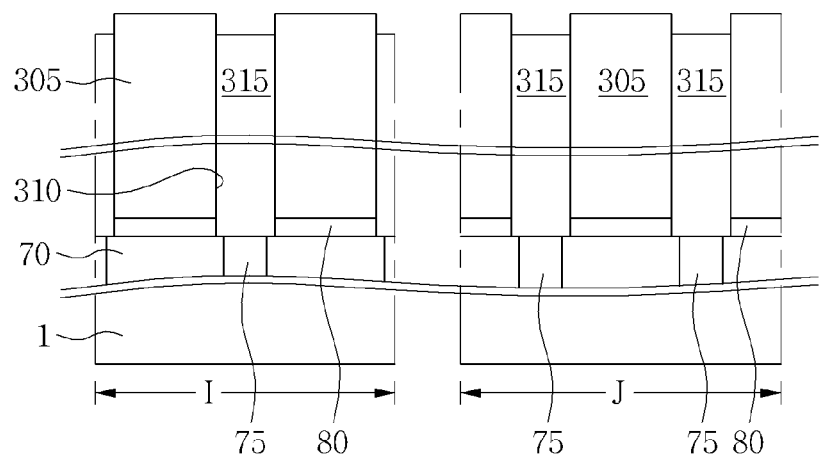
FIGS. 30A to 30D are cross-sectional views illustrating a method of fabricating a semiconductor device in accordance with an embodiment of the inventive concept.

Referring to FIG. 29 and FIG. 30A, as described above in connection with FIG. 13A, a lower interlayer insulating layer 70 may be formed on a substrate 1 having a switching device, and plugs 75 passing through the lower interlayer insulating layer 70 may be formed. An etch stopping layer 80 may be formed on the lower interlayer insulating layer 70.

A molding layer 305 may be formed on the etch stopping layer 80 (S310). The molding layer 305 may be formed of a material having etching selectivity with respect to the etch stopping layer 80. For example, according to an embodiment, the etch stopping layer 80 may be formed of silicon nitride, and the molding layer 305 may be formed of silicon oxide.

Storage holes 310 passing through the molding layer 305 and the etch stopping layer 80 may be formed. A plurality of storage electrodes 315 passing through the molding layer 305 may be formed (S315). The formation of the storage electrodes 315 may include forming a conductive material layer on the substrate having the storage holes 310 and planarizing the conductive material layer until the molding layer 305 is exposed. The conductive material layer may remain in the storage holes 310 to form storage electrodes 315. The planarization of the conductive material layer may be performed using an etchback process. For example, according to an embodiment, the conductive material layer may be etched such that the conductive material layer remains in the storage holes 310. The storage electrodes 315 may be formed to partially fill the storage holes 310. The storage electrodes 315 may be electrically connected to the plugs 75.

Figure 30B:
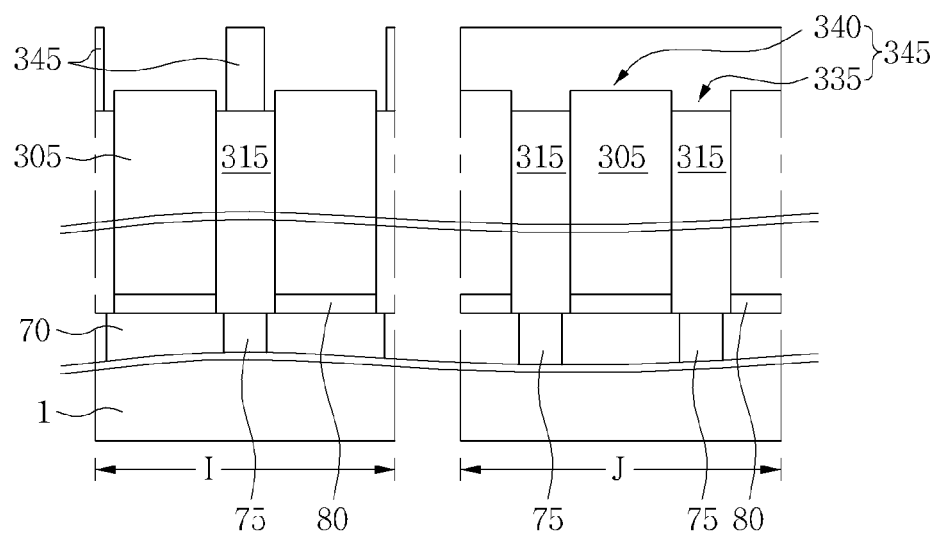

Referring to FIG. 29 and FIG. 30B, a continuous support pattern 345 in contact with top surfaces of the storage electrodes 315 may be formed (S345). The formation of the continuous support pattern 345 may include forming an insulating material layer on the substrate having the storage electrodes 315 and patterning the insulating material layer. The continuous support pattern 345 may be formed of silicon nitride. The continuous support pattern 345 may be directly in contact with top surfaces of the storage electrodes 315 and formed on the molding layer 305.

Figure 30C:
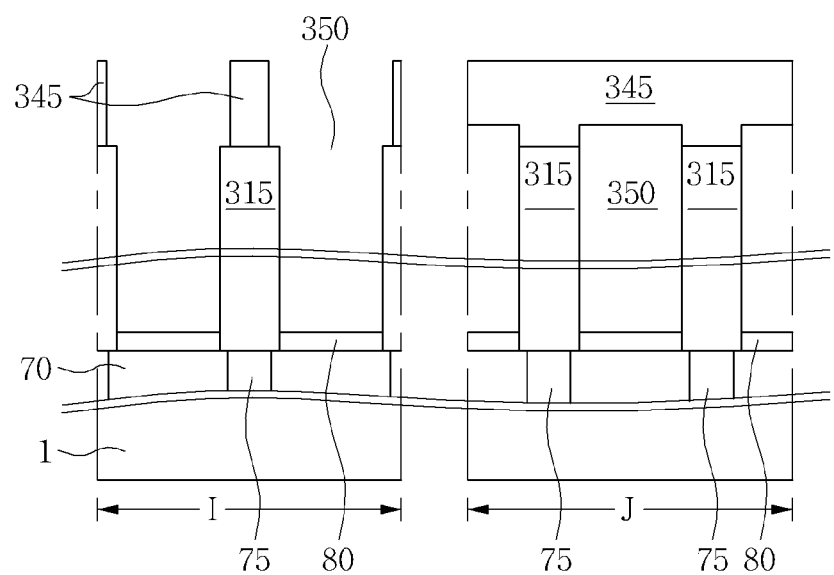

Referring to FIG. 29 and FIG. 30C, the molding layer 305 may be selectively removed using an etching process (S350). An empty space 350 may be formed as a result of the removal of the molding layer 305. The storage electrodes 315 may be exposed by the empty space 350.

Figure 30D:
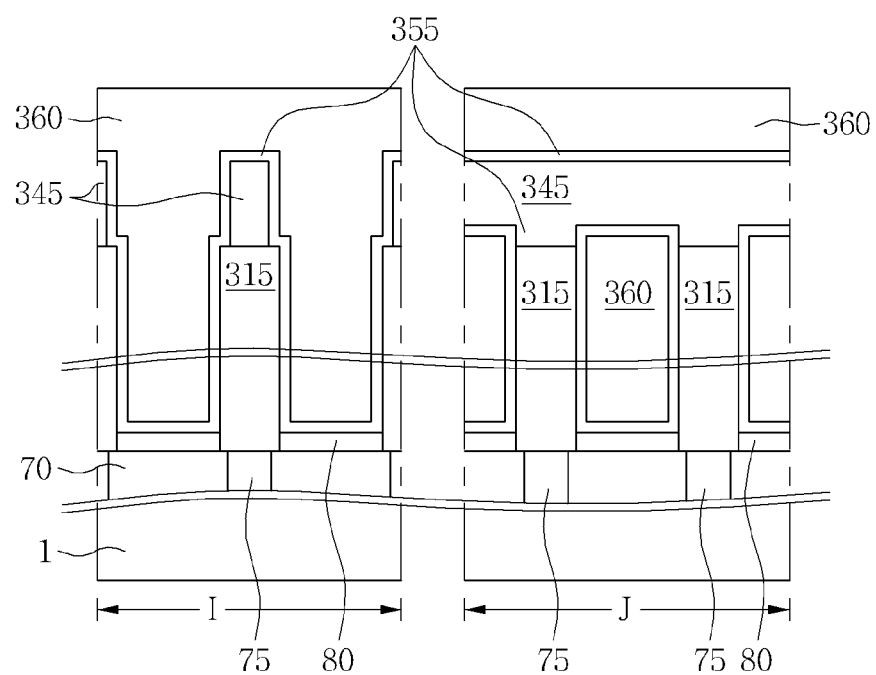

Referring to FIG. 29 and FIG. 30D, a storage dielectric layer 355 may be conformally formed on the substrate having the exposed storage electrodes 315 (S355). A plate electrode 360 filling the empty space 350 may be formed on the storage dielectric layer 355 (S360).

Referring again to FIG. 25, an upper interlayer insulating layer 190 may be formed on the substrate having the plate electrode 360, a plug 193 passing through the upper interlayer insulating layer 190 may be formed, and a metal line 196 may be formed on the plug 193.

A method of fabricating a semiconductor device in accordance with an embodiment of the inventive concept is described with reference to FIGS. 31 and 32A to 32E. FIG. 31 and FIGS. 32A to 32E are a plan view and cross-sectional views illustrating a method of fabricating a semiconductor device in accordance with an embodiment of the inventive concept. In FIGS. 32A to 32E, reference character "I" indicates the area taken along the line X-X' in FIG. 24, reference character "J" indicates the area taken along the line XI-XI' in FIG. 24.

Figure 31:
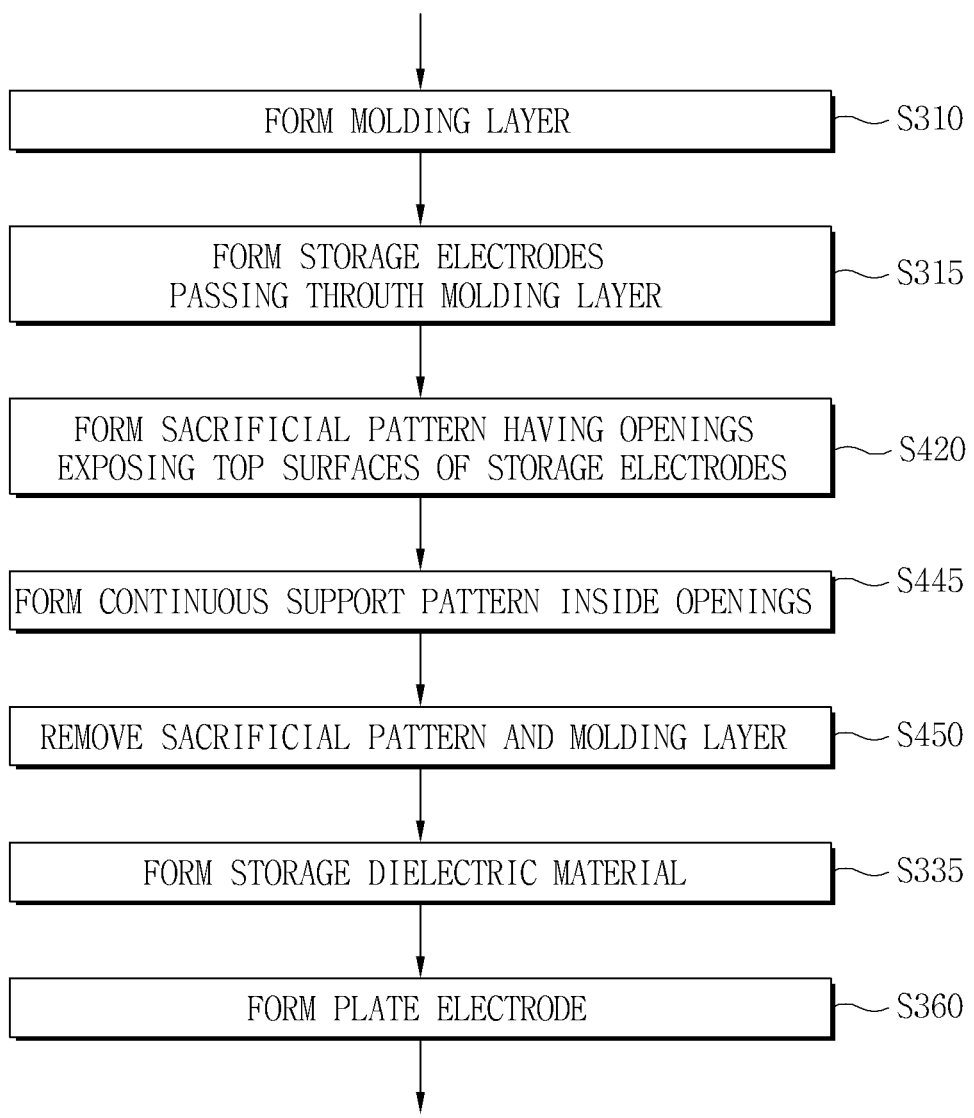
FIG. 31 is a flowchart illustrating a method of fabricating a semiconductor device in accordance with an embodiment of the inventive concept.
Figure 32A:
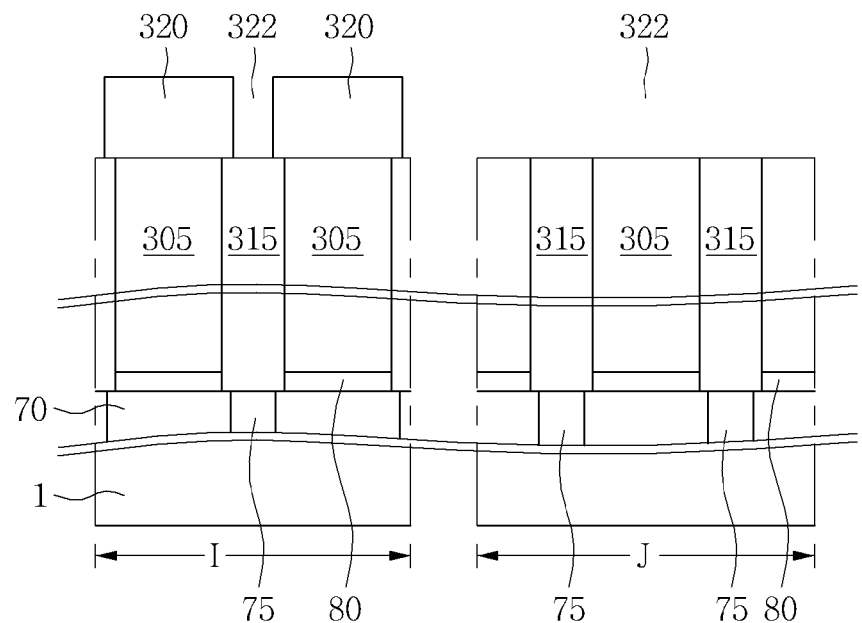
FIGS. 32A to 32E are cross-sectional views illustrating a method of fabricating a semiconductor device in accordance with an embodiment of the inventive concept.

Referring to FIG. 31 and FIG. 32A, as described above in connection with FIG. 13A, a lower interlayer insulating layer 70 may be formed on a substrate 1 having a switching device, and plugs 75 passing through the lower interlayer insulating layer 70 may be formed. An etch stopping layer 80 may be formed on the lower interlayer insulating layer 70.

A molding layer 305 may be formed on the etch stopping layer 80 (S310). The molding layer 305 may be formed of a material having etching selectivity with respect to the etch stopping layer 80. For example, according to an embodiment, the etch stopping layer 80 may be formed of silicon nitride, and the molding layer 305 may be formed of silicon oxide.

A plurality of storage electrodes 315 passing through the molding layer 305 and etch stopping layer 80 may be formed (S315).

A sacrificial pattern 320 having openings 322 exposing the top surfaces of the storage electrodes 315 may be formed on the molding layer 305 (S420). The sacrificial pattern 320 may be formed of silicon oxide.

Figure 32B:
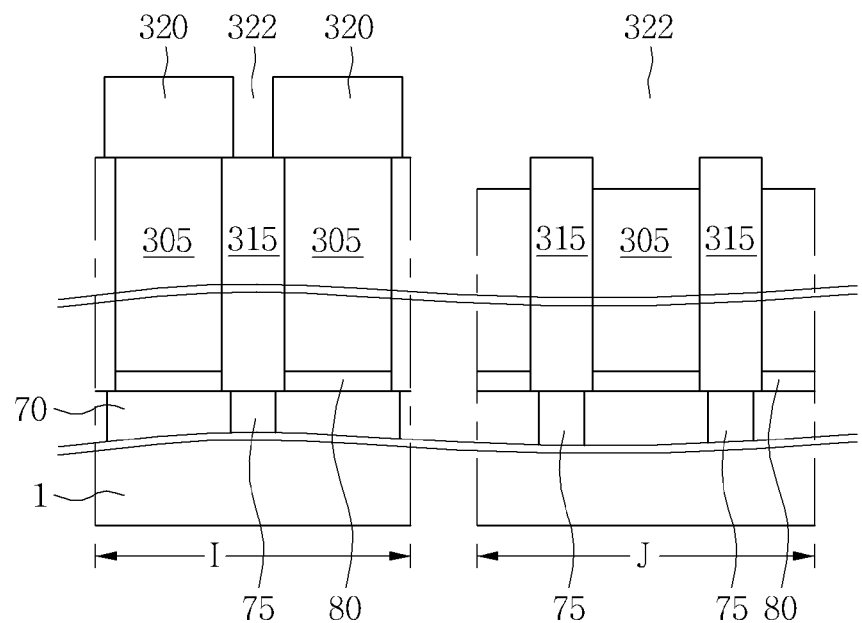

Referring to FIG. 32B, the molding layer 305 exposed by the openings 322 may be partially etched. Accordingly, upper sides of the storage electrodes 315 may be exposed by the openings 322.

Figure 32C:
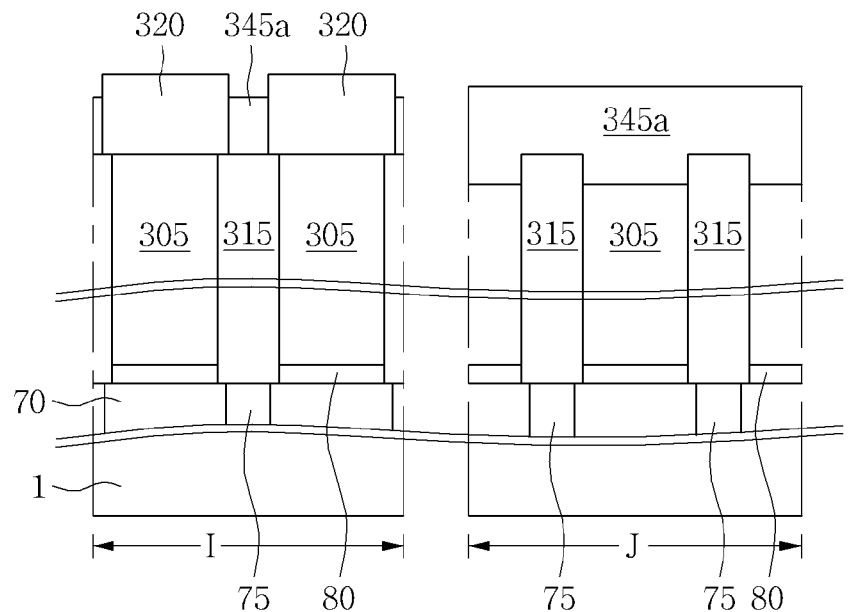

Referring to FIGS. 31 and 32C, a continuous support pattern 345*a* filling the openings 322 may be formed (S445). The continuous support pattern 345*a* may be formed of an insulating material such as silicon nitride. The continuous support pattern 345*a* may be directly in contact with the top and side surfaces of the storage electrodes 315 exposed by the openings 322.

Figure 32D:
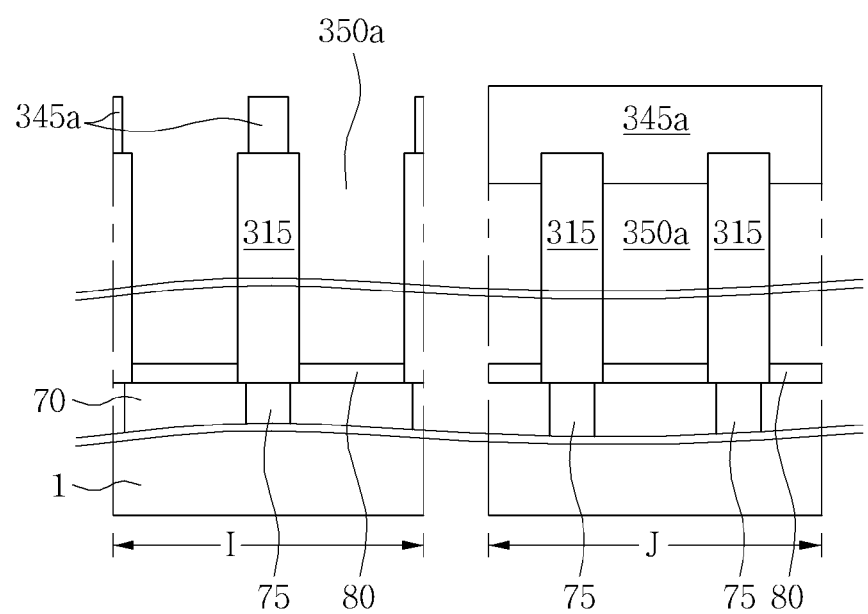

Referring to FIG. 31 and FIG. 32D, the sacrificial pattern 320 and the molding layer 305 may be selectively removed using an etching process (S450). The sacrificial pattern 320 and the molding layer 305 may be removed to form an empty space 350*a*.

Figure 32E:
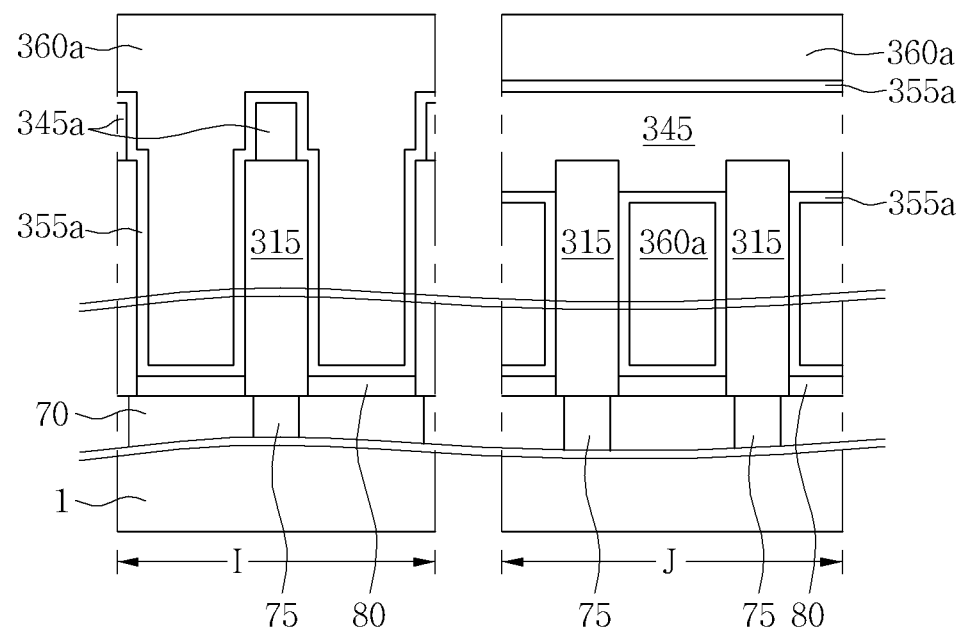

Referring to FIG. 31 and FIG. 32E, a storage dielectric layer 355*a* may be formed (S355). The storage dielectric layer 355*a* may be conformally formed on the substrate having the empty space 350*a*. A plate electrode 360*a* may be formed (S360). The plate electrode 360*a* may fill the empty space 350*a* on the storage dielectric layer 355*a*.

Figure 33A:
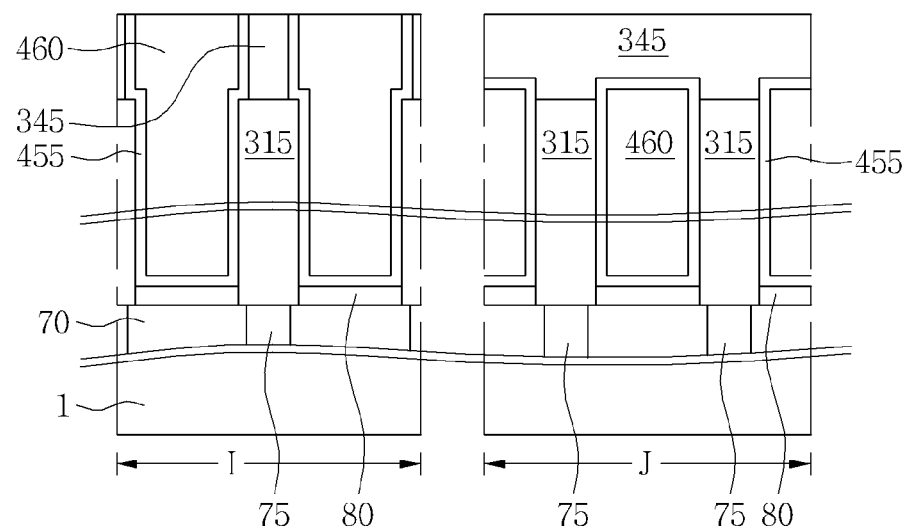
FIGS. 33A and 33B are cross-sectional views illustrating a method of fabricating a semiconductor device in accordance with an embodiment of the inventive concept.
Figure 33B:
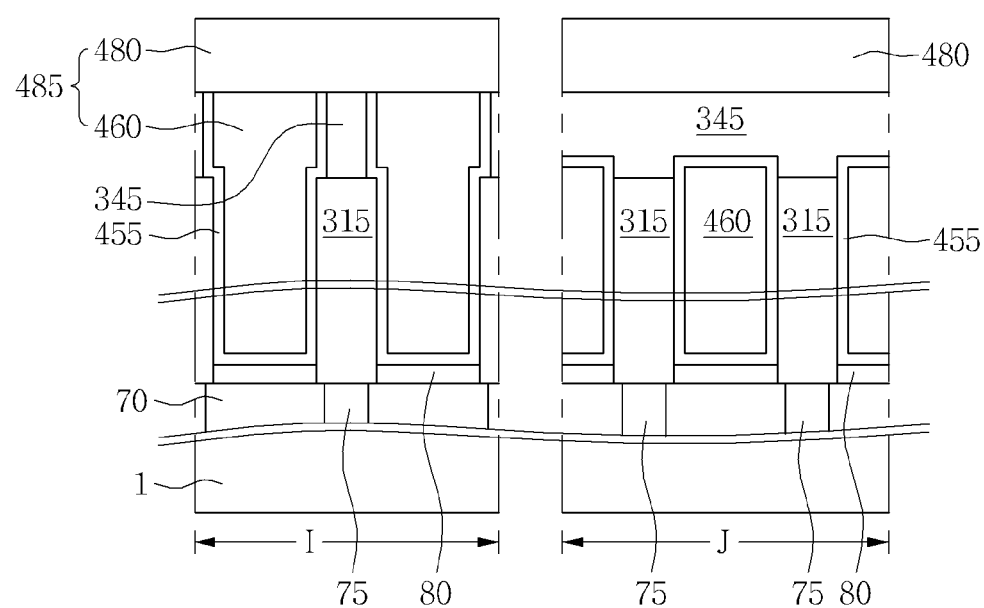

A method of fabricating a semiconductor device in accordance with the embodiment of the inventive concept is described with reference to FIGS. 33A and 33B. FIGS. 33A and 33B are cross-sectional views illustrating a method of fabricating a semiconductor device in accordance with an embodiment of the inventive concept. In FIGS. 33A and 33B, reference character "I" indicates the area taken along the line X-X' in FIG. 24, reference character "J" indicates the area taken along the line XI-XI' in FIG. 24.

Referring to FIG. 33A, a substrate 1, as described above in connection with FIG. 30D, may be prepared. For example, according to an embodiment, a plurality of storage electrodes 315 on the substrate 1, a continuous support pattern 345 on the storage electrodes 315, a storage dielectric layer 355, and a plate electrode 360 may be formed by the same or substantially the same method as described above in connection with FIGS. 30A to 30D.

As shown in FIG. 23E, an intermetal insulating layer may be formed on the substrate having the plate electrode 360. Then, the intermetal insulating layer may be planarized. During the planarization process, a top surface of the continuous support pattern 345 may be exposed. The remaining plate electrode may be defined as a lower plate electrode 460.

The storage dielectric layer 355 disposed on the top surface of the continuous support pattern 345 may be removed during the planarization process. Therefore, the remaining storage dielectric layer 455 may be interposed between the lower plate electrode 460 and the storage electrodes 315, between the lower plate electrode 460 and the continuous support pattern 345, and between the lower plate electrode 460 and the substrate 1

The lower plate electrode 460 may have a top surface located at the same or substantially the same level as the top surface of the continuous support pattern 345.

Referring to FIG. 33B, an upper plate electrode 480 directly in contact with top surfaces of the lower plate electrode 460 and the continuous support pattern 345 may be formed. The upper plate electrode 480 may include a material having low resistivity compared to the lower plate electrode 460. The lower and upper plate electrodes 460 and 480 may configure a plate electrode 485.

Referring again to FIG. 27, an upper interlayer insulating layer 190 may be formed on the substrate having the plate electrode 485. A plug 193 passing through the upper interlayer insulating layer 190 and a metal line 196 on the plug 193 may be formed.

Figure 34A:
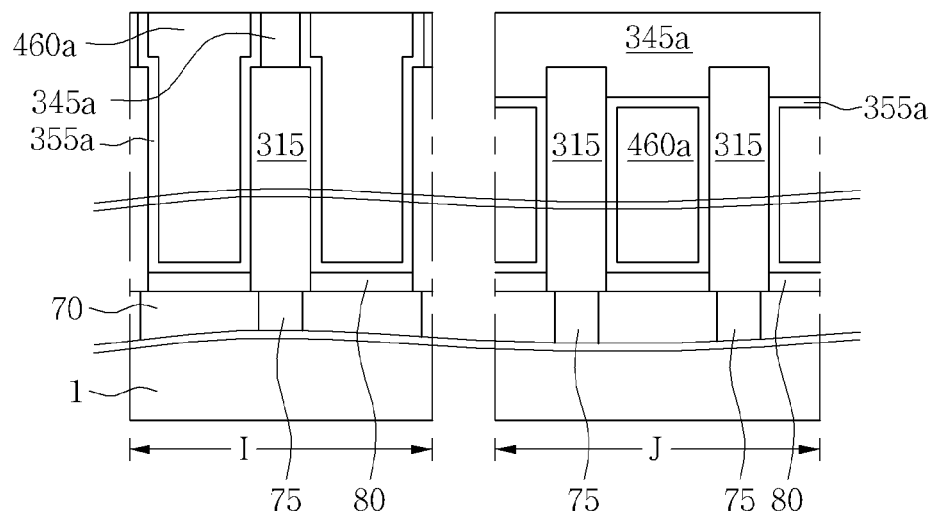
FIGS. 34A and 34B are cross-sectional views illustrating a method of fabricating a semiconductor device in accordance with an embodiment of the inventive concept.
Figure 34B:
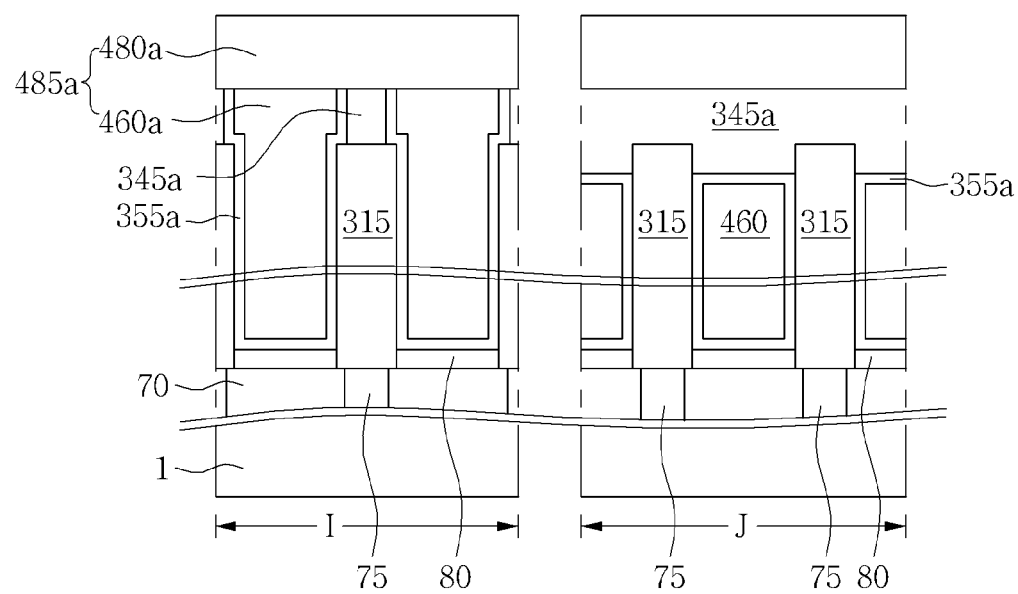

Next, a method of fabricating a semiconductor device in accordance with an embodiment of the inventive concept is described with reference to FIGS. 34A and 34B. FIGS. 34A and 34B are cross-sectional views illustrating a method of fabricating a semiconductor device in accordance with an embodiment of the inventive concept. In FIGS. 34A and 34B, reference character "I" indicates the area taken along the line X-X' in FIG. 24, and reference character "J" indicates the area taken along the line XI-XI' in FIG. 24.

Referring to FIG. 34A, a substrate, as described above in connection with FIG. 32E, may be prepared. For example, according to an embodiment, a plurality of storage electrodes 315 on the substrate 1, a continuous support pattern 345*a* on the storage electrodes 315, a storage dielectric layer 355*a*, and a plate electrode 360*a* may be sequentially formed by the same or substantially the same method as described above in connection with FIGS. 32A to 32E.

As shown in FIG. 23E, an intermetal insulating layer may be formed on the substrate having the plate electrode 360*a*. Then, the intermetal insulating layer may be planarized. During the planarization process, a top surface of the continuous support pattern 345*a* may be exposed. The remaining plate electrode may be defined as a lower plate electrode 460*a*.

The storage dielectric layer 355*a* disposed on the top surface of the continuous support pattern 345*a* may be removed during the planarization process. Therefore, the remaining storage dielectric layer 355*a* may be interposed between the lower plate electrode 460*a* and the storage electrodes 315, between the lower plate electrode 460*a* and the continuous support pattern 345*a*, and between the lower plate electrode 460*a* and the substrate 1.

The lower plate electrode 460a may have a top surface located at the same or substantially the same level as the top surface of the continuous support pattern 345a.

Referring to FIG. 34B, an upper plate electrode 480a directly in contact with the top surfaces of the lower plate electrode 460a and the continuous support pattern 345a may be formed. The upper plate electrode 480a may include a material having low resistivity compared to the lower plate electrode 460a.

Referring again to FIG. 28, an upper interlayer insulating layer 190 may be formed on the substrate having the plate electrode 485a. A plug 193 passing through the upper interlayer insulating layer 190 and a metal line 196 on the plug 193 may be formed.

Semiconductor devices in accordance with embodiments of the inventive concept is described with reference to FIGS. 35 to 41. FIG. 35 and FIGS. 36 to 41 are a plan view and cross-sectional views illustrating semiconductor devices in accordance with embodiments of the inventive concept. In FIGS. 36 to 41, reference character "K" indicates the area taken along the line XII-XII' in FIG. 35, reference character "L" indicates the area taken along the line XIII-XIII' in FIG. 35.

A semiconductor device in accordance with an embodiment of the inventive concept is described with reference to FIGS. 35 and 36.

Figure 35:
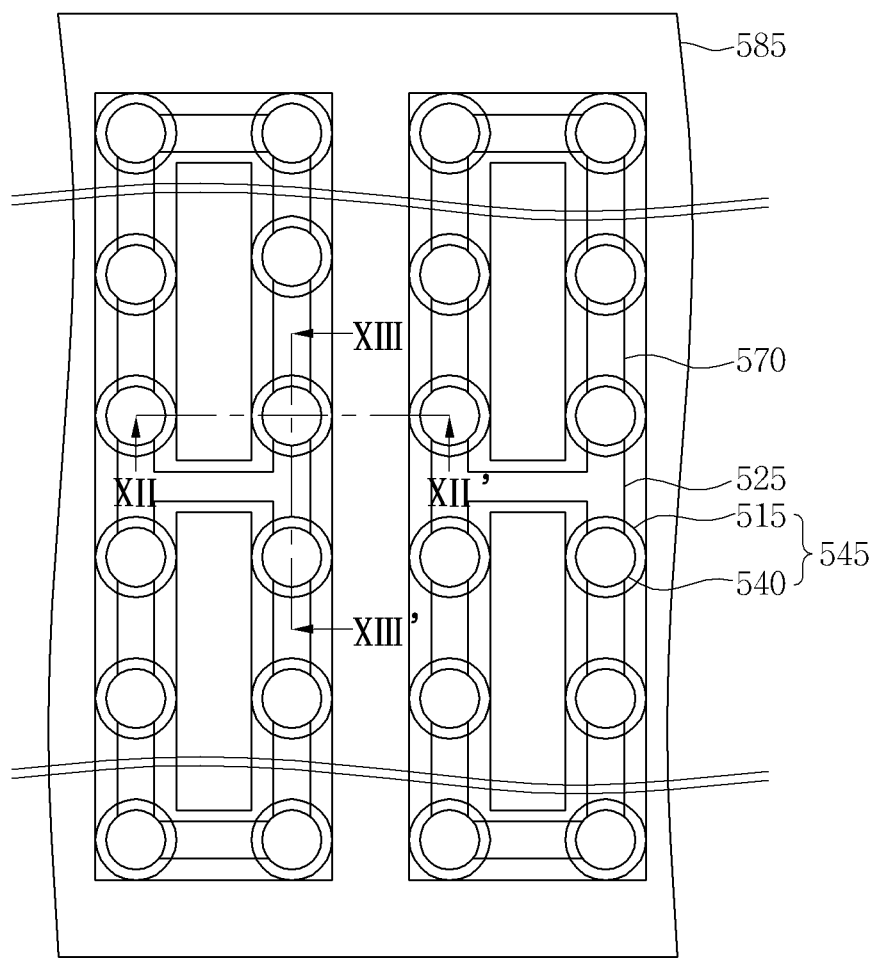
FIG. 35 is a plan view showing a semiconductor device in accordance with an embodiment of the inventive concept.
Figure 36:
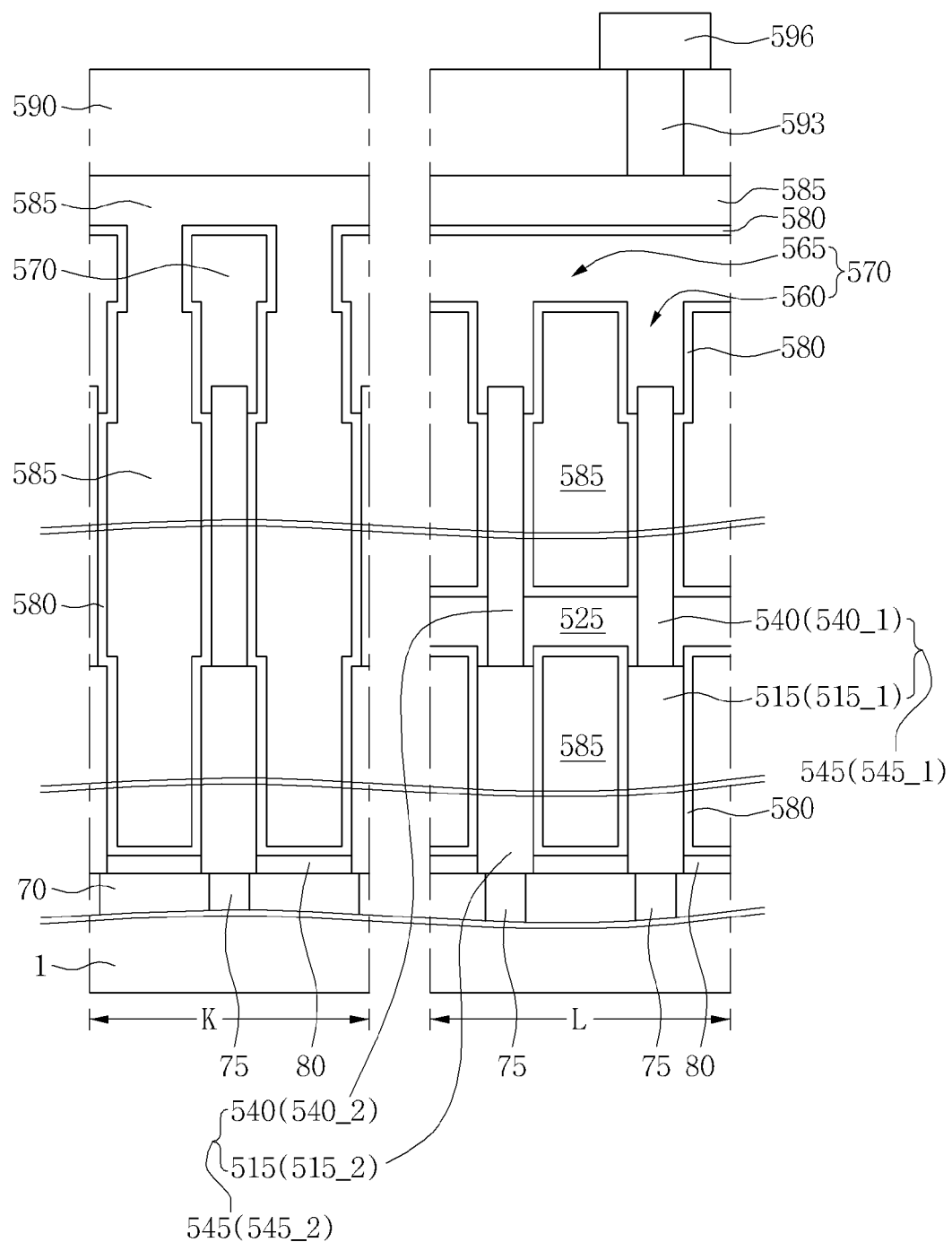
FIG. 36 is a cross-sectional view showing a semiconductor device in accordance with an embodiment of the inventive concept.

Referring to FIG. 35 and FIG. 36, a lower interlayer insulating layer 70 may be formed on a substrate 1. Conductive plugs 75 passing through the lower interlayer insulating layer 70 may be formed. An etch stopping layer 80 may be formed on the lower interlayer insulating layer 70.

Storage electrodes 545 spaced apart from each other may be formed on the lower interlayer insulating layer 70. The storage electrodes 545 may pass through the etch stopping layer 80 to be electrically connected to the conductive plugs 75.

A continuous support pattern 570 may be formed on the storage electrodes 545. The continuous support pattern 570 may be formed of an insulating material, such as silicon nitride. The continuous support pattern 570 may include contact parts 560 in contact with top surfaces of the storage electrodes 545 and a connection part 565 connected to the contact parts 560. The connection part 565 may be located at a higher level than the storage electrodes 545. Each of the contact parts 560 may have a vertical thickness greater than a horizontal width. The contact parts 560 may be in contact with the top surfaces of the storage electrodes 545 and extend onto the sides of the storage electrodes 545.

Each of the storage electrodes 545 may include sequentially stacked lower and upper storage electrodes 515 and 540. The storage electrodes 545 may include a first storage electrode 545_1 and a second storage electrode 545_2 which are adjacent to each other. The first storage electrode 545_1 may include sequentially stacked first lower storage electrode 515_1 and first upper storage electrode 540_1. The second storage electrode 5452 may include sequentially stacked second lower storage electrode 515_2 and second upper storage electrode 540_2.

A lower support pattern 525 interposed between the upper storage electrodes 540 may be formed. The lower support pattern 525 may be formed of an insulating material such as silicon nitride.

The lower support pattern 525 may be interposed between sides of the upper storage electrodes 540. The lower support pattern 525 may be located at a lower level than the continuous support pattern 570.

The lower support pattern 525 may be interposed between the sides of the upper storage electrodes 540. The lower support pattern 525 may be interposed between lower sides of the upper storage electrodes 540. The lower support pattern 525 may be interposed between sides of lower portions of the upper storage electrodes 540. For example, according to an embodiment, the lower support pattern 525 may be interposed between a lower side of the first upper storage electrode 540_1 and a lower side of the second upper storage electrode 540_2. The lower support pattern 525 may be directly in contact with the second upper storage electrode 540_2 and the first upper storage electrode 540_1.

A contact area between the lower support pattern 525 and the first upper storage electrode 540_1 may be the same or substantially the same as a contact area between the lower support pattern 525 and the second upper storage electrode 540_2.

A storage dielectric layer 580 conformally covering the storage electrodes 545, the lower support pattern 525, and the continuous support pattern 570 may be formed. A plate electrode 585 may be formed on the storage dielectric layer 580. An upper interlayer insulating layer 590 may be formed on the plate electrode 585. A plug 593 passing through the upper interlayer insulating layer 590 and a metal line 596 on the plug 593 may be formed.

A semiconductor device in accordance with an embodiment of the inventive concept is described with reference to FIG. 37.

Figure 37:
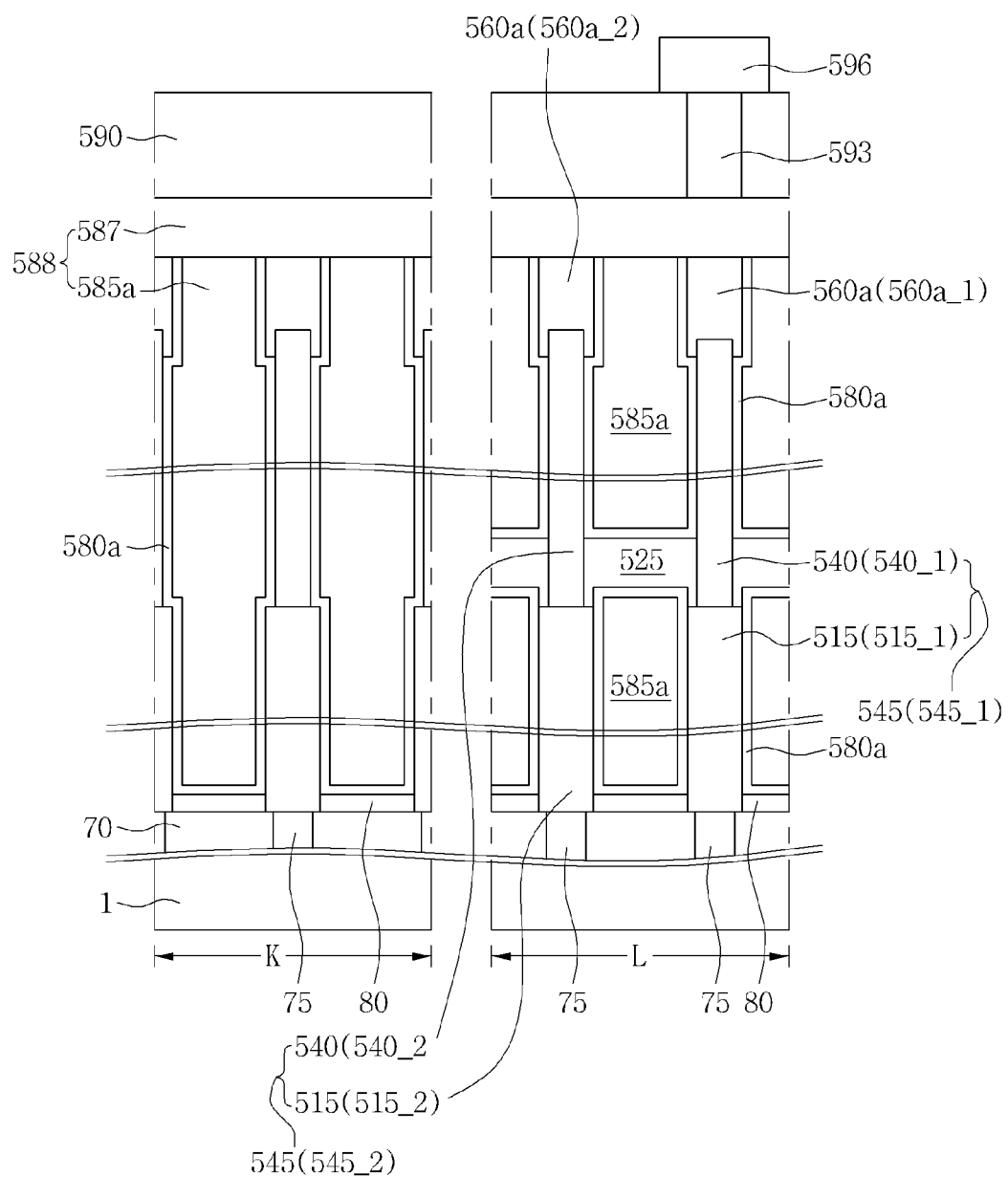
FIG. 37 is a cross-sectional view showing a semiconductor device in accordance with an embodiment of the inventive concept.

Referring to FIG. 37, a plurality of storage electrodes 545 spaced apart from each other may be formed on a substrate 1. Each of the storage electrodes 545 may include sequentially stacked lower and upper storage electrodes 515 and 540, as described above in connection with FIG. 36.

As described above in connection with FIG. 36, a lower support pattern 525 interposed between sides of the upper storage electrodes 540 may be formed. The lower support pattern 525 may be interposed between lower sides of the upper storage electrodes 540.

Insulating patterns 560a may be formed on the storage electrodes 545. The insulating patterns 560a may be formed of an insulating material, such as silicon nitride. The insulating patterns 560a may be disposed on the storage electrodes 545. The insulating patterns 560a may be connected to the top surfaces of the storage electrodes 545.

The storage electrodes 545 may include a first storage electrode 545_1 and a second storage electrode 545_2 which are adjacent to each other. The first storage electrode 545_1 may include sequentially stacked first lower storage electrode 515_1 and first upper storage electrode 540_1. The second storage electrode 545_2 may include sequentially stacked second lower storage electrode 515_2 and second upper storage electrode 540_2.

A first insulating pattern 560a_1 may be formed on the first upper storage electrode 540_1, and a second insulating pattern 560a_2 may be formed on the second upper storage electrode. The lower support pattern 525 may be interposed between a lower side of the first upper storage electrode 540_1 and a lower side of the second upper storage electrode 540_2.

A lower plate electrode 585a may be formed to surround sides of the storage electrodes 545 and the insulating patterns 560a and to cover the lower support pattern 525.

The top surface of the lower plate electrode 585a may be located at the same or substantially the same level as the top surfaces of the insulating patterns 560a.

A storage dielectric layer 580a interposed between the lower plate electrode 585a and the storage electrodes 545, between the lower plate electrode 585*a* and the insulating patterns 560*a*, and between the lower plate electrode 585*a* and the substrate 1 may be formed.

An upper plate electrode 587 may be formed on the lower plate electrode 585*a* and the insulating patterns 560*a*. The upper plate electrode 587 may include a material having low resistivity compared to the lower plate electrode 585*a* and may be electrically connected to the lower plate electrode 585*a*.

The lower and upper plate electrodes 585*a* and 587 may configure a plate electrode 588.

An upper interlayer insulating layer 590 may be formed on the plate electrode 588. A plug 593 passing through the upper interlayer insulating layer 590 and a metal line 596 on the plug 593 may be formed.

A semiconductor device in accordance with an embodiment of the inventive concept is described with reference to FIG. 38.

Figure 38:
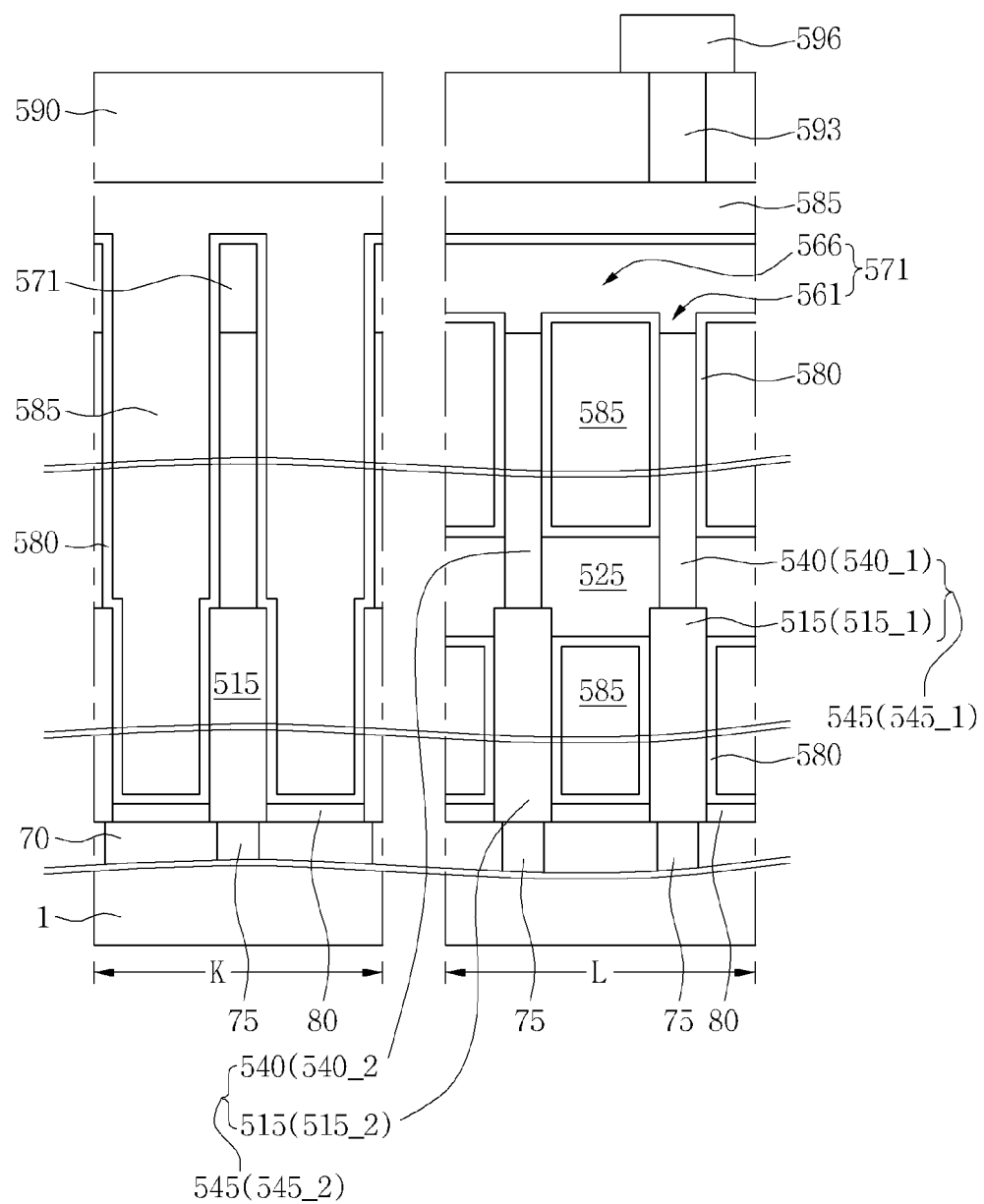
FIG. 38 is a cross-sectional view showing a semiconductor device in accordance with an embodiment of the inventive concept.

Referring to FIG. 38, a plurality of storage electrodes 545 spaced apart from each other may be formed on a substrate 1. Each of the storage electrodes 545 may include sequentially stacked lower and upper storage electrodes 515 and 540, as described above in connection with FIG. 36.

As described above in connection with FIG. 36, a lower support pattern 525 interposed between lower sides of the upper storage electrodes 540 may be formed.

A continuous support pattern 571 may be formed on the storage electrodes 545. The continuous support pattern 571 may be located at a higher level than the lower support pattern 525.

The continuous support pattern 571 may include contact parts 561 directly in contact with top surfaces of the storage electrodes 540 and a connection part 566 connecting the contact parts 561. The connection part 566 may be located at a higher level than the storage electrodes 545.

A storage dielectric layer 580 conformally covering the storage electrodes 545, the lower support pattern 525, and the continuous support pattern 571 may be formed. A plate electrode 585 may be formed on the storage dielectric layer 580.

A semiconductor device in accordance with an embodiment of the inventive concept is described with reference to FIG. 39.

Figure 39:
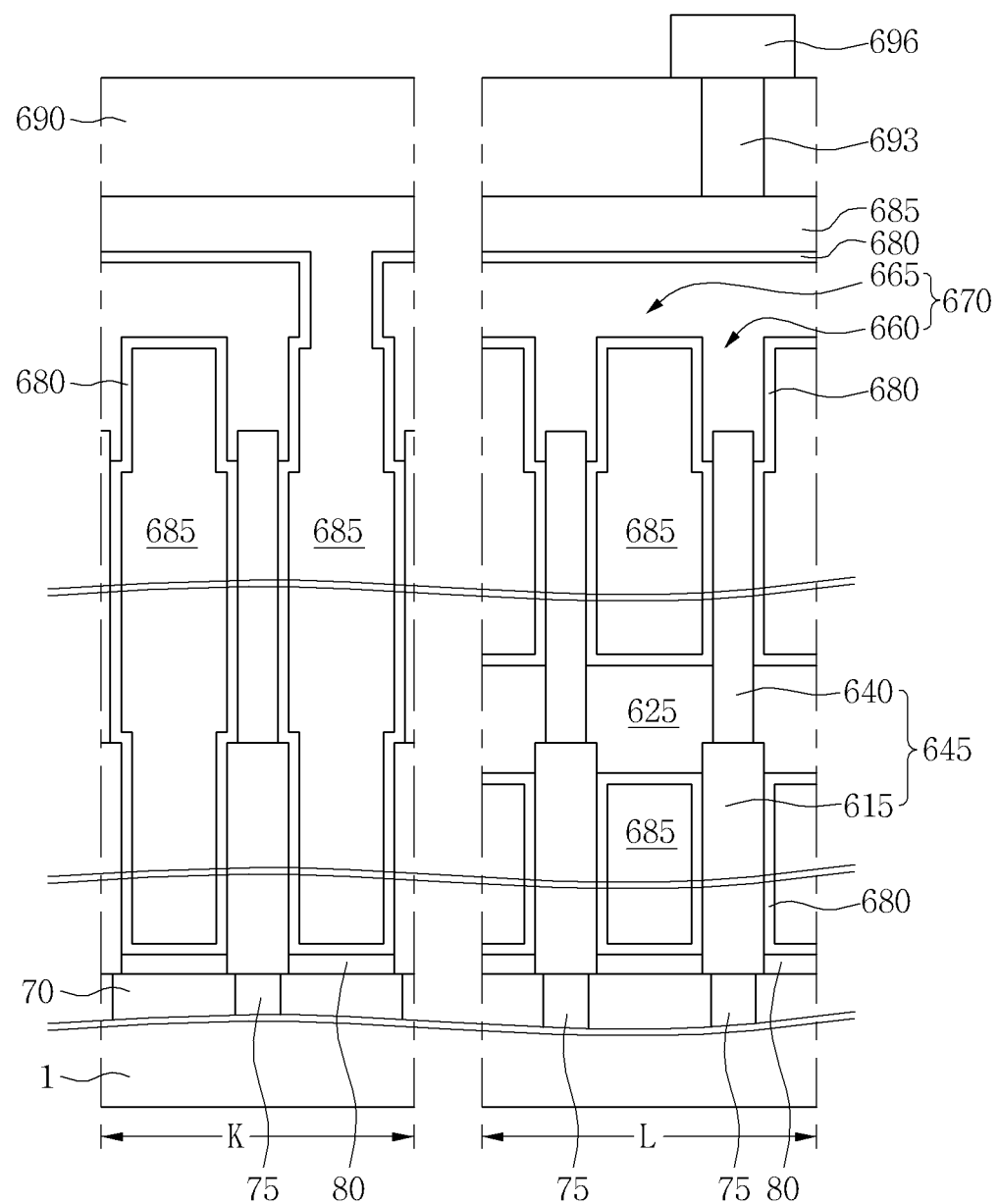
FIG. 39 is a cross-sectional view showing a semiconductor device in accordance with an embodiment of the inventive concept.

Referring to FIG. 39, storage electrodes 645 spaced apart from each other may be formed on a substrate 1. A continuous support pattern 670 may be formed on the storage electrodes 645. The continuous support pattern 670 may be formed of an insulating material, such as silicon nitride. The continuous support pattern 670 may include contact parts 660 in contact with top surfaces of the storage electrodes 645 and a connection part 665 connected to the contact parts 660. The connection part 665 may be located at a higher level than the storage electrodes 645. Each of the contacts 660 may have a vertical thickness greater than a horizontal width. Each of the storage electrodes 645 may include sequentially stacked lower storage electrode 615 and upper storage electrode 640. A lower support pattern 625 interposed between sides of the upper storage electrodes 640 may be formed. The lower support pattern 625 may be interposed between lower sides of the upper storage electrodes 640. The lower support pattern 625 may be directly connected to the lower sides of the upper storage electrodes 640. The lower support pattern 625 may be interposed between the lower sides of the upper storage electrodes 640 and between upper sides of the lower storage electrodes 615. The lower support pattern 625 may be in contact with the lower sides of the upper storage electrodes 640 and the upper sides of the lower storage electrodes 615. A top surface of the lower support pattern 625 may be at a higher level than a bottom surface of the upper storage electrode 640. A bottom surface of the lower support pattern 625 may be located at a lower level than a top surface of the lower storage electrode 615.

A storage dielectric layer 680 may be conformally formed on the substrate having the storage electrodes 645, the lower support pattern 625, and the continuous support pattern 670. A plate electrode 685 may be formed on the storage dielectric layer 680.

An upper interlayer insulating layer 690 may be formed on the plate electrode 685. A plug 693 passing through the upper interlayer insulating layer 690 and a metal line 696 on the plug 693 may be formed.

A semiconductor device in accordance with an embodiment of the inventive concept is described with reference to FIG. 40.

Figure 40:
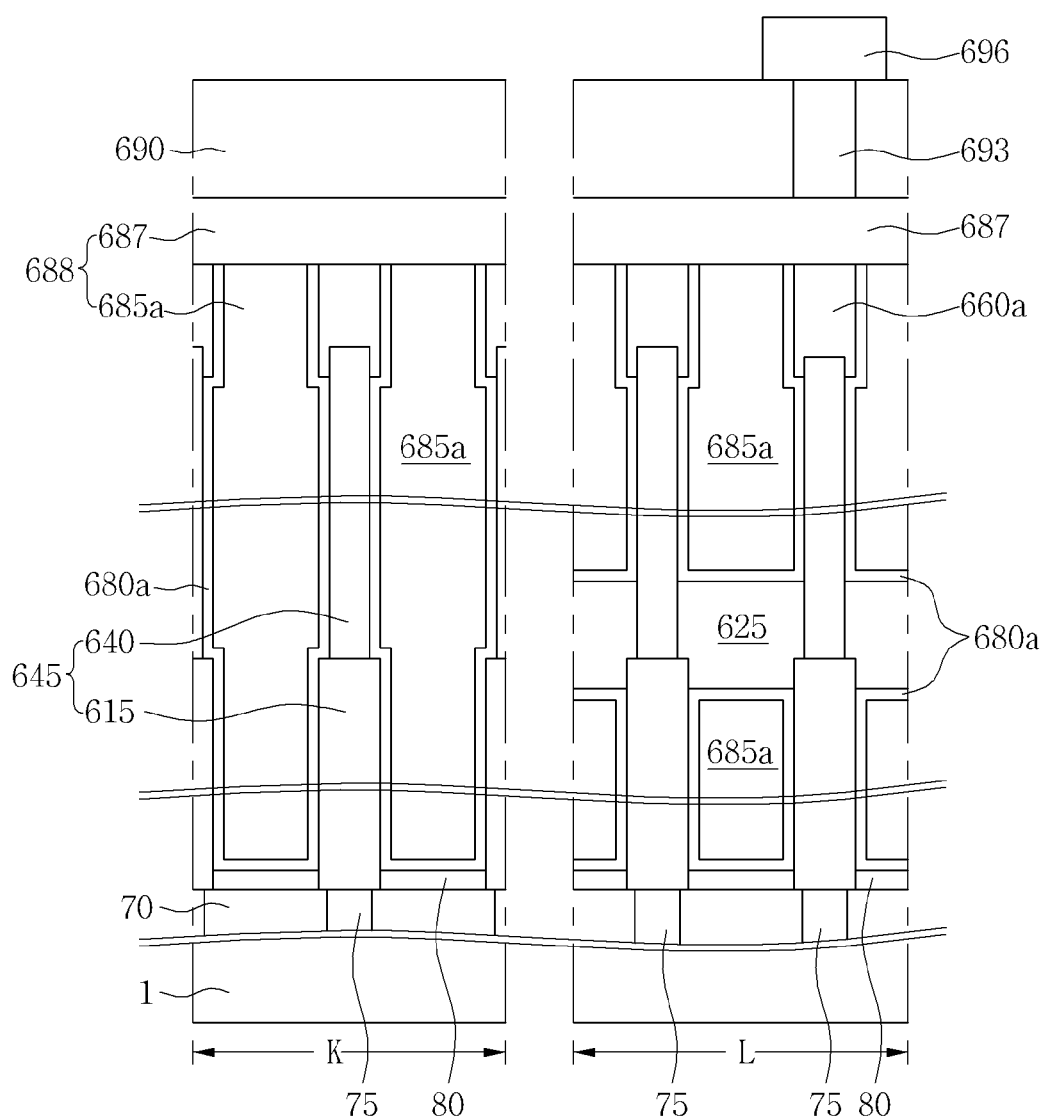
FIG. 40 is a cross-sectional view showing a semiconductor device in accordance with an embodiment of the inventive concept.

Referring to FIG. 40, a plurality of storage electrodes 645 spaced apart from each other may be formed on a substrate 1. Each of the storage electrodes 645 may include sequentially stacked lower storage electrode 615 and upper storage electrode 640, as described above in connection with FIG. 39.

As described above in connection with FIG. 39, a lower support pattern 625 interposed between lower sides of the upper storage electrodes 640 may be formed. The lower support pattern 625 may be interposed between the lower sides of the upper storage electrodes 640 and between upper sides of the lower storage electrodes 615.

Insulating patterns 660*a* may be formed on the storage electrodes 645. The insulating patterns 660*a* may be formed of an insulating material, such as silicon nitride. The insulating patterns 660*a* may be stacked on the storage electrodes 645. The insulating patterns 660*a* may be connected to top surfaces of the storage electrodes 645.

A lower plate electrode 685*a* may be formed to surround sides of the storage electrodes 645 and the insulating patterns 660*a* and to cover the lower support pattern 625. A top surface of the lower plate electrode 685*a* may be located at the same or substantially the same level as top surfaces of the insulating patterns 660*a*.

A storage dielectric layer 680*a* interposed between the lower plate electrode 685*a* and the storage electrodes 645, between the lower plate electrode 685*a* and the insulating patterns 660*a*, and between the lower plate electrode 685*a* and the substrate 1 may be formed.

An upper plate electrode 687 may be formed on the lower plate electrode 685*a* and the insulating patterns 660*a*. The upper plate electrode 687 may include a material having low resistivity compared to the lower plate electrode 685*a* and may be electrically connected to the lower plate electrode 685*a*. The lower and upper plate electrodes 685*a* and 687 may configure a plate electrode 688.

A semiconductor device in accordance with an embodiment of the inventive concept is described with reference to FIG. 41.

Figure 41:
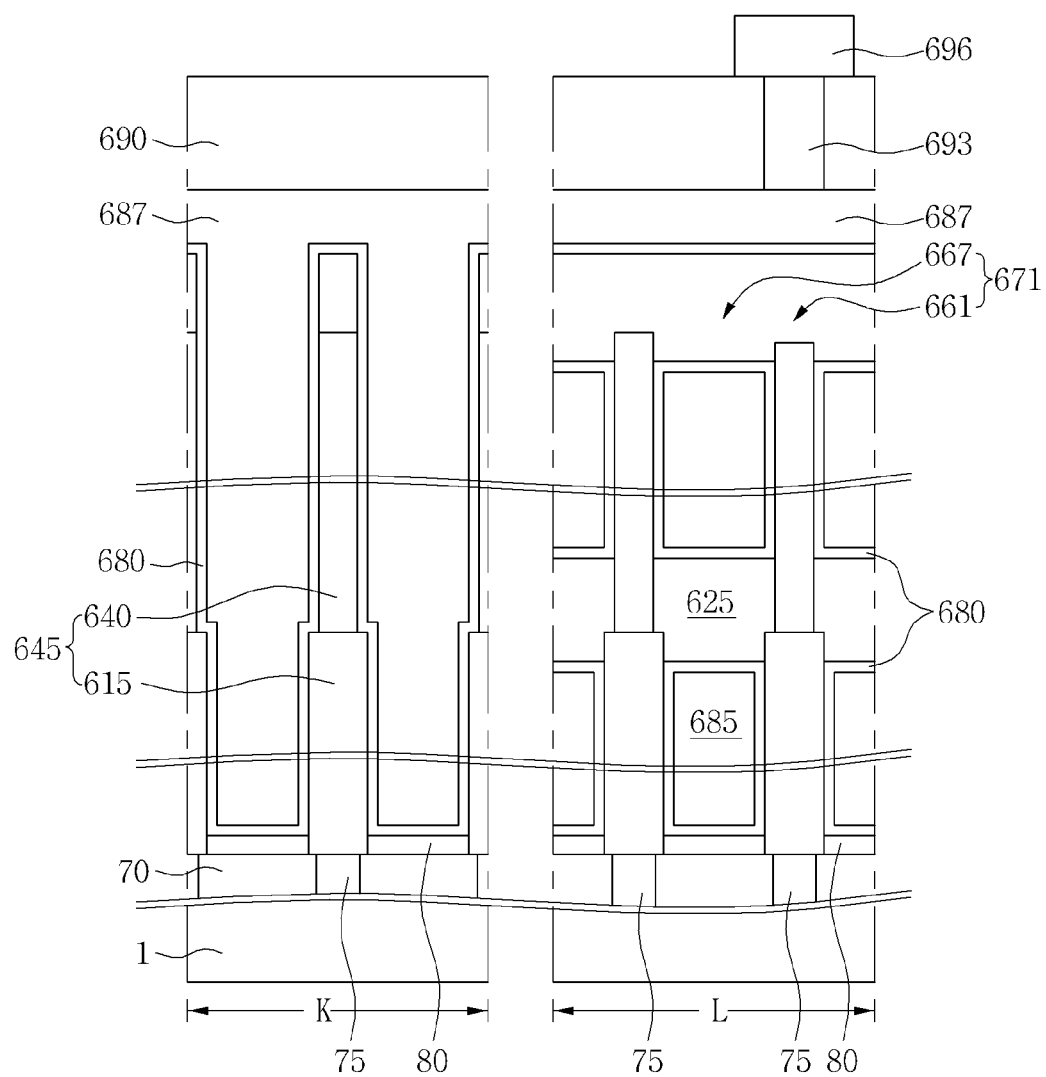
FIG. 41 is a cross-sectional view showing a semiconductor device in accordance with an embodiment of the inventive concept.

Referring to FIG. 41, a plurality of storage electrodes 645 spaced apart from each other may be formed on a substrate 1. Each of the storage electrodes 645 may include sequentially stacked lower storage electrode 615 and upper storage electrode 640, as described above in connection with FIG. 39.

A continuous support pattern 671 connected to top surfaces of the storage electrodes 645 may be formed. The continuous support pattern 671 may include contact parts 661 directly connected to the top surfaces of the storage electrodes 645 and a connection part 667 connecting the contact parts 661. A bottom surface of the connection part 667 of the continuous support pattern 671 may be located at a lower level than the top surfaces of the storage electrodes 645. The connection part 667 of the continuous support pattern 671 may be directly in contact with sides of upper portions of the storage electrodes 645. Accordingly, the continuous support pattern 671 may be directly in contact with the top surfaces of the storage electrodes 645 and directly in contact with the sides of upper portions of the storage electrodes 645.

As described above in connection with FIG. 39, a lower support pattern 625 interposed between lower sides of the upper storage electrodes 640 may be formed. The support pattern 625 may be directly connected to the lower sides of the upper storage electrodes 640. The lower support pattern 625 may be interposed between the lower sides of the upper storage electrodes 640 and between upper sides of the lower storage electrodes 615. The lower support pattern 625 may be in contact with the lower sides of the upper storage electrodes 640 and in contact with the upper sides of the lower storage electrodes 615.

A storage dielectric layer 680 may be conformally formed on the substrate having storage electrodes 645, the lower support pattern 625, and the continuous support pattern 671. A plate electrode 687 may be formed on the storage dielectric layer 680. An upper interlayer insulating layer 690 may be formed on the plate electrode 687. A plug 693 passing through the upper interlayer insulating layer 690 and a metal line 696 on the plug 693 may be formed.

Figure 42:
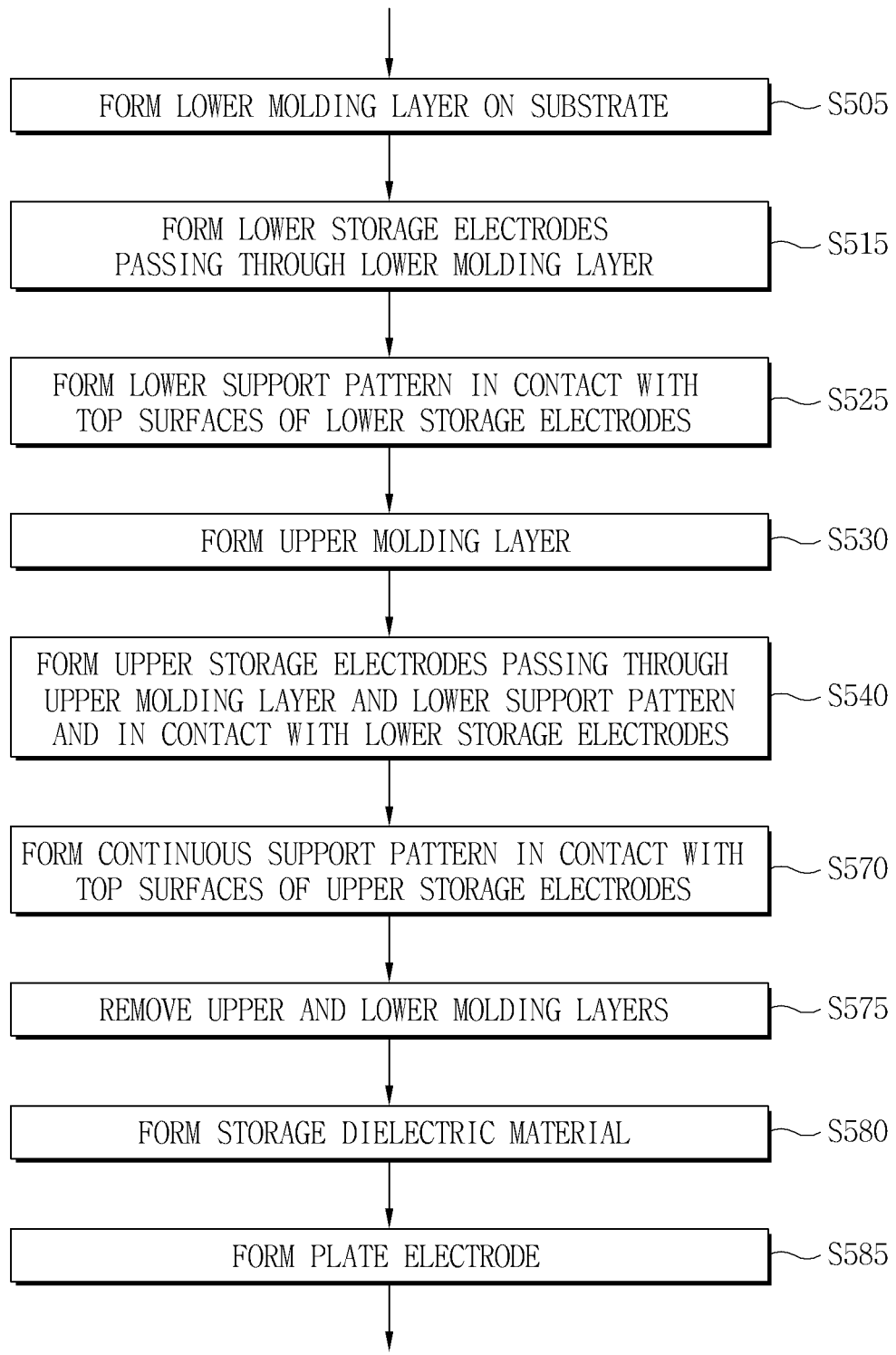
FIG. 42 is a flowchart illustrating a method of fabricating a semiconductor device in accordance with an embodiment of the inventive concept.

Next, a method of fabricating a semiconductor device in accordance with an embodiment of the inventive concept is described with reference to FIGS. 42 and 43A to 43F. FIG. 42 is a flowchart and FIGS. 43A to 43F are cross-sectional views illustrating a fabrication method of the other modified example of the semiconductor device in accordance with the embodiment of the inventive concept. In FIGS. 43A to 43F, reference character "K" indicates the area taken along the line XII-XII' in FIG. 35, and reference character "L" indicates the area taken along the line XIII-XIII∝ in FIG. 35.

Figure 43A:
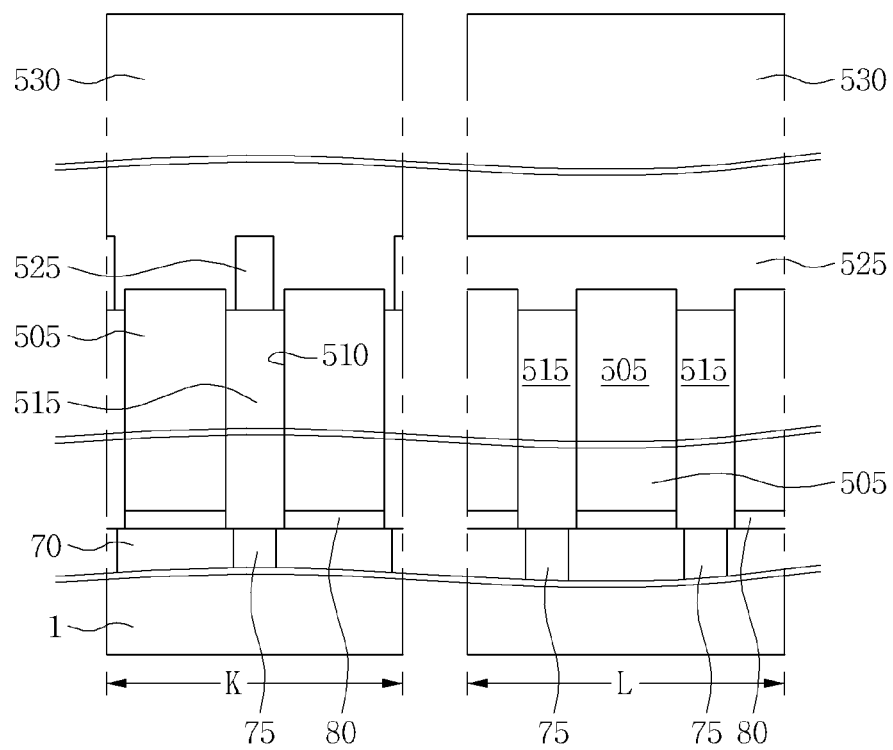
FIGS. 43A to 43F are cross-sectional views illustrating a method of fabricating a semiconductor device in accordance with an embodiment of the inventive concept.

Referring to FIGS. 35, 42, and 43A, as described above in connection with FIG. 30A, a lower interlayer insulating layer 70 may be formed on a substrate 1 having a switching device, and plugs 75 passing through the lower interlayer insulating layer 70 may be formed. An etch stopping layer 80 may be formed on the lower interlayer insulating layer 70.

A lower molding layer 505 may be formed on the substrate having the etch stopping layer 80 (S505). The etch stopping layer 80 may be formed of silicon nitride, and the lower molding layer 505 may be formed of a material having etching selectivity with respect to the etch stopping layer 80, for example, silicon oxide. A plurality of lower storage holes 510 passing through the lower molding layer 505 and the etch stopping layer 80 may be formed. A plurality of lower storage electrodes 515 passing through the lower molding layer 505 and the etch stopping layer 80 may be formed (S515). The lower storage electrodes 515 may be formed in the lower storage holes 510.

In an embodiment, the lower storage electrodes 515 may be formed to partially fill the lower storage holes 510.

A lower support pattern 525 may be formed on the substrate having the lower storage electrodes 515. The lower support pattern 525 may be a continuous support pattern. The lower support pattern may be formed of an insulating material, such as silicon nitride. For example, according to an embodiment, the lower support pattern 525 may be the same or substantially the same as the continuous support pattern 345 as described above in connection with FIG. 25. For example, according to an embodiment, the lower support pattern 525 may include contact parts and a connection part connected to the contact parts. The contact parts of the lower support pattern 525 may be directly in contact with top surfaces of the lower storage electrodes 515. The connection part of the lower support pattern 525 may be located at a higher level than the storage electrodes 515. The lower support pattern 525 may include a line-shaped portion.

An upper molding layer 530 may be formed (S530). The upper molding layer 530 may be formed to cover the lower molding layer 505 and the lower support pattern 525. The upper molding layer 530 may be formed of silicon oxide.

Figure 43B:
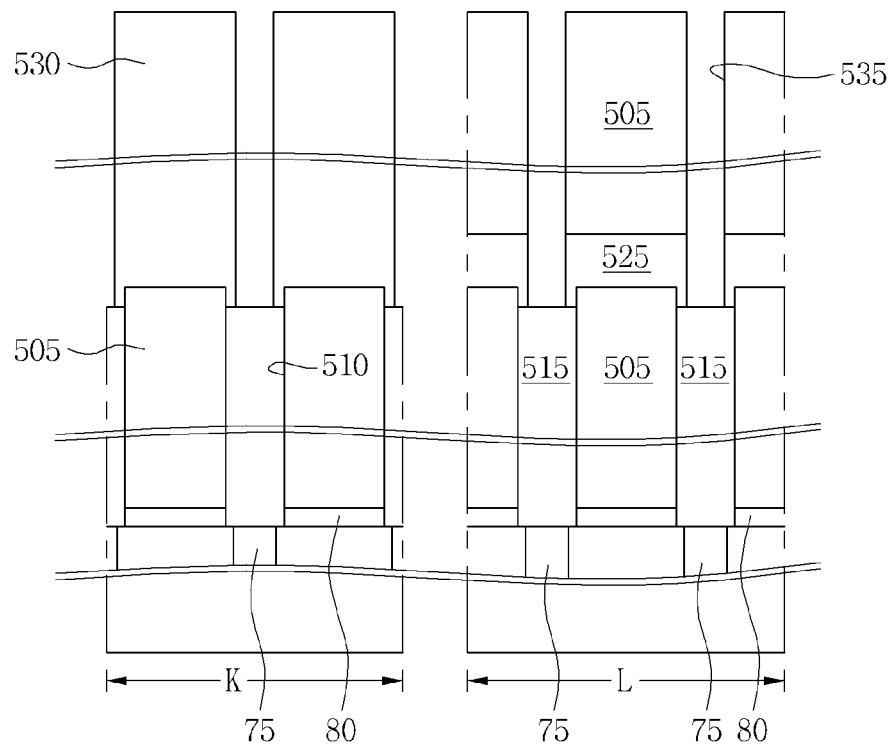

Referring to FIG. 35 and FIG. 43B, upper storage holes 535 passing through the upper molding layer 530 and the lower support pattern 525 and exposing the lower storage electrodes 515 may be formed.

Figure 43C:
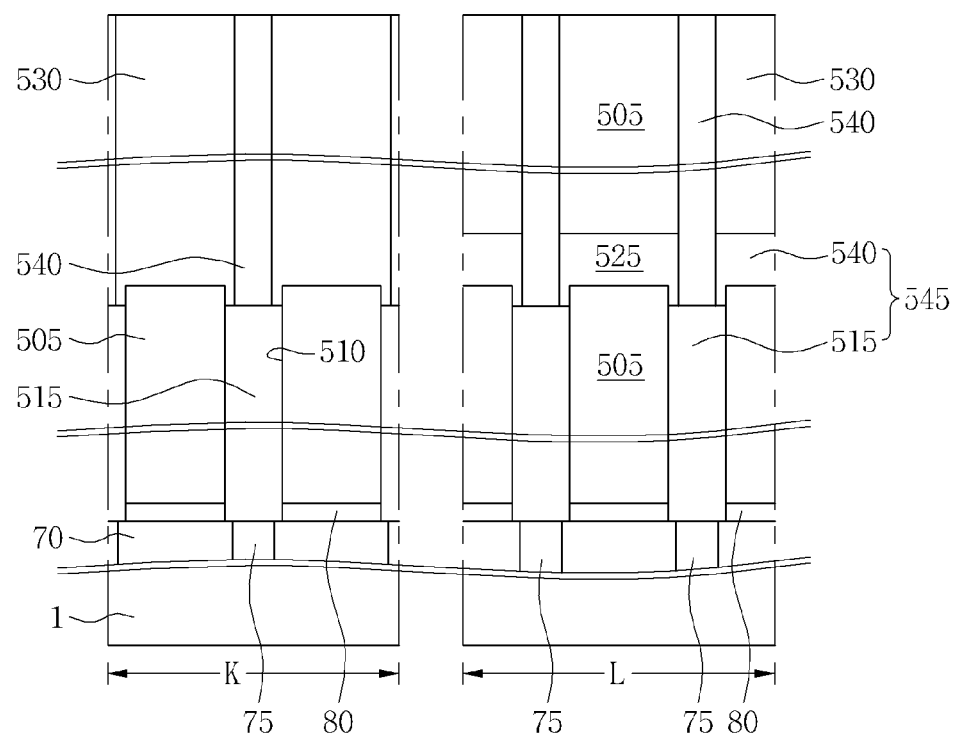

Referring to FIGS. 35, 42, and 43C, upper storage electrodes 540 passing through the upper molding layer 530 and the lower support pattern 525 and in contact with the lower storage electrodes 515 may be formed (S540). The upper storage electrodes 540 may be formed in the upper storage holes 535. The lower and upper storage electrodes 515 and 540 may configure storage electrodes 545

Figure 43D:
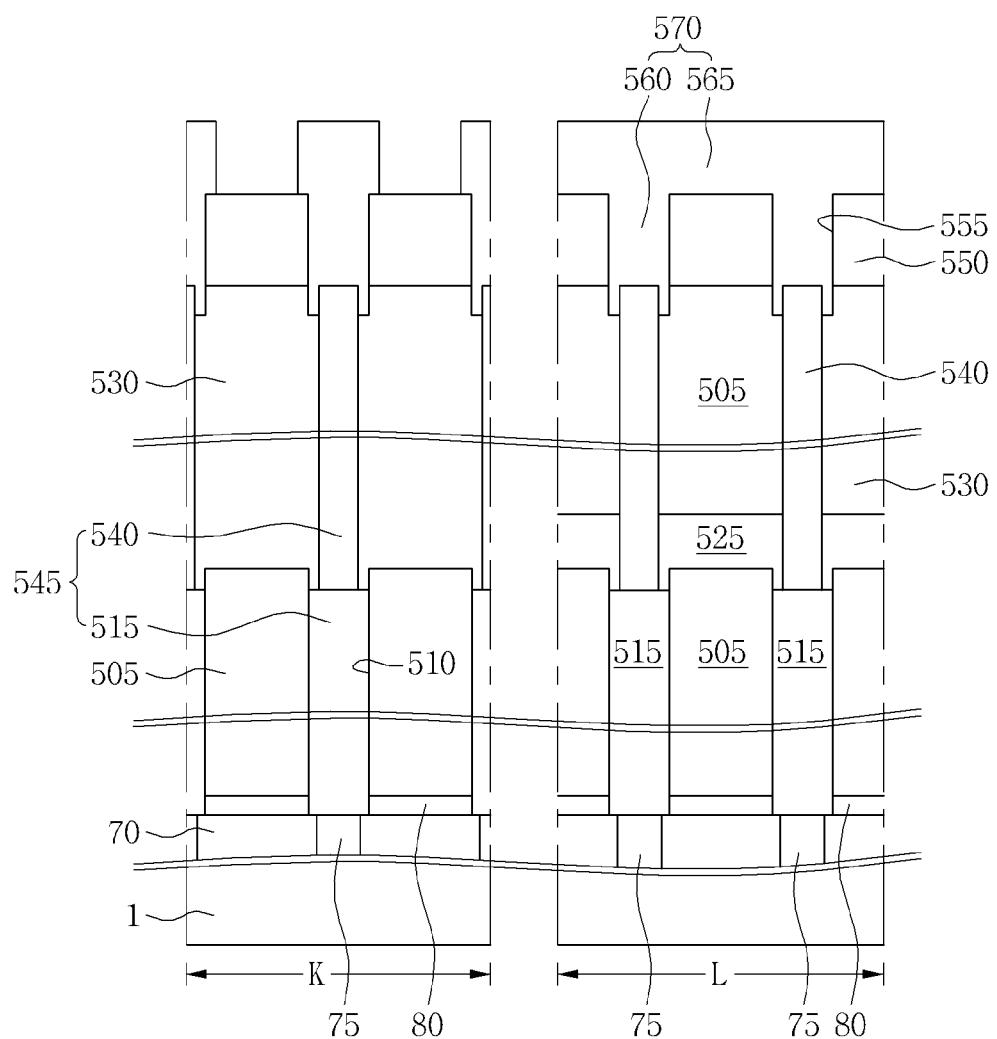

Referring to FIGS. 35, 42 and 43D, a continuous support pattern 570 in contact with top surfaces of the upper storage electrode 540 may be formed (S570).

The continuous support pattern 570 may include contact parts 560 and a connection part 565. The contact parts 560 of the continuous support pattern 570 may be directly connected to the top surfaces of the upper storage electrodes 540, and the connection part 565 may connect the contact parts 560. The upper storage electrodes 540 and the contacts 560 may be vertically stacked. The connection part 565 of the continuous support pattern 570 may be located at a higher level than bottom surfaces of the contact parts 560 and the upper storage electrodes 540.

The formation of the continuous support pattern 570 may include forming a sacrificial pattern 550 which has openings 555 exposing the upper storage electrodes 540 on the substrate having the upper storage electrodes 540, forming an insulating material layer filling the openings 555 on the sacrificial pattern 550, and patterning the insulating material layer.

Figure 43E:
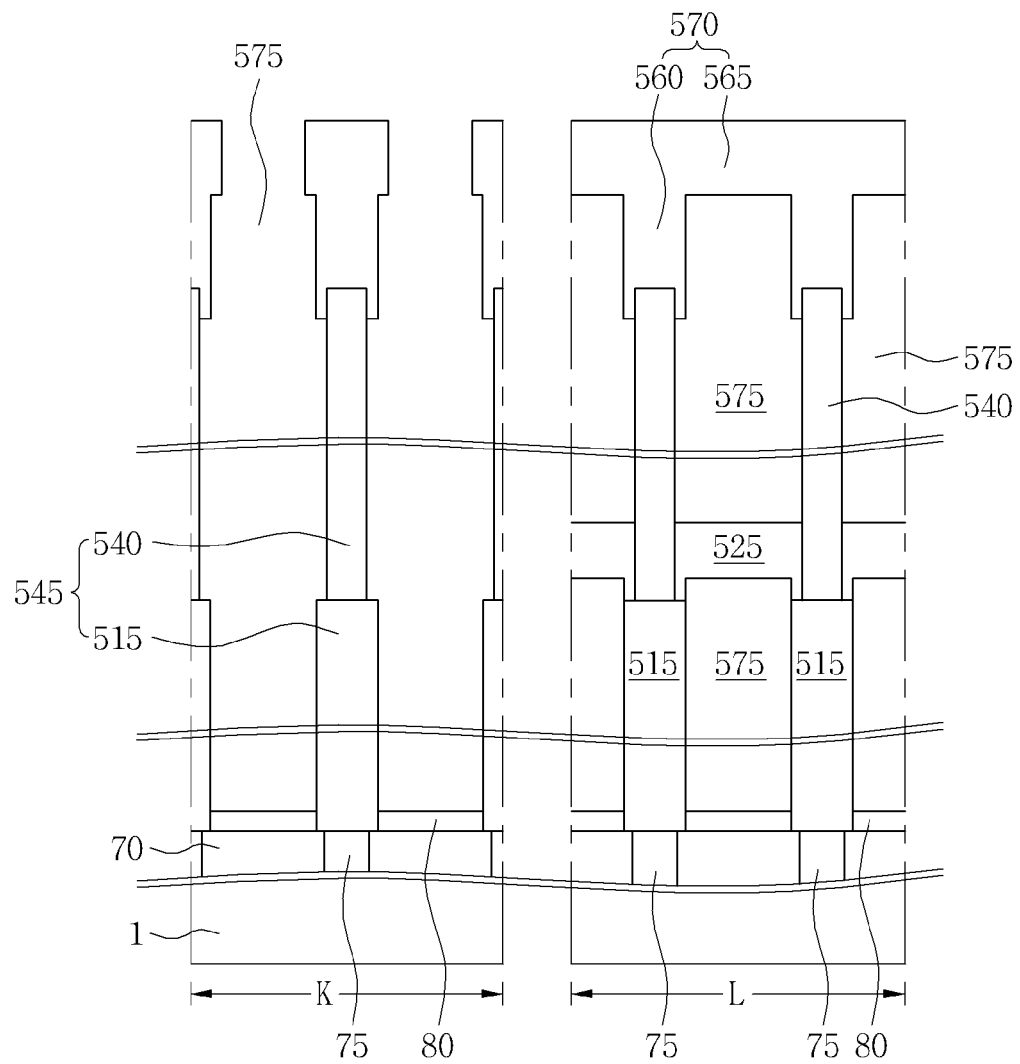

Referring to FIGS. 35, 42, and 43E, the sacrificial pattern 550 and the upper and lower molding layers 530 and 505 may be selectively removed using an etching process (S575). The sacrificial pattern 550 and the upper and lower molding layers 530 and 505 may be removed to form an empty space 575. The empty space 575 may expose sides of the storage electrodes 545, lower support pattern 525, and continuous support pattern 570.

The continuous support pattern 570 and the lower support pattern 525 may prevent the storage electrodes 545 from collapsing while the sacrificial pattern 550 and the upper and lower molding layers 530 and 505 are removed.

Figure 43F:
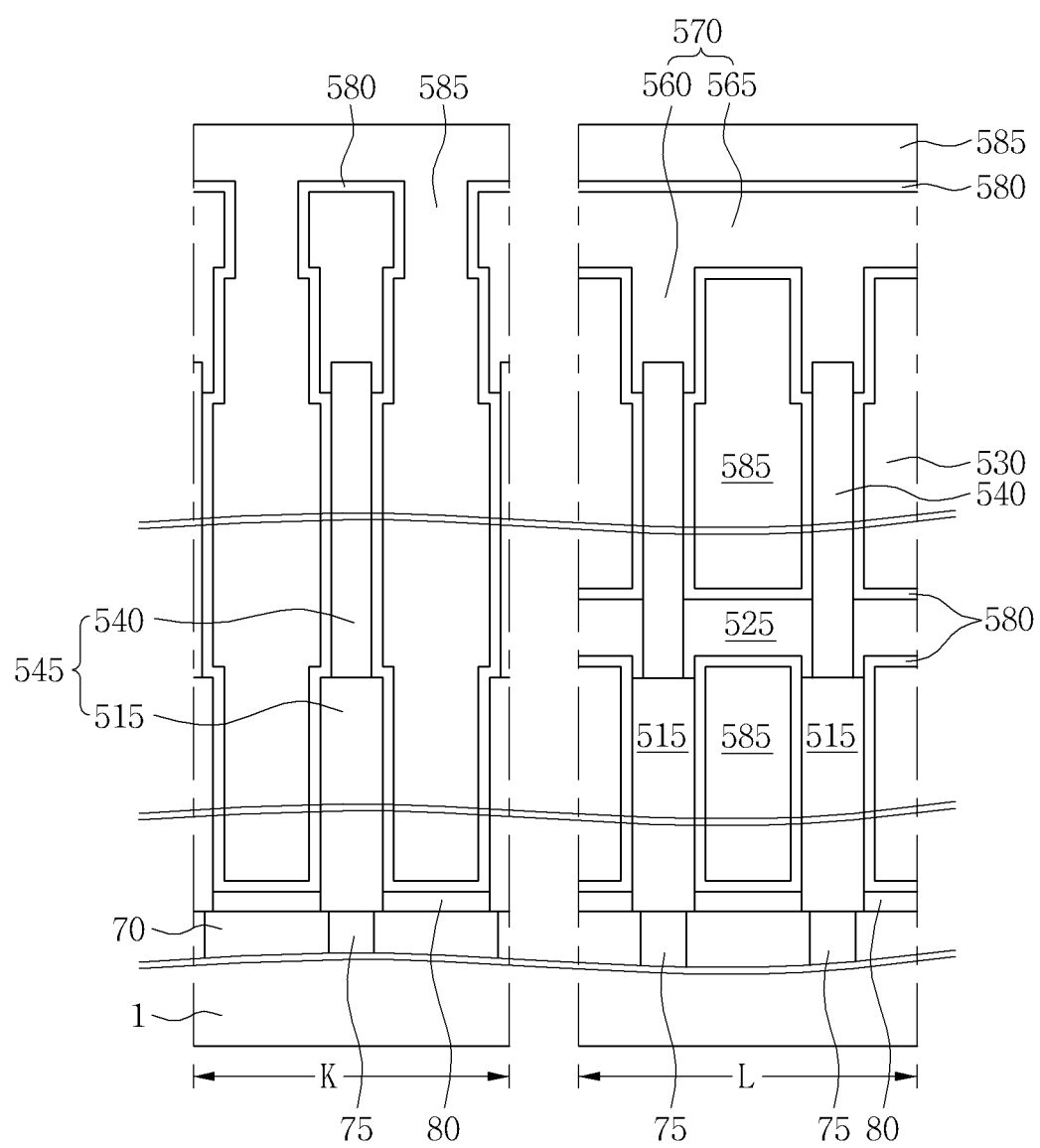

Referring to FIGS. 35, 42, and FIG. 43F, a storage dielectric layer 580 may be conformally formed on the substrate having the empty space 575 (S580). A plate electrode 585 filling the empty space 575 may be formed on the substrate having the storage dielectric layer 580.

Referring again to FIG. 36, an upper interlayer insulating layer 590, a plug 593 passing through the upper interlayer insulating layer 590, and a metal line 596 on the plug 593 may be formed on the substrate having the plate electrode 585.

Figure 44A:
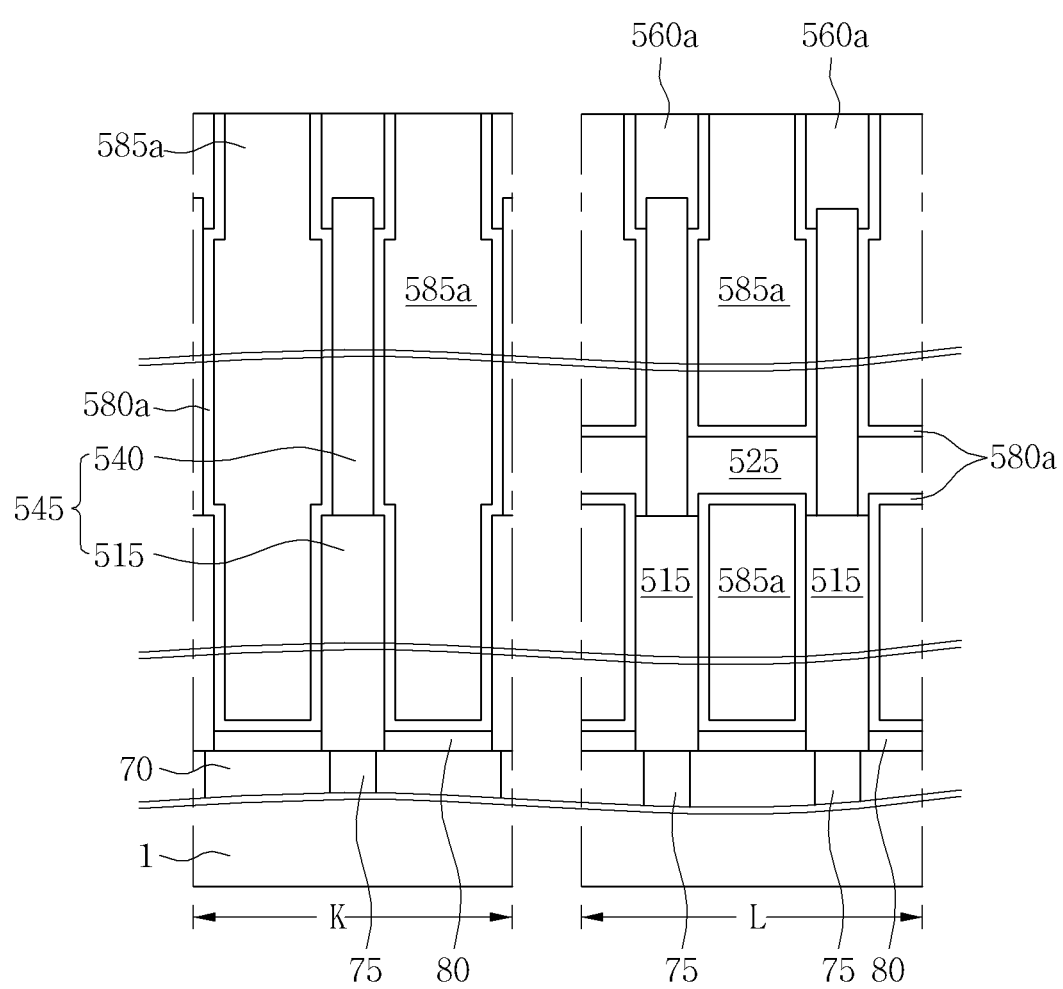
FIGS. 44A and 44B are cross-sectional views illustrating a method of fabricating a semiconductor device in accordance with an embodiment of the inventive concept.
Figure 44B:
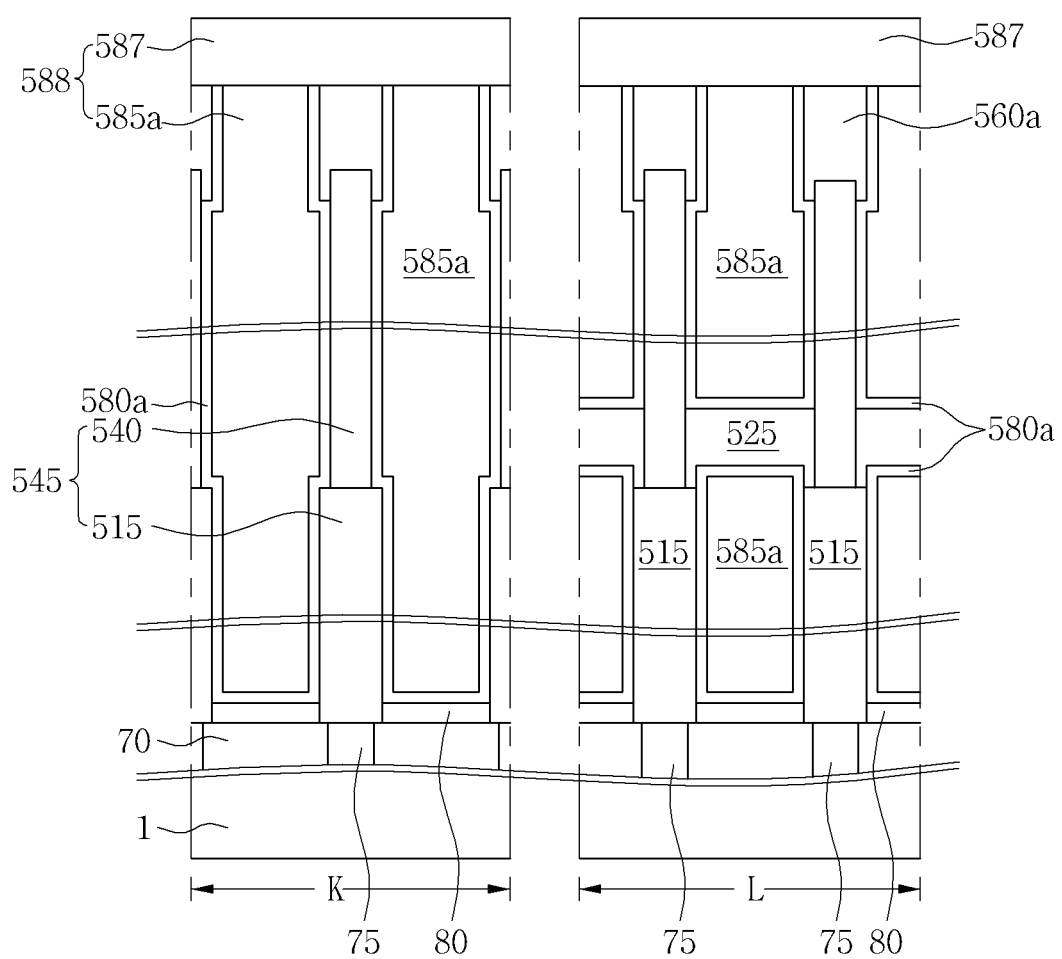

Next, a method of fabricating a semiconductor device in accordance with an embodiment of the inventive concept is described with reference to FIGS. 44A and 44B. In FIGS. 44A and 44B, reference character "K" indicates the area taken along the line XII-XII' in FIG. 35, and reference character "L" indicates the area taken along the line XIII-XIII' in FIG. 35.

Referring to FIG. 44A, a substrate described with reference to FIGS. 43A to 43F may be prepared. For example, according to an embodiment, using the method described in connection with FIGS. 43A to 43F, a substrate processed until the plate electrode 585 described in connection with FIG. 43F is formed may be prepared. Accordingly, the substrate may include the continuous support pattern 570 described in connection with FIG. 43D. The continuous support pattern 570 may include contact parts 560 connected to top surfaces of the upper storage electrode 540, and a connection part 565 connecting the contact parts 560.

The substrate having the plate electrode 585 may be planarized to expose the contact parts 560 and the plate electrode 585 disposed under the connection part 565. Therefore, the connection part 565 may be removed during the planarization process.

The planarization process may be performed using a CMP process and/or an etchback process. The planarized plate electrode may be defined as a lower plate electrode 585a. The remaining contact parts after the planarization process may be defined as insulating patterns 560a.

Referring to FIG. 44B, an upper plate electrode 587 may be formed on the substrate having the lower plate electrode 585a. The upper plate electrode 587 may be electrically connected to the lower plate electrode 585a and in contact with the insulating patterns 560a. The lower and upper plate electrodes 585a and 587 may configure a plate electrode 588.

Referring again to FIG. 37, an upper interlayer insulating layer 590, a plug 593 passing through the upper interlayer insulating layer 590, and a metal line 596 on the plug 593 may be formed on the substrate having the plate electrode 588

Next, a method of fabricating a semiconductor device in accordance with the embodiment of the inventive concept is described with reference to FIGS. 45A to 45D. FIGS. 45A to 45D are cross-sectional views illustrating a method of fabricating a semiconductor device in accordance with an embodiment of the inventive concept. In FIGS. 45A to 45D, reference character "K" indicates the area taken along the line XII-XII' in FIG. 35, and reference character "L" indicates the area taken along the line XIII-XIII' in FIG. 35.

Figure 45A:
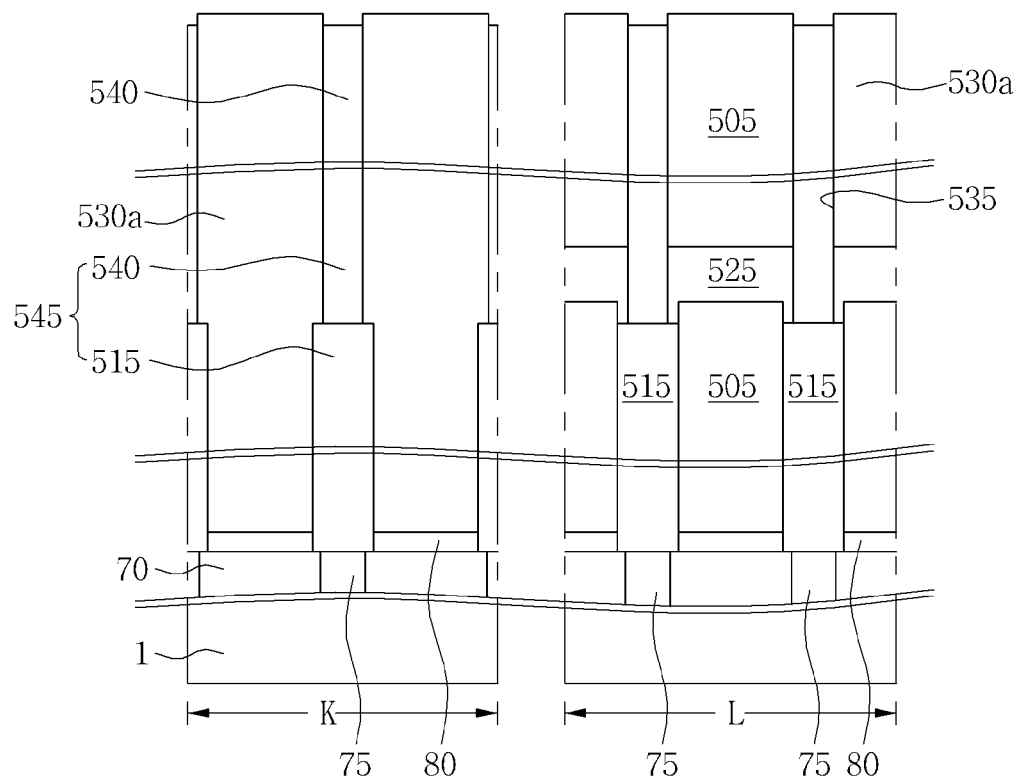
FIGS. 45A to 45D are cross-sectional views illustrating a method of fabricating a semiconductor device in accordance with an embodiment of the inventive concept.

Referring to FIG. 45A, as described above in connection with FIG. 43A, a lower molding layer 505 and lower storage electrodes 515 passing through the lower molding layer 505 may be formed on a substrate 1. A lower support pattern 525 directly connected to top surfaces of the lower storage electrodes 515 may be formed. An upper molding layer 530a may be formed on the substrate having the lower support pattern 525. Upper storage holes 535 which pass through the upper molding layer 530a and the lower support pattern 525 and expose the lower storage electrodes 515 may be formed. Upper storage electrodes 540 may be formed in the upper storage holes 535. The upper storage electrodes 540 may pass through the upper molding layer 530a and the lower support pattern 525 and be electrically connected to the lower storage electrodes 515.

In an embodiment, the upper storage electrodes 540 may partially fill the upper storage holes 535.

Figure 45B:
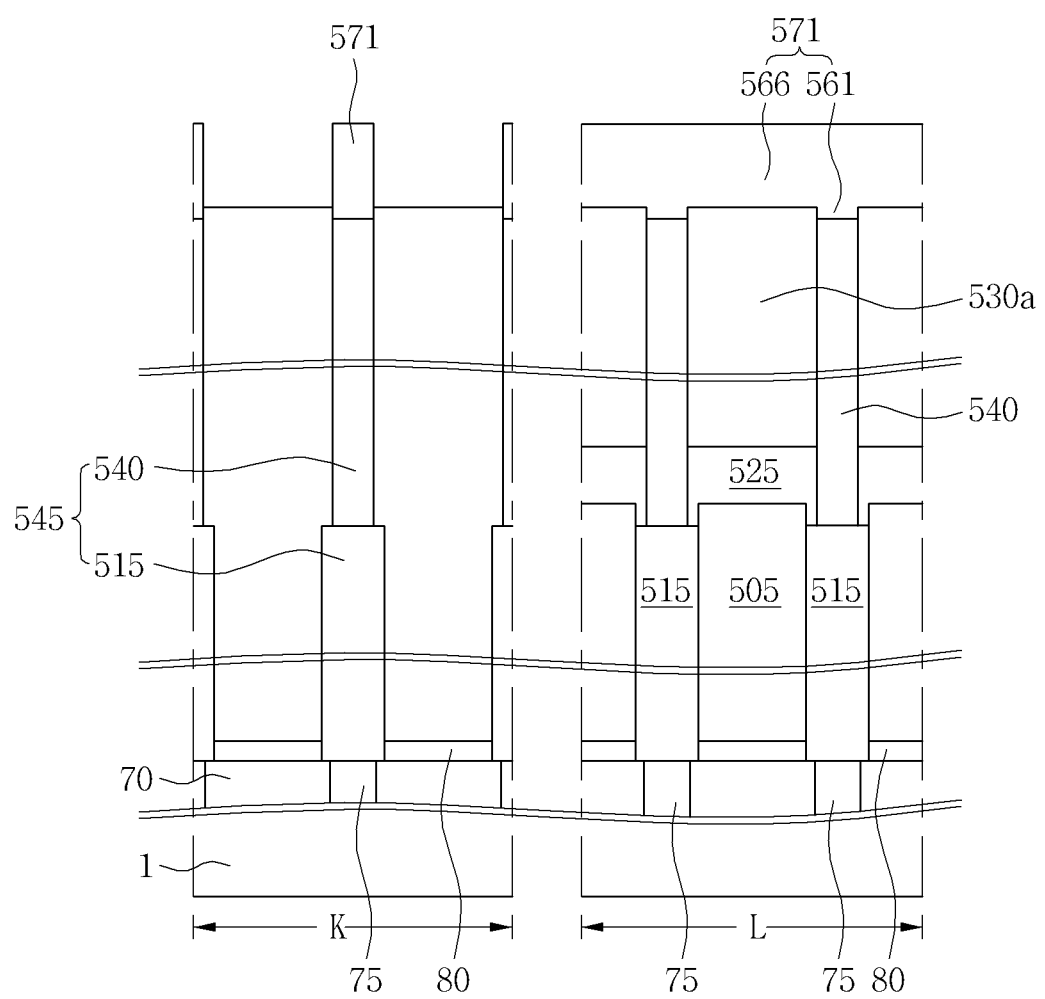

Referring to FIG. 45B, a continuous support pattern 571 may be formed on the substrate having the upper storage electrodes 540. The continuous support pattern 571 may include contact parts 561 directly connected to top surfaces of the upper storage electrodes 540, and a connection part 566 connecting the contact parts 561. The continuous support pattern 571 may include a portion in which the continuous support pattern 571 vertically overlaps the lower support pattern 525. When viewed in a plan view, the connection part 566 of the continuous support pattern 571 may overlap the lower support pattern 525. The connection part 566 of the continuous support pattern 571 may be vertically aligned with the lower support pattern 525. For example, according to an embodiment, the continuous support pattern 571 may be formed using the same or substantially the same photomask as that for forming the lower support pattern 525. For example, according to an embodiment, the formation of the lower support pattern 525 may include forming a lower material layer and patterning the lower material layer through a photo and etch process using a first photomask. The formation of the continuous support pattern 571 may include forming an upper material layer and patterning the upper material layer through a photo and etch process using a second photomask having the same or substantially the same mask pattern as that of the first photomask. Accordingly, the continuous support pattern 571 may include a portion that is vertically aligned with and vertically overlaps the lower support pattern 525.

Figure 45C:
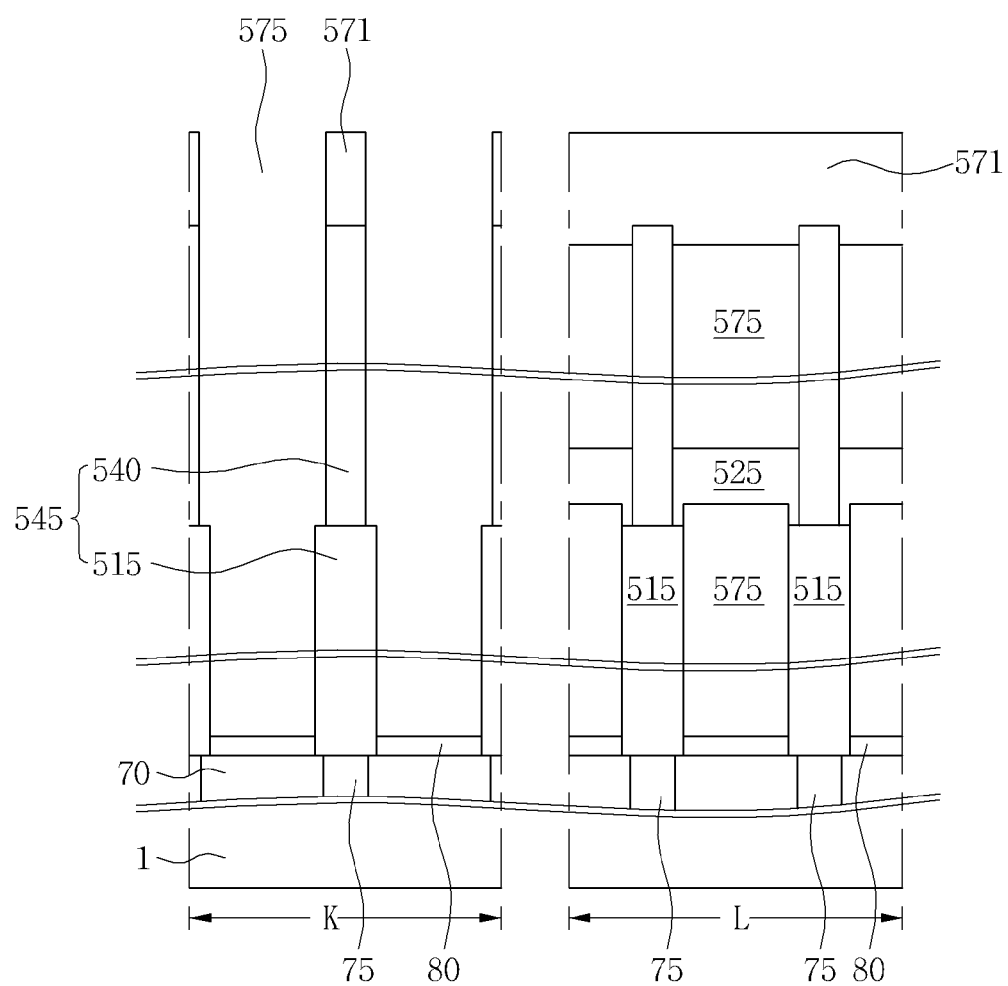

Referring to FIG. 45C, the upper and lower molding layers 530a and 505 may be selectively removed to form an empty space 575. While the upper and lower molding layers 530a and 505 are removed, the continuous support pattern 571 and the lower support pattern 525 may prevent the storage electrodes 545 from collapsing.

Figure 45D:
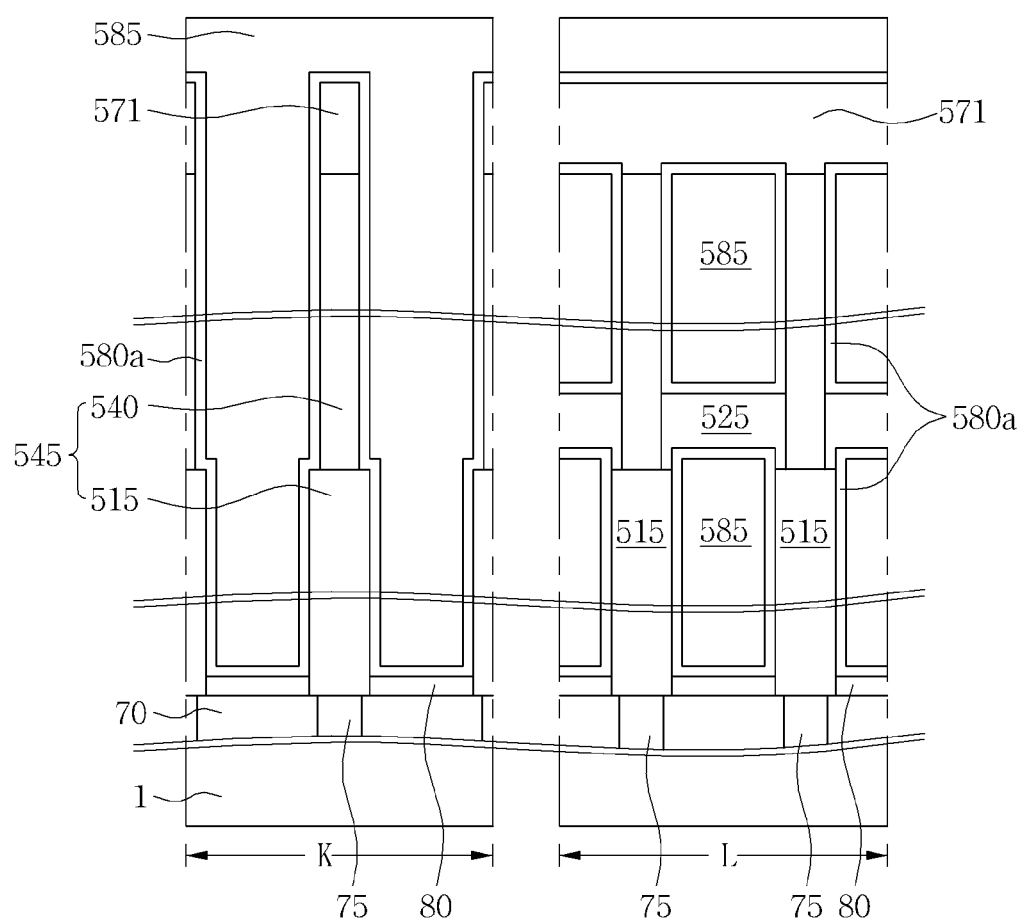

Referring to FIG. 45D, a storage dielectric layer 580a may be formed on the substrate having the empty space 575. The storage dielectric layer 580a may be conformally formed. A plate electrode 585 may be formed on the substrate having the storage dielectric layer 580a.

Next, a method of fabricating a semiconductor device in accordance with an embodiment of the inventive concept is described with reference to FIGS. 46A to 46F. In FIGS. 46A to 46F, reference character "K" indicates the area taken along the line XII-XII' in FIG. 35, and reference character "L" indicates the area taken along the line XIII-XIII' in FIG. 35.

Figure 46A:
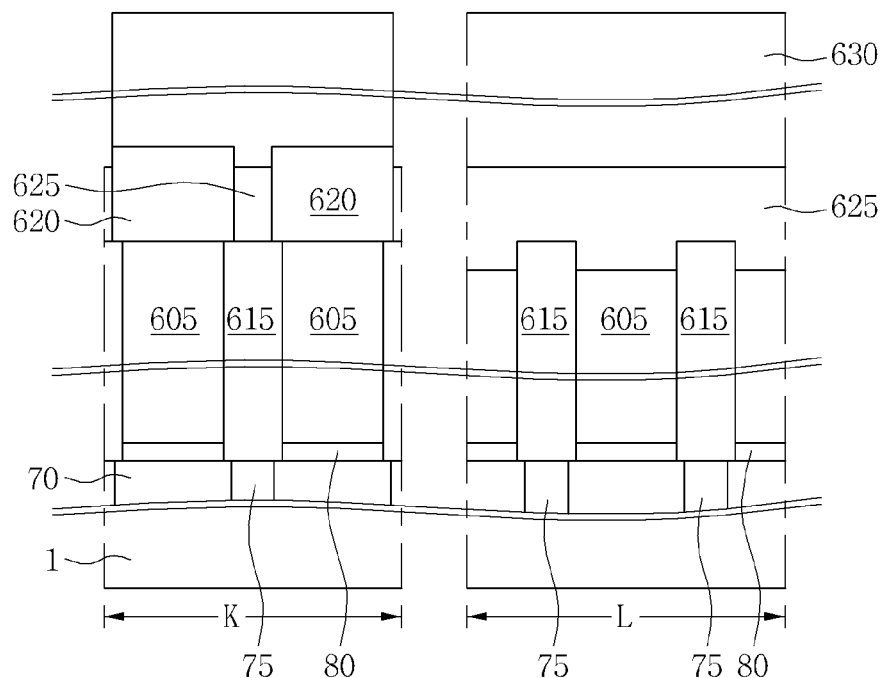
FIGS. 46A to 46F are cross-sectional views illustrating a method of fabricating a semiconductor device in accordance with an embodiment of the inventive concept.

Referring to FIG. 46A, a lower molding layer 605 and lower storage electrodes 615 passing through the lower molding layer 605 may be formed on a substrate 1. A sacrificial pattern 620 having openings may be formed on the substrate having the lower storage electrodes 615. An insulating material layer may be formed on the substrate having the sacrificial pattern 620. A lower support pattern 625 is confined in the openings of the sacrificial pattern 620 by planarizing the insulating material layer. The planarization may be performed using a CMP process and/or an etchback process. The lower support pattern 625 may include contact parts directly connected to top surfaces of the lower storage electrodes 615, and a connection part connecting the contact parts. An upper molding layer 630 may be formed on the substrate having the lower support pattern 625.

Figure 46B:
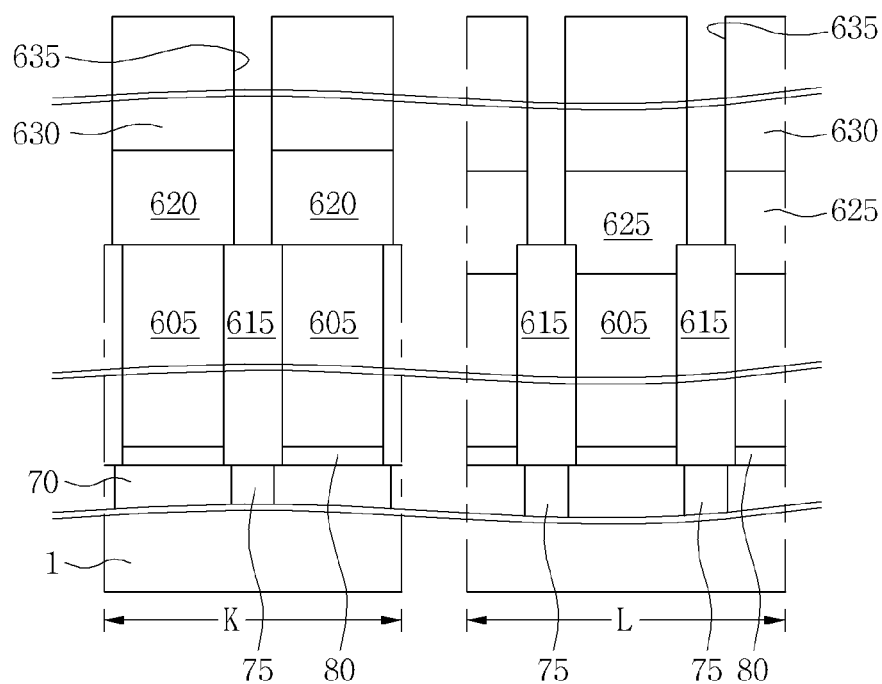

Referring to FIG. 46B, upper storage holes 635 which pass through the upper molding layer 630, the sacrificial pattern 620, and the lower support pattern 625 and expose the lower storage electrodes 615 may be formed.

Figure 46C:
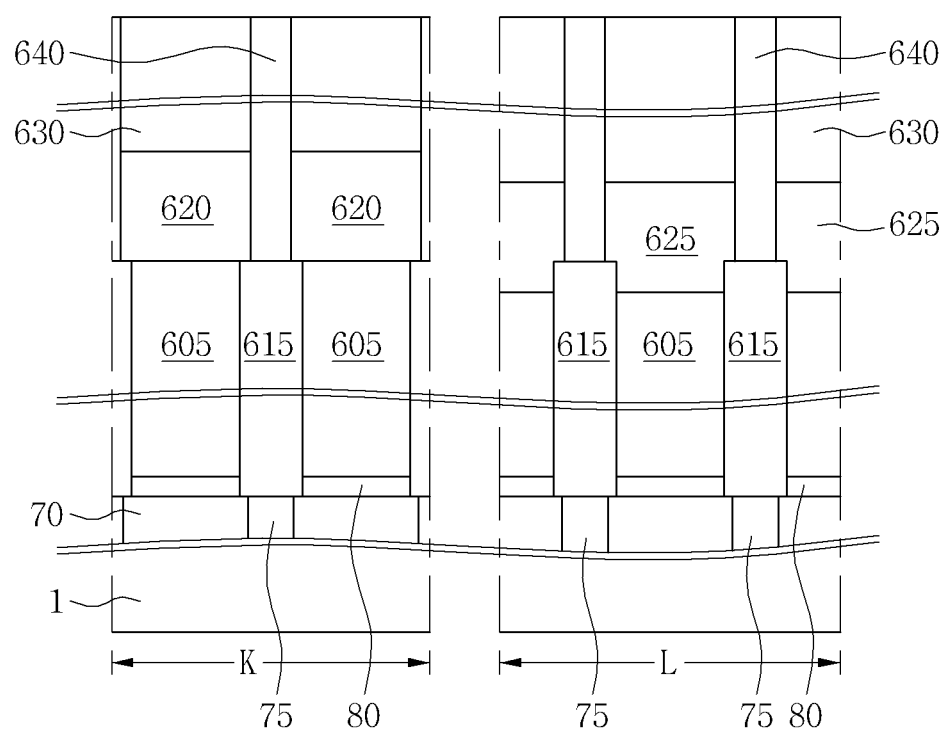

Referring to FIG. 46C, upper storage electrodes 640 may be formed in the upper storage holes 635. The upper storage electrodes 640 may pass through the upper molding layer 630, the sacrificial layer 620, and the lower support pattern 625, and be electrically connected to the lower storage electrodes 615.

Figure 46D:
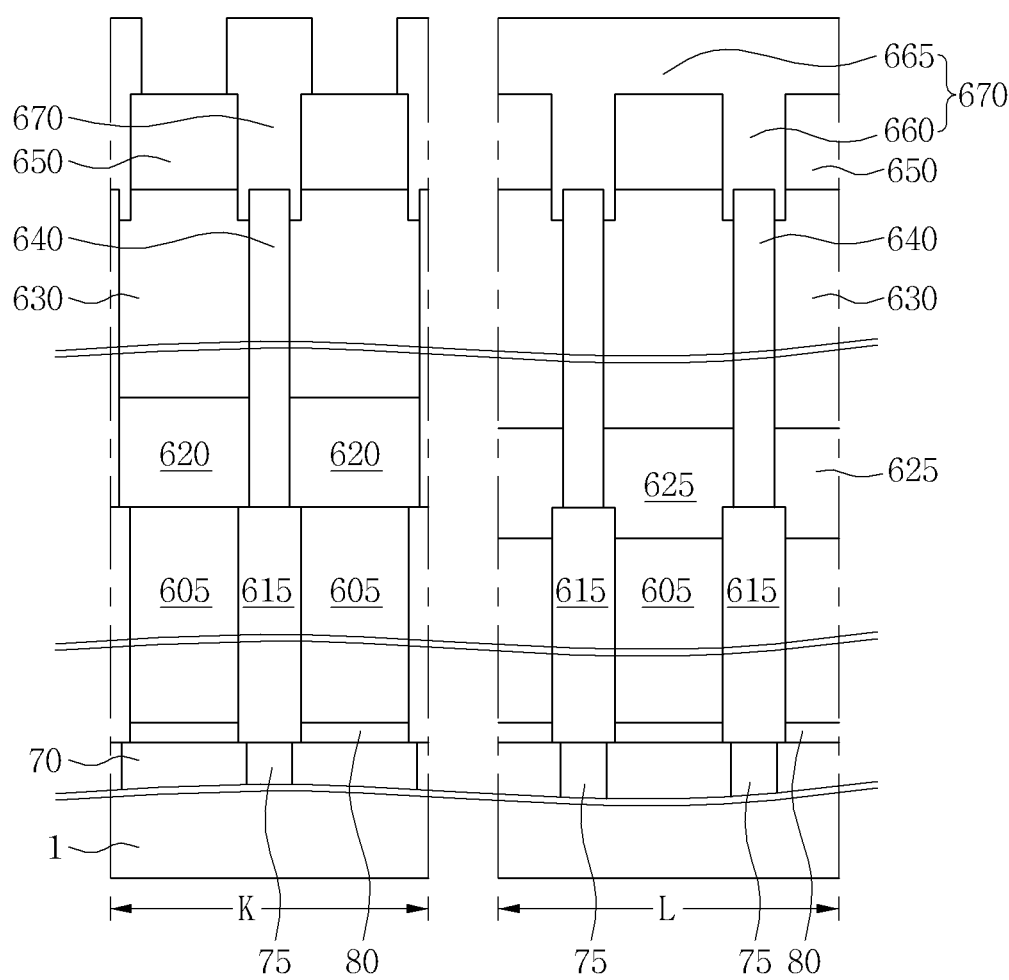

Referring to FIG. 46D, a continuous support pattern 670 may be formed on the substrate having the upper storage electrodes 640. The continuous support pattern 670 may include contact parts 660 connected to top surfaces of the upper storage electrodes 640 and a connection part 665 continuously connected to the contact parts 660.

The formation of the continuous support pattern 670 may include forming an upper sacrificial pattern 650 having holes which expose the top surfaces of the upper storage electrodes 640 on the substrate having the upper storage electrodes 640, forming an insulating material layer filling the holes on the upper sacrificial patterns 650, and patterning the insulating material layer.

Figure 46E:
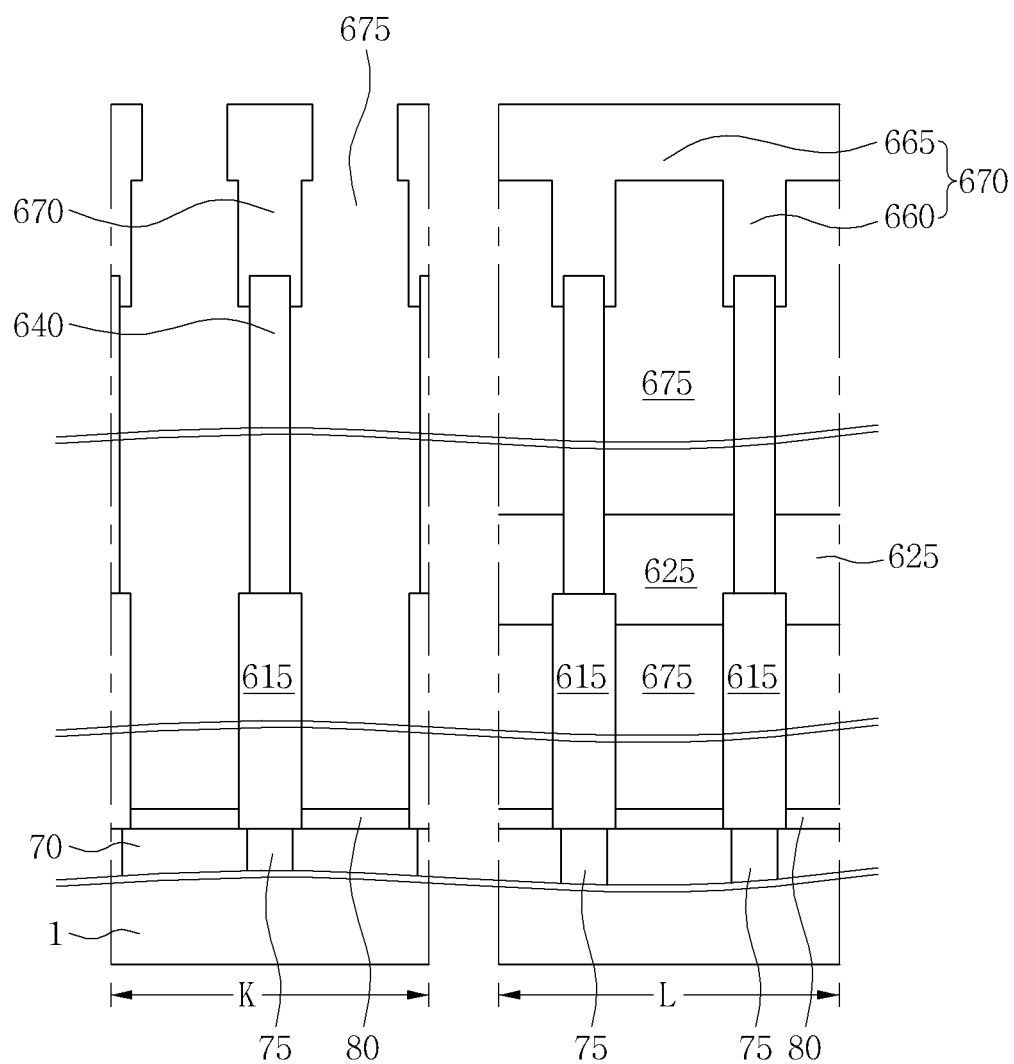

Referring to FIG. 46E, the upper sacrificial patterns 650, the upper molding layer 630, the sacrificial patterns 620, and the lower molding layer 605 may be removed to form an empty space 675 by etching process. The continuous support pattern 670 and the lower support pattern 625 may prevent the upper and lower storage electrodes 640 and 615 from collapsing due to the empty space 675.

Figure 46F:
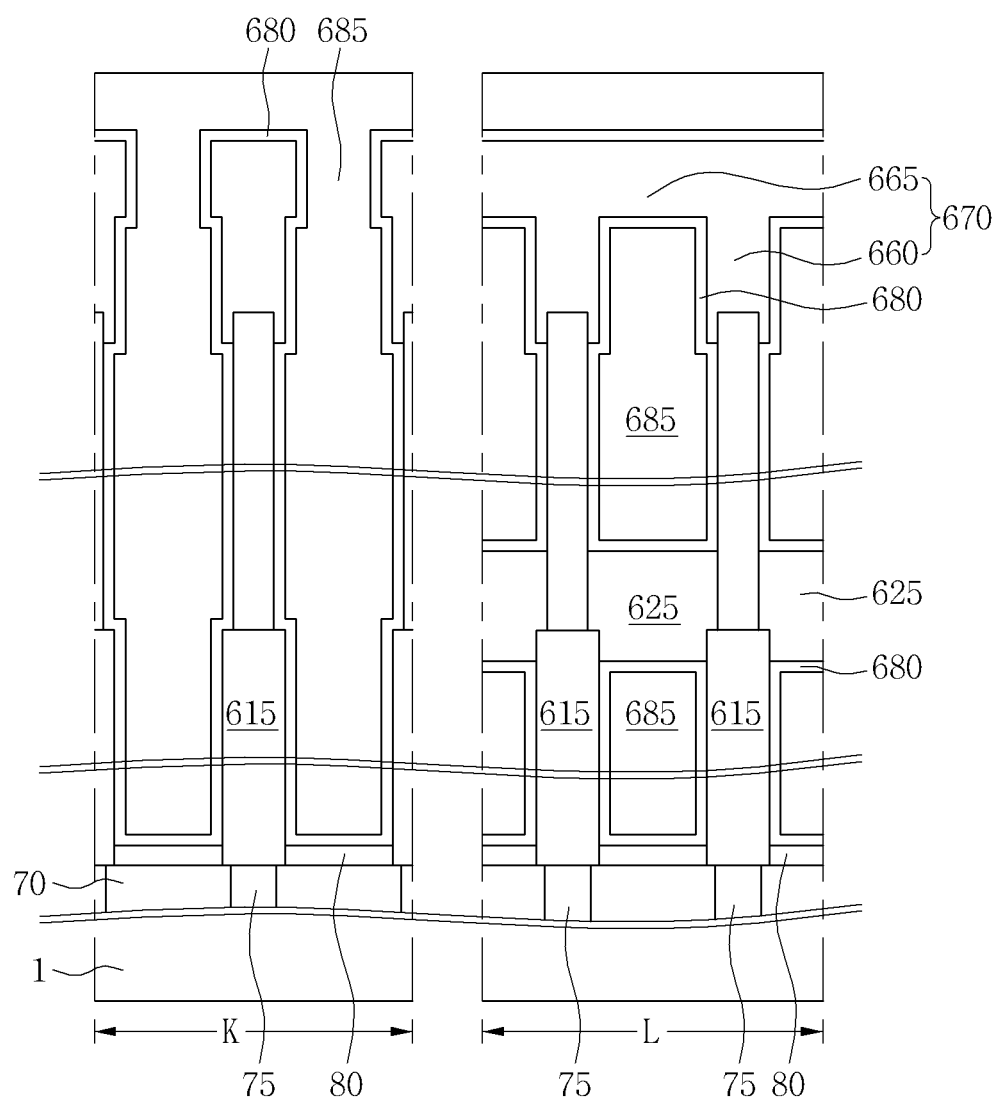

Referring to FIG. 46F, a storage dielectric layer 680 may be conformally formed on the substrate having the empty space 675. A plate electrode 685 may be formed on the storage dielectric layer 680.

Figure 47A:
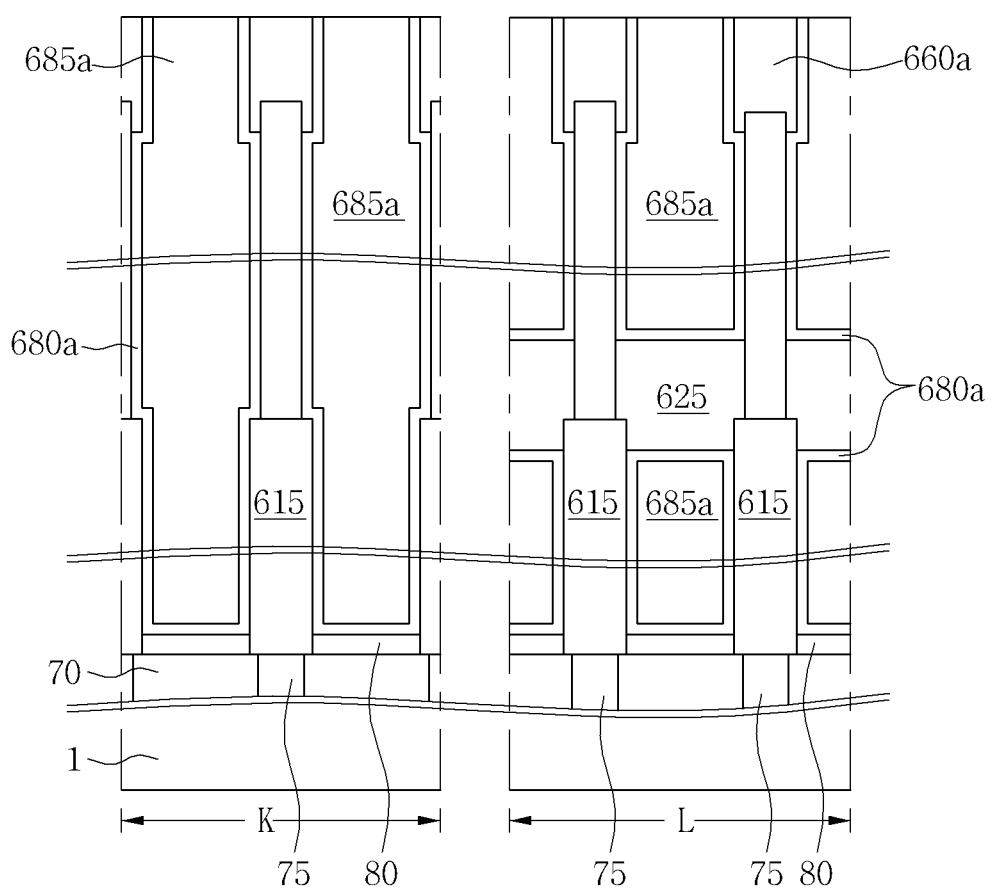
FIGS. 47A and 47B are cross-sectional views illustrating a method of fabricating a semiconductor device in accordance with an embodiment of the inventive concept.
Figure 47B:
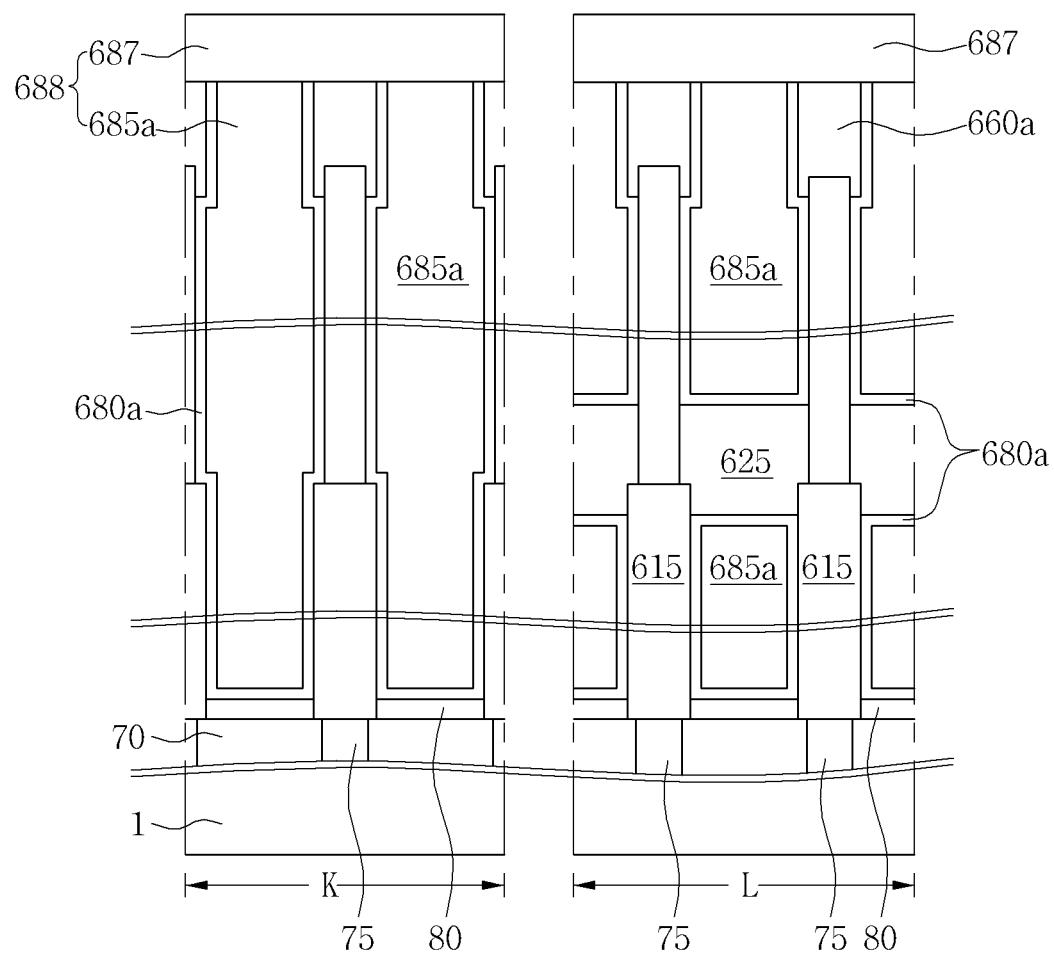

Next, a method of fabricating a semiconductor device in accordance with an embodiment of the inventive concept is described with reference to FIGS. 47A and 47B. In FIGS. 47A and 47B, reference character "K" indicates the area taken along the line XII-XII' in FIG. 35, reference character "L" indicates the area taken along the line XIII-XIII' in FIG. 35.

Referring to FIG. 47A, a substrate described with reference to FIGS. 46A to 46F may be prepared. For example, according to an embodiment, the substrate processed until the plate electrode 685 described in connection with FIG. 46F is formed may be prepared using the method described in connection with FIGS. 46A to 46F. Accordingly, the substrate may include the continuous support pattern 670. The continuous support pattern 670 may include the contact parts 660 connected to the top surfaces of the upper storage electrodes 640 and the connection part 665 connecting the contact parts 660.

The substrate having the plate electrode 685 may be planarized to expose the contact parts 660 and the plate electrode 685 which is disposed under the connection part 665. Therefore, the connection part 665 may be removed during the planarization process.

The planarization process may be performed using a CMP process and/or an etchback process. The planarized plate electrode 685 may be defined as a lower plate electrode 685a. The remaining contact parts 660 after the planarization process is performed may be defined as insulating patterns 660a.

Referring to FIG. 47B, an upper plate electrode 687 which has lower resistivity than the lower plate electrode 685a may be formed on the substrate having the lower plate electrode 685a. The upper plate electrode 687 may be electrically connected to the lower plate electrode 685a and in contact with the insulating patterns 660a. The lower and upper plate electrodes 685a and 687 may configure a plate electrode 688.

Referring again to FIG. 40, an upper interlayer insulating layer 690, a plug 693 passing through the upper interlayer insulating layer 690, and a metal line 696 on the plug 693 may be formed on the substrate having the plate electrode 688.

A method of fabricating a semiconductor device in accordance with an embodiment of the inventive concept is described with reference to FIGS. 48A to 48E. FIGS. 48A to 48E are cross-sectional views illustrating a method of fabricating a semiconductor device in accordance with an embodiment of the inventive concept. In FIGS. 48A to 48E, reference character "K" indicates the area taken along the line XII-XII' in FIG. 35, and reference character "L" indicates the area taken along the line XIII-XIII' in FIG. 35.

Figure 48A:
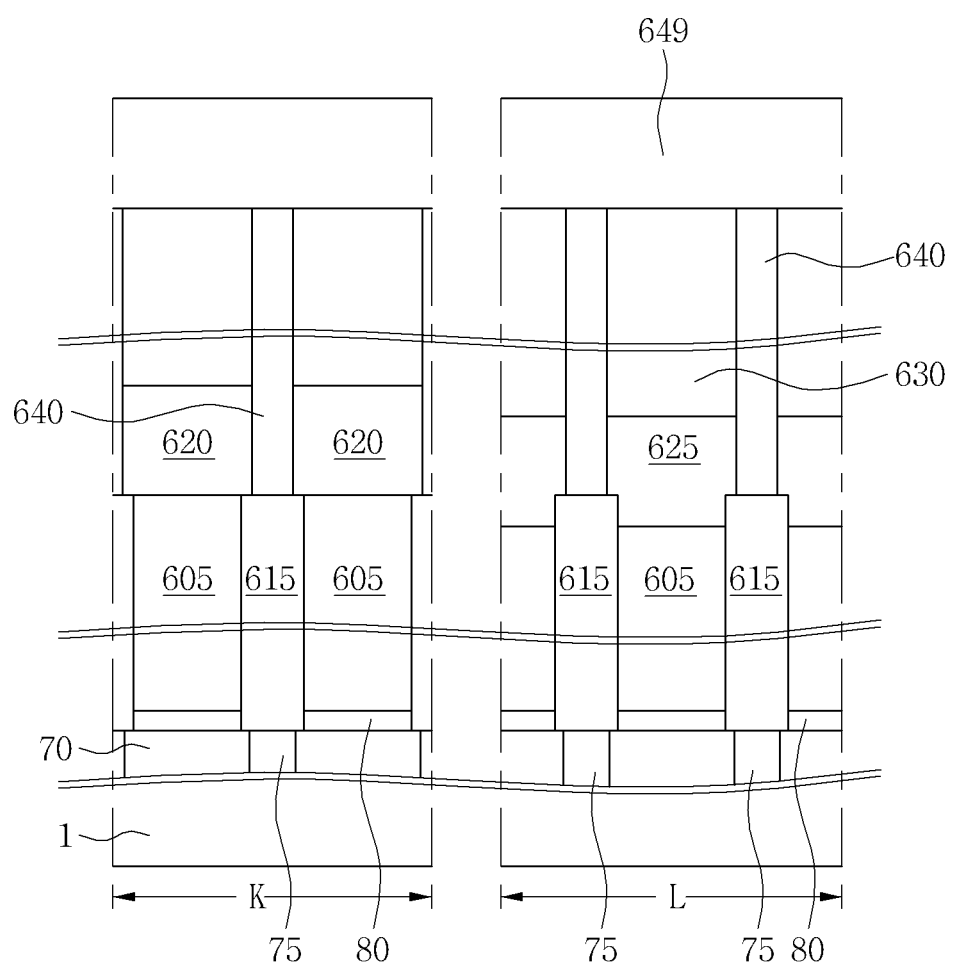
FIGS. 48A to 48E are cross-sectional views illustrating a method of fabricating a semiconductor device in accordance with an embodiment of the inventive concept.

Referring to FIG. 48A, a lower molding layer 605 and lower storage electrodes 615 passing through the lower molding layer 605 may be formed on a substrate 1. A lower sacrificial pattern 620 having openings may be formed on the substrate having the lower storage electrodes 615. A lower support pattern 625 may be formed in the openings of the lower sacrificial pattern 620. An upper molding layer 630 may be formed on the substrate having, the lower support pattern 625. Upper storage electrodes 640 passing through the upper molding layer 630 may be formed. A sacrificial material layer 649 may be formed on the substrate having the upper storage electrodes 640.

Figure 48B:
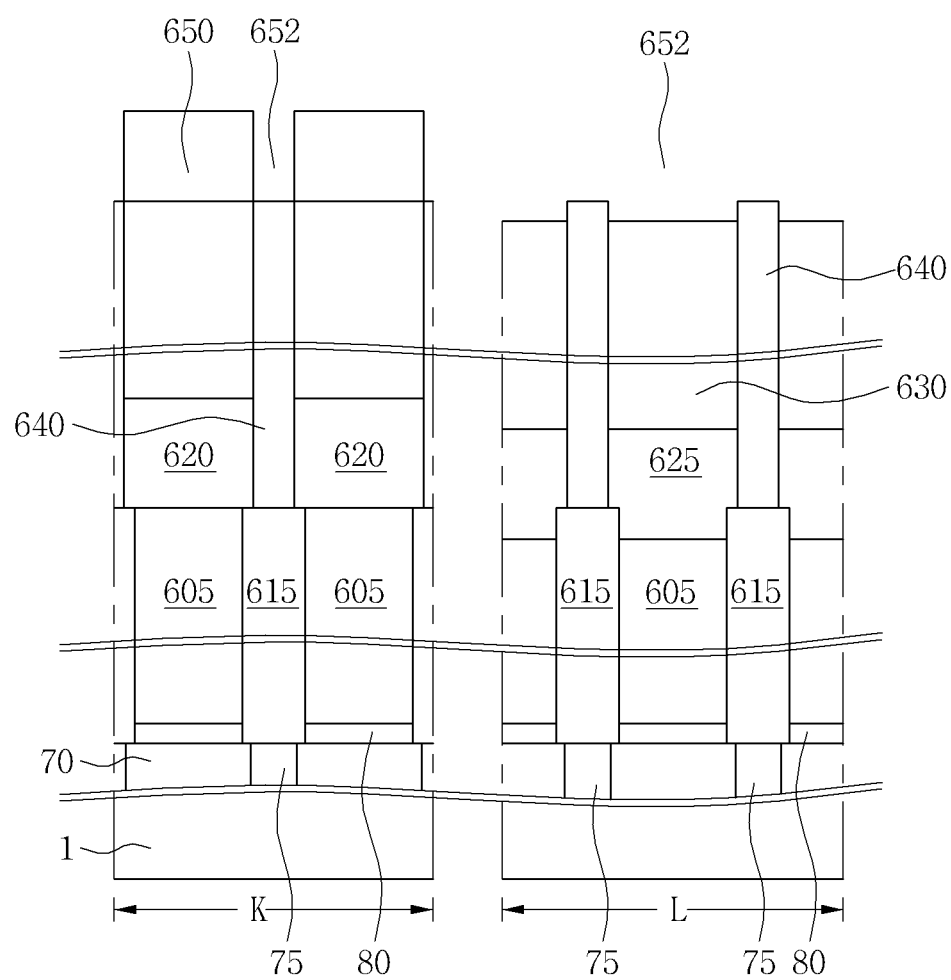

Referring to FIG. 48B, an upper sacrificial pattern 650 having openings 652 which expose top surfaces of the upper storage electrodes 640 may be formed by patterning the sacrificial material layer 649. While forming the openings 652, some portions of the upper molding layer 630 may be etched to expose upper sides of the upper storage electrodes 640.

The upper sacrificial pattern 650 may be formed using a photomask having the same or substantially the same pattern as a pattern of the lower sacrificial pattern 620. For example, according to an embodiment, the formation of the lower sacrificial pattern 620 may include forming a lower sacrificial material layer and patterning the lower sacrificial material layer by a photo and etch process using a first photomask, and the formation of the upper sacrificial pattern 650 may include forming an upper sacrificial material layer and patterning the upper sacrificial material layer by a photo and etch process using a second photomask having the same or substantially the same mask pattern as a mask pattern of the first photomask. Accordingly, since the lower and upper sacrificial patterns 620 and 650 are formed to have the same or substantially the same patterns, the lower support pattern 625 and a connection part 667 of a continuous support pattern 671 to be formed in a subsequent process, which are respectively formed in the openings the lower and upper sacrificial patterns 620 and 650, may be vertically aligned with each other within a tolerable range of misalignment.

Figure 48C:
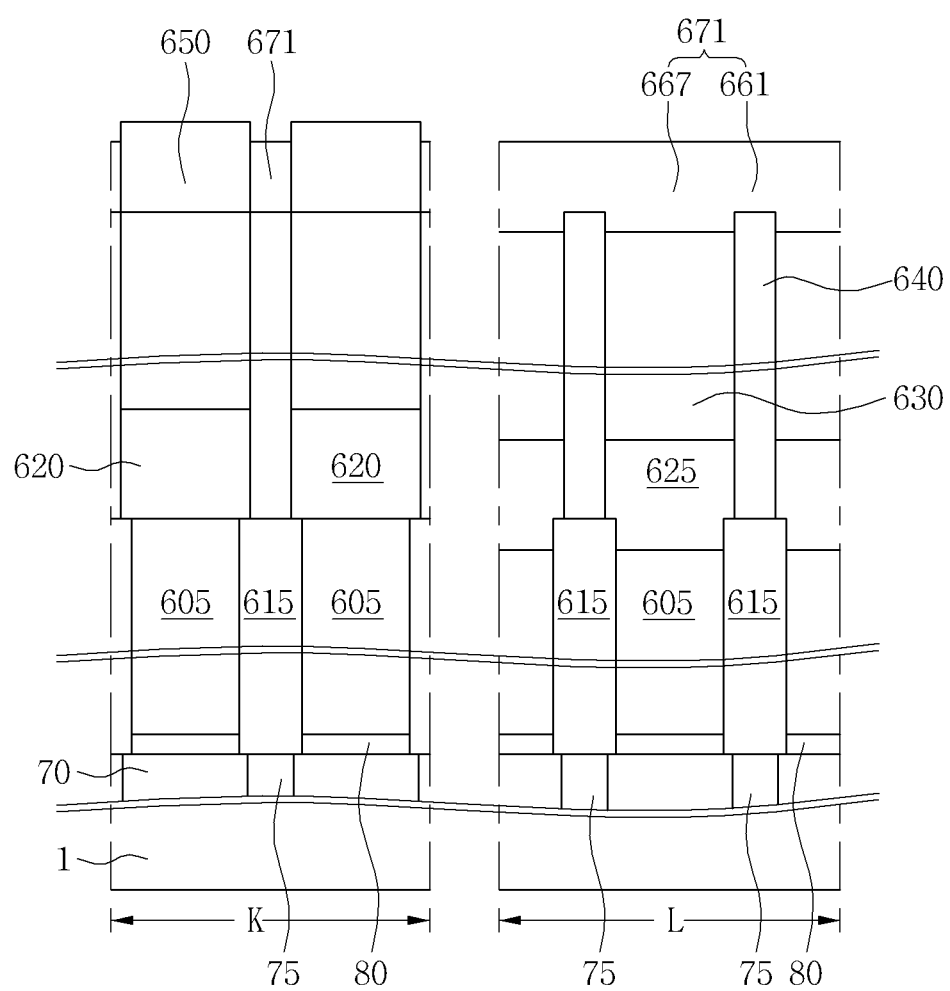

Referring to FIG. 48C, the continuous upper support pattern 671 filling the openings 652 may be formed. The upper support pattern 671 may be formed of silicon nitride.

Figure 48D:
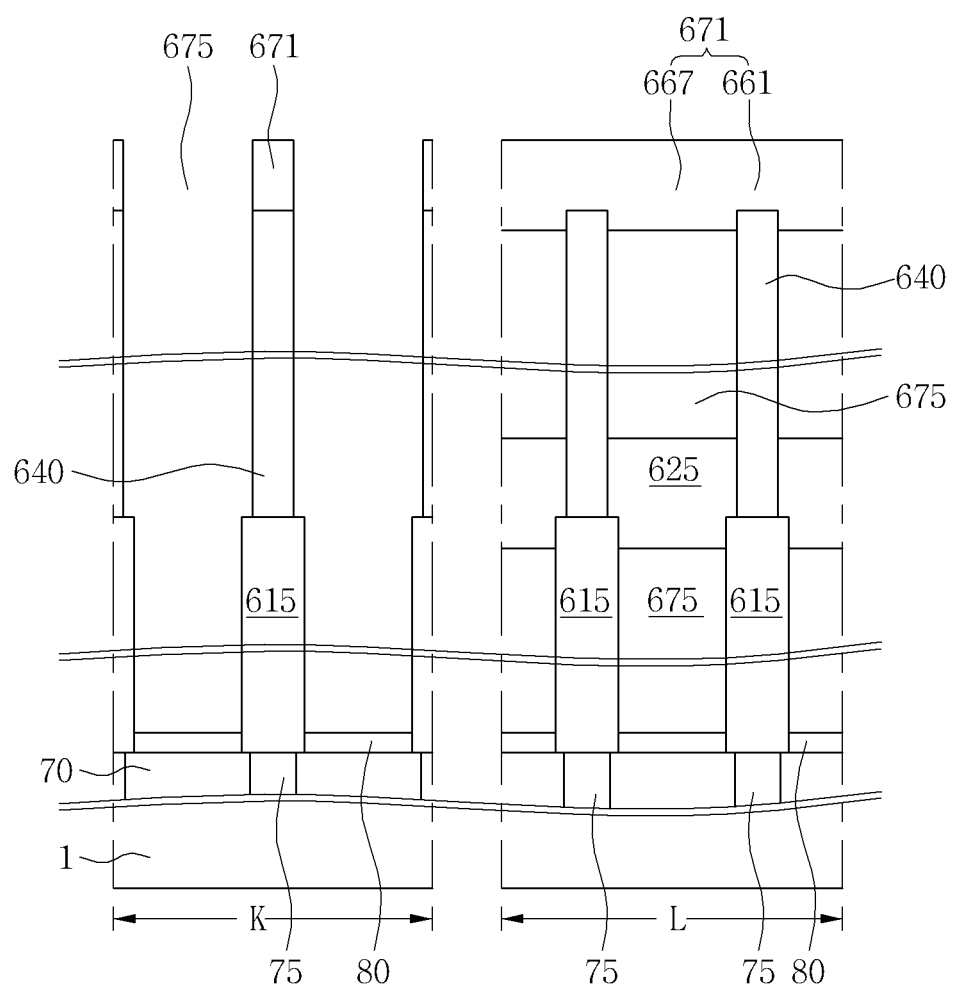

Referring to FIG. 48D, the upper sacrificial patterns 650, the upper molding layer 630, the lower sacrificial patterns 620, and the lower molding layer 605 may be removed to form an empty space 675 by an etching process.

Figure 48E:
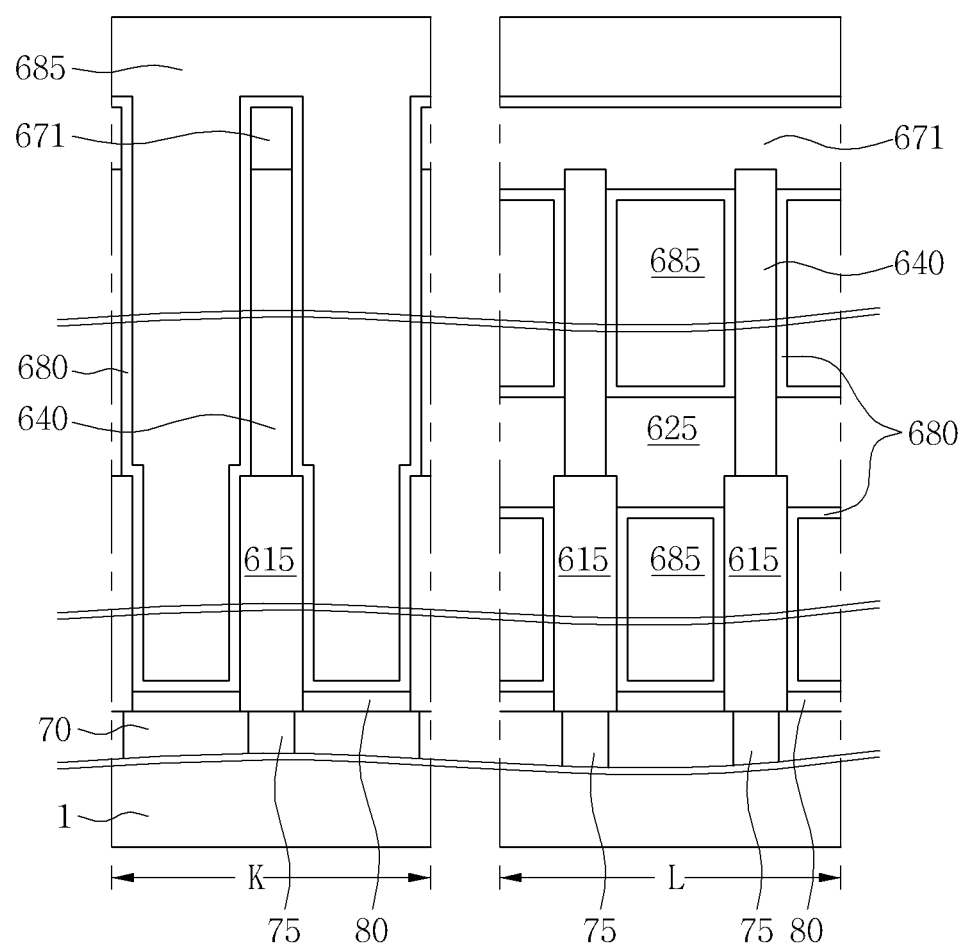

Referring to FIG. 48E, a storage dielectric layer 680 may be conformally formed on the substrate having the empty space 675. A plate electrode 685 may be formed on the storage dielectric layer 680.

The embodiments of the inventive concept may provide a semiconductor device having a reliable and stable capacitor structure and a method of forming the same. For example, a continuous support pattern including contact parts directly connected to top surfaces of storage electrodes which configure a capacitor and a continuous connection part continuously connected to the contact parts may be provided. The continuous support pattern may prevent the storage electrodes from collapsing or deforming. Accordingly, a capacitor of which the collapse and deformation can be minimized may be formed.

While forming the continuous support pattern, a plate electrode including portions which have different resistivity from each other may be formed. A plate electrode is formed of a conductive material after the continuous support pattern which prevents the collapse and deformation of the storage electrodes is formed, thus resulting in formation of a capacitor that is stable and has enhanced performance.

Figure 49:
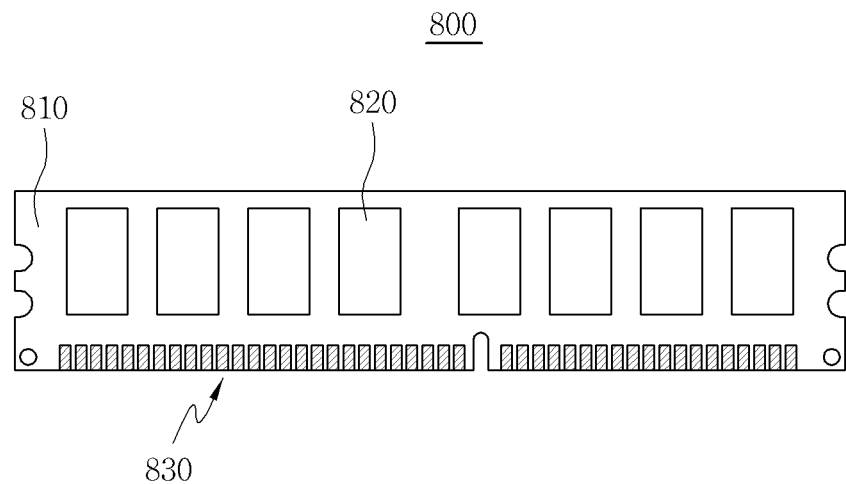
FIG. 49 is a schematic view illustrating a semiconductor module including a semiconductor device in accordance with an embodiment of the inventive concept.

FIG. 49 is a schematic diagram illustrating a memory module 800 including one of the semiconductor devices in accordance with the embodiments of the inventive concept.

Referring to FIG. 49, the memory module 800 may include a memory module substrate 810 and a plurality of memory devices 820 and terminals 830 which are disposed on the memory module substrate 810. The memory module substrate 810 may include a printed circuit board (PCB) or a wafer.

The memory devices 820 may be one of the semiconductor devices in accordance with the embodiments of the inventive concept or a semiconductor package having the semiconductor devices described with reference to FIGS. 1 to 48E.

The terminals 830 may include a conductive metal. The terminals 830 may be electrically connected to the memory devices 820. Since the memory module 800 may include a semiconductor device which has improved leakage current characteristics, performance of the memory module 800 may be improved.

Figure 50:
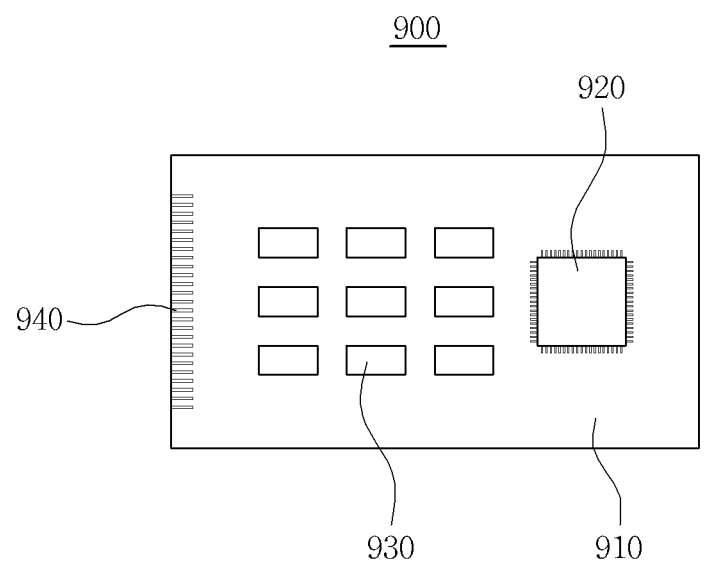
FIG. 50 is a schematic view illustrating a semiconductor module including a semiconductor device in accordance with an embodiment of the inventive concept.

FIG. 50 is a schematic diagram illustrating a semiconductor module 900 including a semiconductor device in accordance with an embodiment of the inventive concept.

Referring to FIG. 50, the semiconductor module 900 may include a semiconductor device 930 formed on a module substrate 910. The semiconductor device 930 may be one of the semiconductor devices in accordance with the embodiments of the inventive concept described with reference to FIGS. 1 to 48E, or a semiconductor package having the semiconductor devices.

The semiconductor module 900 may further include a microprocessor 920 mounted on the module substrate 910. Input/output terminals 940 may be disposed at least one side of the module substrate 910

Figure 51:
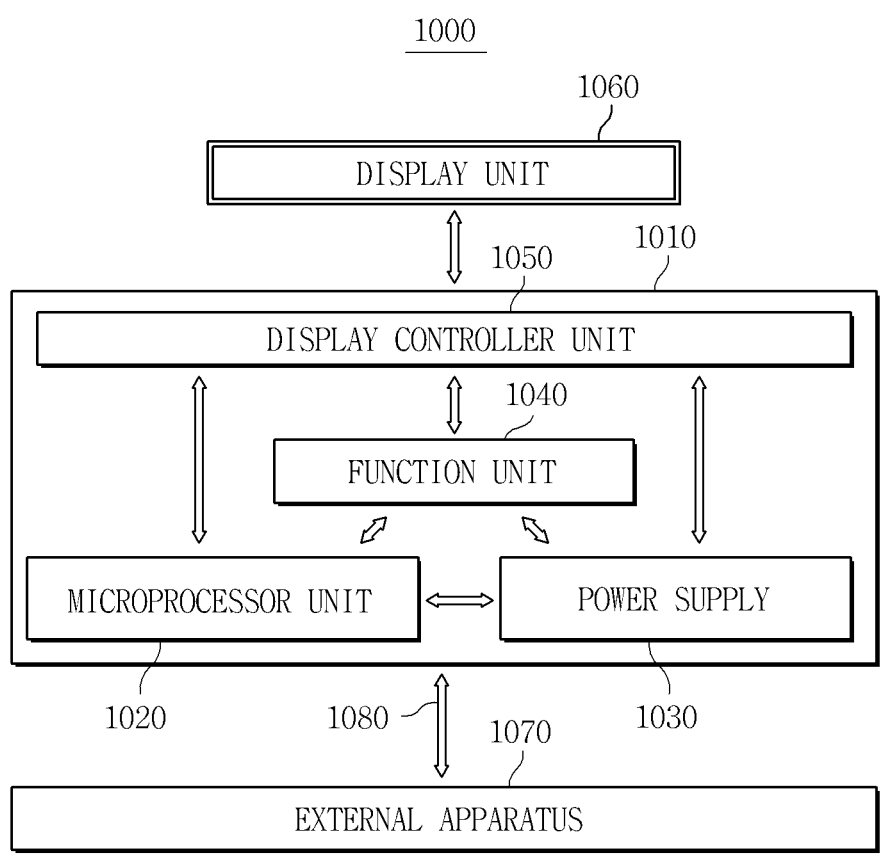
FIG. 51 is a block diagram schematically illustrating an electronic system including a semiconductor device in accordance with an embodiment of the inventive concept.

FIG. 51 is a schematic block diagram illustrating an electronic system 1000 including one of the semiconductor devices in accordance with the embodiments of the inventive concept.

Referring to FIG. 51, the electronic system 1000 may include a body 1010. The body 1010 may include a microprocessor unit 1020, a power supply unit 1030, a function unit 1040, and/or a display controller unit 1050. The body 1010 may be a system board or a mother board which have PCBs, etc.

The microprocessor unit 1020, the power supply unit 1030, the function unit 1040, and the display controller unit 1050 may be installed or mounted on the body 1010.

A display unit 1060 may be disposed on a top surface or outside of the body 1010. For example, the display unit 1060 may be disposed on the surface of the body 1010 to display images processed by the display controller unit 1050.

The power supply unit 1030 may receive a constant voltage from an external power source, etc., divide the voltage into various levels of voltages, and supply those voltages to the microprocessor unit 1020, the function unit 1040, and the display controller unit 1050, etc.

The microprocessor unit 1020 may receive the voltage from the power supply unit 1030 to control the function unit 1040 and the display unit 1060.

The function unit 1040 may perform functions of various electronic systems 1000. For example, if the electronic system 1000 is a mobile electronic product such as cellular phone, the function unit 1040 may include several components which can perform functions of wireless communication such as imaging output to the display unit 1060 and sound output to a speaker by dialing or communicating with an external apparatus 1070, and if a camera is installed, the function unit 1040 may function as an image processor. In an exemplary embodiment, when the electronic system 1000 is connected to a memory card, etc. in order to expand capacity, the function unit 1040 may be a memory card controller. The function unit 1040 may exchange signals with the external apparatus 1070 through a wired or wireless communication unit 1080.

Further, when the electronic system 1000 needs a universal serial bus (USB) in order to expand functionality, the function unit 1040 may perform as an interface controller.

Any one of the semiconductor devices in accordance with the embodiments of the inventive concept may be included in at least one of the microprocessor unit 1020 and the function unit 1040.

Figure 52:
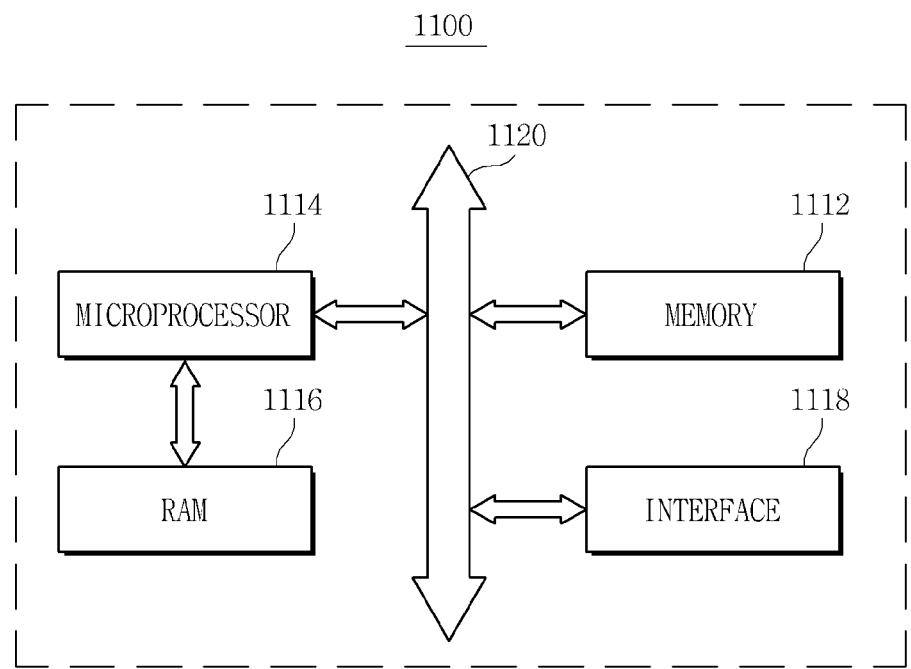
FIG. 52 is a block diagram schematically illustrating an electronic system including a semiconductor device in accordance with an embodiment of the inventive concept.

FIG. 52 is a schematic block diagram illustrating an electronic system 1100 including one of the semiconductor devices in accordance with the embodiments of the inventive concept.

Referring to FIG. 52, the electronic system 1100 may include the semiconductor device in accordance with the embodiment of the inventive concept. The electronic system 1100 may be used to fabricate a mobile apparatus or a computer. For example, the electronic system 1100 may include a memory system 1112, a microprocessor 1114, a random access memory (RAM) 1116, and an interface 1118 performing data communication using a bus 1120.

The microprocessor 1114 may program and control the electronic system 1100. The RAM 1116 may be used as an operation memory of the microprocessor 1114. The microprocessor 1114, the RAM 1116, and/or other components can be assembled in a single package. The microprocessor 1114 and/or the RAM 1116 may include the semiconductor device in accordance with the embodiments of the inventive concept.

The interface 1118 may be used to input data to or output data from the electronic system 1100. The memory system 1112 may store codes for operating the microprocessor 1114, data processed by the microprocessor 1114, or external input data. The memory system 1112 may include a controller and a memory.

Figure 53:
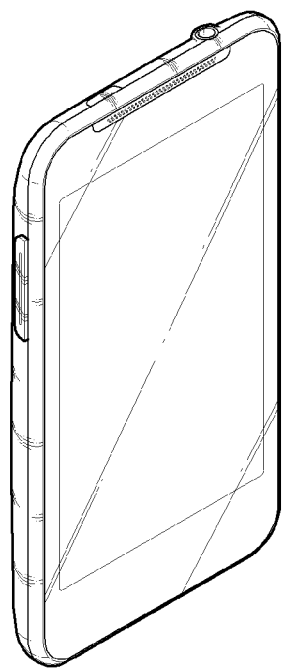
FIG. 53 is a schematic view illustrating a mobile wireless phone including a semiconductor device in accordance with an embodiment of the inventive concept.

FIG. 53 is a schematic diagram illustrating a mobile wireless phone 1200 including a semiconductor device in accordance with an embodiment of the inventive concept. The mobile wireless phone may be understood as a tablet PC. A semiconductor device in accordance with an embodiment of the inventive concept may be used in a portable computer, such as a notebook, a moving picture experts group (MPEG)-1, an audio layer 3 (MP3) player, an MP4 player, a navigation apparatus, a solid state disk (SSD), a table computer, an automobile, or a home appliance.

The foregoing is illustrative of embodiments and is not to be construed as limiting thereof. Although a few embodiments have been described, those skilled in the art will readily appreciate that many modifications are possible in embodiments. Accordingly, all such modifications are intended to be included within the scope of this inventive concept as defined in the claims.

What is claimed is:
1. A semiconductor device comprising:
first and second storage electrodes formed to be spaced apart from each other on a substrate;
an insulating continuous support pattern directly connected to top surfaces of the first and second storage electrodes;
a storage dielectric layer formed on the first and second storage electrodes and the continuous support pattern; and
a plate electrode formed on the storage dielectric layer, wherein the continuous support pattern includes a first contact part connected to the top surface of the first storage electrode, a second contact part connected to the top surface of the second storage electrode, and a connection part connecting the first and second contact parts with each other.

2. The semiconductor device according to claim 1, wherein at least one of the first contact part or the second contact part of the continuous support pattern has a vertical thickness greater than a horizontal width.

3. The semiconductor device according to claim 1, wherein the first contact part of the continuous support pattern includes an extension part which covers the top surface of the first storage electrode and extends to a side of the first storage electrode.

4. The semiconductor device according to claim 3, wherein the extension part of the continuous support pattern surrounds a side of an upper portion of the first storage electrode.

5. The semiconductor device according to claim 1, wherein the first contact part of the continuous support pattern has a greater horizontal width than a horizontal width of the first storage electrode.

6. The semiconductor device according to claim 1, wherein a side of the first contact part of the continuous support pattern is vertically aligned with a side of the first storage electrode.

7. The semiconductor device according to claim 1, wherein the connection part of the continuous support pattern is located at a higher level than the first and second storage electrodes.

8. The semiconductor device according to claim 1, wherein the connection part of the continuous support pattern has a bottom surface located at a lower level than the top surfaces of the first and second storage electrodes.

9. The semiconductor device according to claim 1, wherein the first contact part of the continuous support pattern has a smaller width than a width of the first storage electrode.

10. The semiconductor device according to claim 1, further comprising:
an insulating lower support pattern located below the continuous support pattern, spaced apart from the continuous support pattern, and interposed between a side of the first storage electrode and a side of the second storage electrode.

11. A semiconductor device, comprising:
first and second storage electrodes formed to be spaced apart from each other on a substrate;
an insulating continuous support pattern connected to top surfaces of the first and second storage electrodes;
a storage dielectric layer formed on the first and second storage electrodes and the continuous support pattern;
a plate electrode formed on the storage dielectric layer,
wherein the continuous support pattern includes a first contact part connected to the top surface of the first storage electrode, a second contact part connected to the top surface of the second storage electrode, and a connection part connecting the first and second contact parts with each other; and
a core pattern formed in the first storage electrode,
wherein the core pattern is formed of a different material from the first storage electrode, and wherein a top surface of the core pattern directly contacts the first contact part of the continuous support pattern.

12. A semiconductor device comprising: first and second storage electrodes formed to be spaced apart from each other on a substrate; an insulating continuous support pattern connected to top surfaces of the first and second storage electrodes; a storage dielectric layer formed on the first and second storage electrodes and the continuous support pattern; and a plate electrode formed on the storage dielectric layer, wherein the continuous support pattern includes a first contact part connected to the top surface of the first storage electrode, a second contact part connected to the top surface of the second storage electrode, and a connection part connecting the first and second contact parts with each other, and wherein a portion of the storage dielectric layer is interposed between the plate electrode and the top surfaces of the first and second storage electrodes without directly contacting the top surfaces of the first and second storage electrodes.

* * * * *